US009903555B2

(12) United States Patent
Ohno

(10) Patent No.: US 9,903,555 B2
(45) Date of Patent: Feb. 27, 2018

(54) VEHICLE LIGHTING FIXTURE

(71) Applicant: Stanley Electric Co., Ltd., Tokyo (JP)

(72) Inventor: Masafumi Ohno, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 244 days.

(21) Appl. No.: 14/797,715

(22) Filed: Jul. 13, 2015

(65) Prior Publication Data
US 2016/0018075 A1 Jan. 21, 2016

(30) Foreign Application Priority Data

Jul. 18, 2014 (JP) ................. 2014-147501

(51) Int. Cl.
*F21S 8/10* (2006.01)
*B60Q 1/08* (2006.01)
(Continued)

(52) U.S. Cl.
CPC ........ *F21S 48/1721* (2013.01); *B60Q 1/085* (2013.01); *B60Q 1/143* (2013.01); *B60Q 1/1423* (2013.01); *F21S 48/1145* (2013.01); *F21S 48/1225* (2013.01); *F21S 48/1241* (2013.01); *F21S 48/1258* (2013.01); *F21S 48/1705* (2013.01); *G02B 6/3524* (2013.01); *G02B 6/3534* (2013.01); *G02B 6/3542* (2013.01); *G02B 6/3598* (2013.01); *G02B 6/4249* (2013.01); *H01S 5/005* (2013.01); *H01S 5/4012* (2013.01); *H01S 5/4075* (2013.01); *B60Q 2300/112* (2013.01); *B60Q 2300/32* (2013.01); *B60Q 2300/332* (2013.01); *B60Q 2300/334* (2013.01); *F21S 48/328* (2013.01); *H01S 5/32341* (2013.01)

(58) Field of Classification Search
CPC ............... F21S 48/1705; F21S 48/1752; F21S 48/1721; F21S 48/1258; F21S 48/1275; B60Q 1/1423; B60Q 1/143
See application file for complete search history.

(56) References Cited

U.S. PATENT DOCUMENTS 6,385,364 B1 5/2002 Abushagur
9,423,091 B2 * 8/2016 Reinprecht .......... F21S 48/1159
(Continued)

FOREIGN PATENT DOCUMENTS

EP     2 813 395 A1    12/2014
JP     2009-218114 A    9/2009
(Continued)

OTHER PUBLICATIONS

EP2 975 318 publication with European Search Report dated Dec. 3, 2015.

*Primary Examiner* — Karabi Guharay
(74) *Attorney, Agent, or Firm* — Kenealy Vaidya LLP

(57) ABSTRACT

A vehicle lighting fixture is configured to form a predetermined light distribution pattern (for example, a high-beam (driving) light distribution pattern and a low-beam (passing) light distribution pattern) by superimposing N partial light distribution patterns wherein N is a natural number of 2 or more. The vehicle lighting fixture can include a light intensity changing unit configured to change a light intensity of at least one partial light distribution pattern out of the N partial light distribution patterns.

14 Claims, 32 Drawing Sheets

(51) Int. Cl.
  *B60Q 1/14*   (2006.01)
  *G02B 6/35*   (2006.01)
  *G02B 6/42*   (2006.01)
  *H01S 5/40*   (2006.01)
  *H01S 5/00*   (2006.01)
  *H01S 5/323*  (2006.01)

(56) References Cited

U.S. PATENT DOCUMENTS

| | | |
|---|---|---|
| 2001/0033419 A1 | 10/2001 | Odhner et al. |
| 2005/0147365 A1 | 7/2005 | Benner et al. |
| 2009/0162009 A1 | 6/2009 | Ma |
| 2011/0249460 A1 | 10/2011 | Kushimoto |
| 2014/0168940 A1 | 6/2014 | Shiomi et al. |

FOREIGN PATENT DOCUMENTS

| | | |
|---|---|---|
| JP | 2013-16277 A | 1/2013 |
| JP | 2013-196965 A | 9/2013 |
| WO | 2013/099144 A1 | 7/2013 |
| WO | 2015/111649 A1 | 7/2015 |

\* cited by examiner

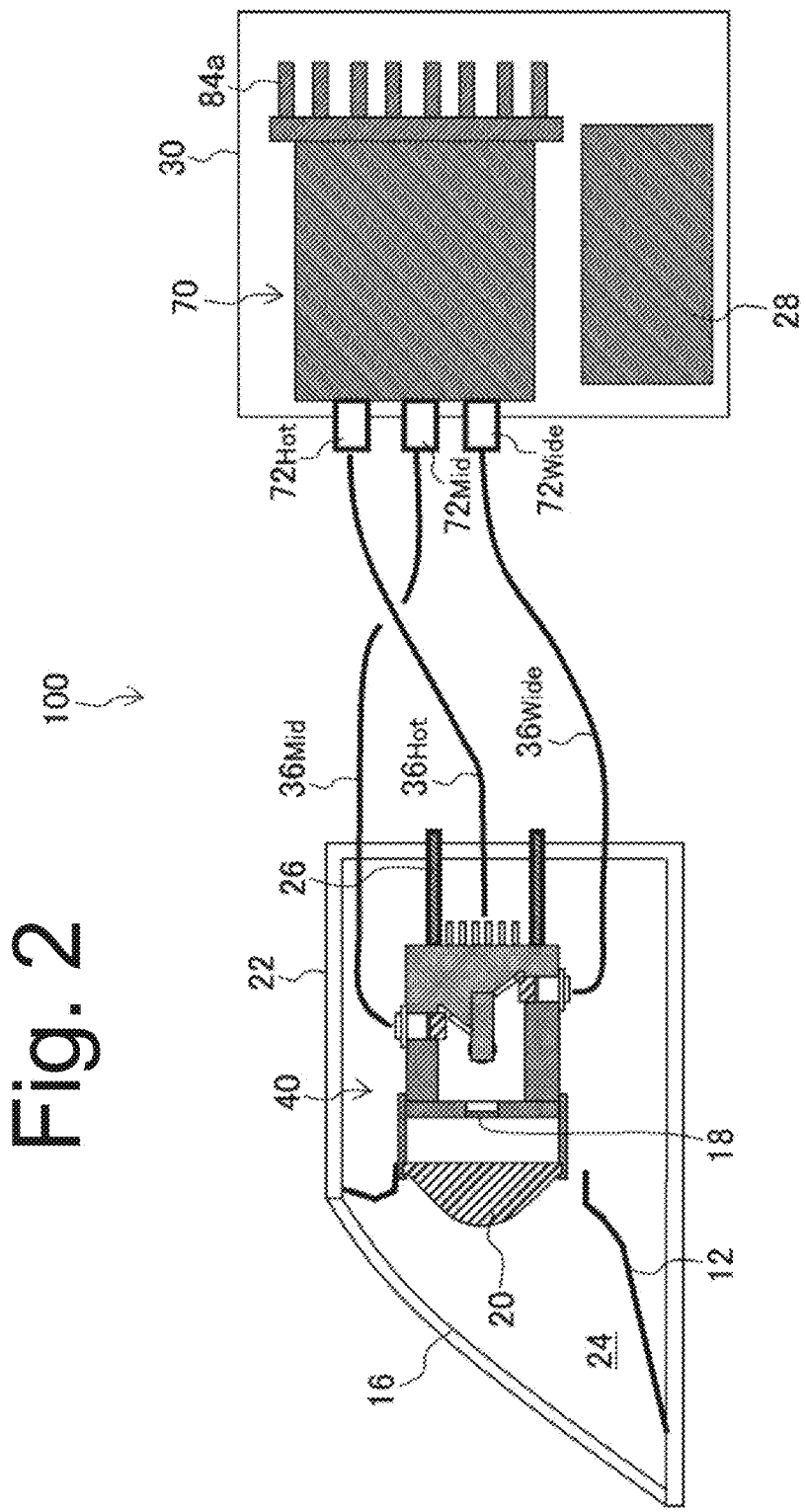

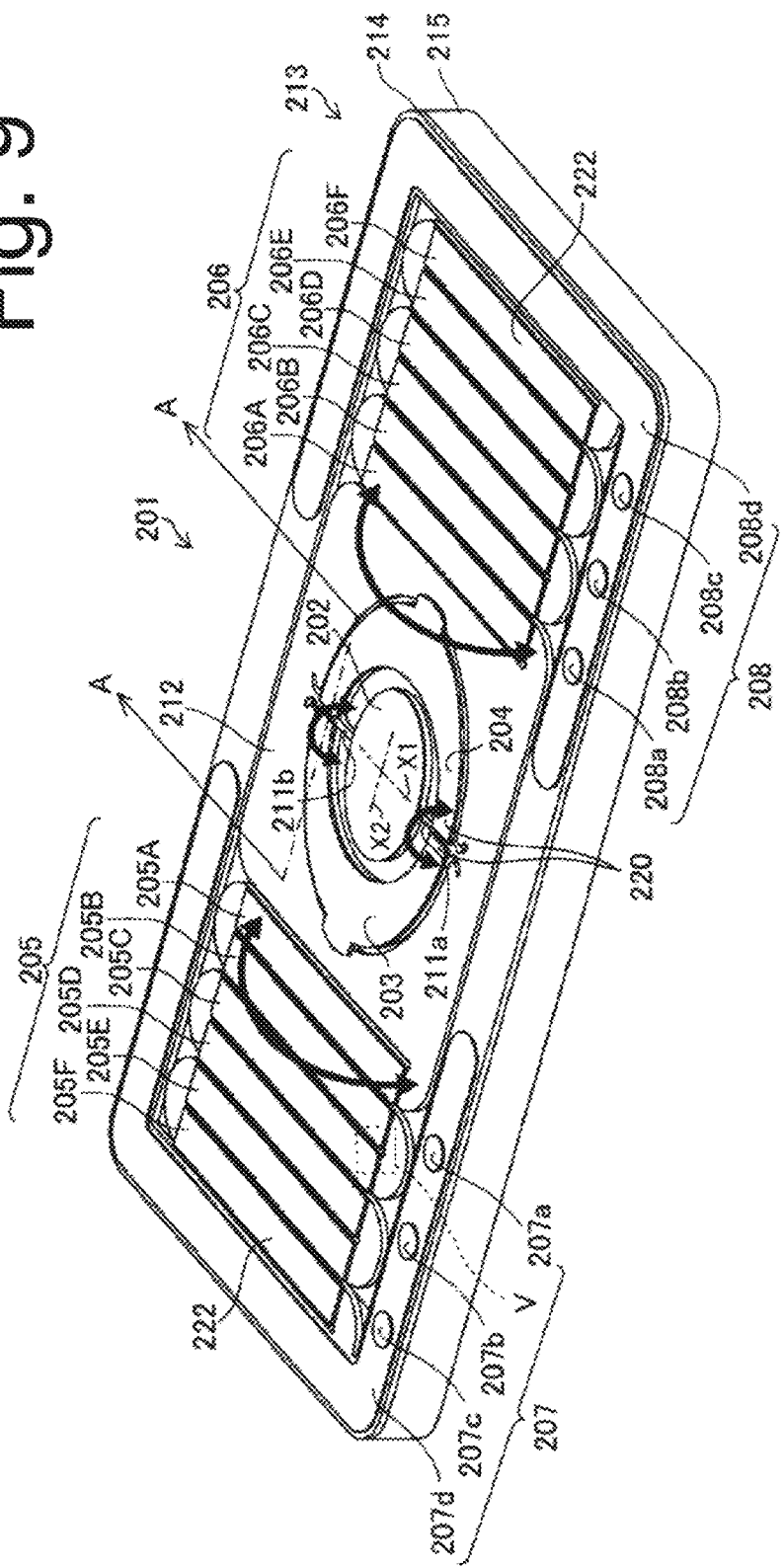

Fig. 15

| (a) | Projection Angle (αh) | Scanning Range on Wavelength Conversion Member (L) | Deflection Angle of Mirror (β h_max) | Mechanical Swing Half Angle of Mirror (γ h_max) | Load Voltage |
|---|---|---|---|---|---|
| WIDE | ± 15 deg. | ± 8.57 mm | ± 19.7 deg. | ± 9.8 deg. | 5.41 Vpp |
| MID | ± 8.5 deg. | ± 4.78 mm | ± 11.3 deg. | ± 5.3 deg. | 2.31 Vpp |
| HOT | ± 3.5 deg. | ± 1.96 mm | ± 4.7 deg. | ± 2.3 deg. | 0.93 Vpp |

| (b) | Projection Angle (αv) | Scanning Range on Wavelength Conversion Member (S) | Deflection Angle of Mirror (β v_max) | Mechanical Swing Half Angle of Mirror (γ v_max) | Control Voltage |
|---|---|---|---|---|---|
| WIDE | ± 6.5 deg. | ± 3.65 mm | ± 8.6 deg. | ± 4.3 deg. | 41.2 Vpp |
| MID | ± 3.5 deg. | ± 1.96 mm | ± 4.7 deg. | ± 2.3 deg. | 24.4 Vpp |
| HOT | ± 1.5 deg. | ± 0.84 mm | ± 2.0 deg. | ± 1.0 deg. | 13.3 Vpp |

Fig. 18

| (a) | Projection Angle (αh) | Scanning Range on Wavelength Conversion Member (L) | Deflection Angle of Mirror (β h_max) | Mechanical Swing Half Angle of Mirror (γ h_max) | Distance between Mirror and Wavelength Conversion Member |
|---|---|---|---|---|---|
| WIDE | ± 15 deg. | ± 8.57 mm | ± 19.7 deg. | ± 9.8 deg. | 24.0 mm |
| MID | ± 8.5 deg. | ± 4.78 mm | ± 19.7 deg. | ± 9.8 deg. | 13.4 mm |
| HOT | ± 3.5 deg. | ± 1.96 mm | ± 19.7 deg. | ± 9.8 deg. | 5.5 mm |

| (b) | Projection Angle (αv) | Scanning Range on Wavelength Conversion Member (S) | Deflection Angle of Mirror (β v_max) | Mechanical Swing Half Angle of Mirror (γ v_max) | Distance between Mirror and Wavelength Conversion Member |
|---|---|---|---|---|---|
| WIDE | ± 6.5 deg. | ± 3.65 mm | ± 8.6 deg. | ± 4.3 deg. | 24.0 mm |
| MID | ± 3.6 deg. | ± 1.96 mm | ± 8.6 deg. | ± 4.3 deg. | 13.4 mm |
| HOT | ± 1.5 deg. | ± 0.84 mm | ± 8.6 deg. | ± 4.3 deg. | 5.5 mm |

Fig. 33A

| Light Distribution No. | Optical Element No. used | | |
|---|---|---|---|
| | DO1 | DO2 | DO3 |
| L1: Hot-Zone Important | DO1-3 | DO2-3 | DO3-3 |
| L2: Hot-Zone Brighter | DO1-3 | DO2-1 | DO3-1 |
| L3: Standard | DO1-1 | DO2-1 | DO3-1 |
| L4: Wide-Zone Brighter | DO1-2 | DO2-1 | DO3-1 |
| L5: Wide-Zone Important | DO1-2 | DO2-2 | DO3-2 |

Fig. 33B

| Light Distribution No. | Region | Disperse Ratio | | | Region Output Ratio |
|---|---|---|---|---|---|
| | | DO1 | DO2 | DO3 | |
| L1: Hot-Zone Important | Wide | 1/4 | 1/4 | 1/4 | 3/4 |
| | Mid | 1/4 | 1/4 | 1/4 | 3/4 |
| | Hot | 1/2 | 1/2 | 1/2 | 3/2 |
| L2: Hot-Zone Brighter | Wide | 1/4 | 1/3 | 1/3 | 11/12 |
| | Mid | 1/4 | 1/3 | 1/3 | 11/12 |
| | Hot | 1/2 | 1/3 | 1/3 | 7/6 |
| L3: Standard | Wide | 1/3 | 1/3 | 1/3 | 3/3 |
| | Mid | 1/3 | 1/3 | 1/3 | 3/3 |
| | Hot | 1/3 | 1/3 | 1/3 | 3/3 |
| L4: Wide-Zone Brighter | Wide | 1/2 | 1/3 | 1/3 | 7/6 |
| | Mid | 1/4 | 1/3 | 1/3 | 11/12 |
| | Hot | 1/4 | 1/3 | 1/3 | 11/12 |
| L5: Wide-Zone Important | Wide | 1/2 | 1/2 | 1/2 | 3/2 |
| | Mid | 1/4 | 1/4 | 1/4 | 3/4 |
| | Hot | 1/4 | 1/4 | 1/4 | 3/4 |

VEHICLE LIGHTING FIXTURE

This application claims the priority benefit under 35 U.S.C. § 119 of Japanese Patent Application No. 2014-147501 filed on Jul. 18, 2014, which is hereby incorporated in its entirety by reference.

TECHNICAL FIELD

The presently disclosed subject matter relates to vehicle lighting fixtures, and in particular, to a vehicle lighting fixture that uses a plurality of laser light sources.

BACKGROUND ART

Vehicle lighting fixtures that use a plurality of laser light sources have conventionally been proposed, as illustrated in, for example, Japanese Patent Application Laid-Open No. 2013-016277 (or US2014/0168940A1 corresponding to the Japanese publication).

FIG. 1 is a schematic diagram illustrating the configuration of a vehicle lighting fixture 301 described in Japanese Patent Application Laid-Open No. 2013-016277.

As illustrated in FIG. 1, the vehicle lighting fixture 301 can include a plurality of laser light sources 302, a plurality of condenser lenses 311 and a plurality of optical fibers 312 provided corresponding to the plurality of laser light sources 302, a lens 313, a reflective mirror 314, a light emitting unit 304 (or a wavelength conversion member), a reflector 305, etc. Rays of laser light emitted from the plurality of laser light sources 302 can be collected by the respective condenser lenses 311 and incident on the respective input ends (input end faces) of the respective optical fibers 312. The rays of laser light guided through the respective optical fibers 312 can then exit through respective output ends (output end faces) of the respective optical fibers 312, and can be collected by the lens 313 and reflected by the reflective mirror 314. The reflected rays of laser light can be incident on the light emitting unit 304 to serve as excitation light. Thus, the excited wavelength conversion material contained in the light emitting unit 304 can emit light, so that the original rays of laser light and the light from the wavelength conversion material can be mixed. As a result, the light emitting unit 304 can serve as a light source.

Therefore, the vehicle lighting fixture 301 with the above-described configuration can simply project light from the light emitting unit 304 (wavelength conversion member) forward by means of the reflector 305. Accordingly, the vehicle lighting fixture 301 cannot form predetermined light distribution patterns formed by superimposing a plurality of partial light distribution patterns, such as a high-beam light distribution pattern (for driving) formed by superimposing a hot-zone partial light distribution pattern, a middle-zone partial light distribution pattern (diffused more than the hot-zone partial light distribution pattern), and a wide-zone partial light distribution pattern (diffused more than the middle-zone partial light distribution pattern). Furthermore, the vehicle lighting fixture 301 cannot change the light intensity of a particular partial light distribution pattern out of the plurality of partial light distribution patterns in accordance with the condition surrounding the vehicle.

SUMMARY

The presently disclosed subject matter was devised in view of these and other problems and features in association with the conventional art. According to an aspect of the presently disclosed subject matter, there can be provided a vehicle lighting fixture configured to form predetermined light distribution patterns (for example, a high-beam (driving) light distribution pattern and a low-beam (passing) light distribution pattern) by superimposing a plurality of partial light distribution patterns, wherein the vehicle lighting fixture can change a light intensity of at least one partial light distribution pattern out of the plurality of partial light distribution patterns.

According to another aspect of the presently disclosed subject matter, a vehicle lighting fixture can be configured to form a predetermined light distribution pattern by superimposing N partial light distribution patterns wherein N is a natural number of 2 or more. The vehicle lighting fixture can include a light intensity changing unit configured to change a light intensity of at least one partial light distribution pattern out of the N partial light distribution patterns.

With the vehicle lighting fixture according to the above-described aspect, the predetermined light distribution pattern (for example, a high-beam (driving) light distribution pattern and a low-beam (passing) light distribution pattern) can be made appropriate for the conditions surrounding the vehicle body (namely, the running conditions). This can be achieved by the light intensity changing unit configured to change a light intensity of at least one partial light distribution pattern out of the N partial light distribution patterns.

According to another aspect of the presently disclosed subject matter, the vehicle lighting fixture according to the above-mentioned aspect can be configured to form a plurality of predetermined light distribution patterns, and when one light distribution pattern among the plurality of predetermined light distribution patterns is selected on the basis of a manual operation or an automatic operation based on information from a sensor installed in a vehicle body, the light intensity changing unit can change a light intensity of at least one partial light distribution pattern among the N partial light distribution patterns so as to form the one light distribution pattern selected manually or automatically.

In the vehicle lighting fixture with the above configuration, the predetermined light distribution pattern (for example, a high-beam (driving) light distribution pattern and a low-beam (passing) light distribution pattern) can be made appropriate for the conditions surrounding the vehicle body, or the running conditions, manually or automatically in accordance with the conditions surrounding the vehicle.

According to another aspect of the presently disclosed subject matter, the vehicle lighting fixture according to the above-mentioned aspect configured to form a predetermined light distribution pattern by superimposing N partial light distribution patterns wherein N is a natural number of 2 or more can include: N optical fibers provided corresponding to the respective N partial light distribution patterns; N laser light sources provided corresponding to the respective N optical fibers; a plurality of diffractive optical elements provided corresponding to the respective N laser light sources; an actuator provided corresponding to each one of the N laser light sources and configured to dispose any one of the plurality of diffractive optical elements corresponding to the one of the N laser light sources in an optical path of laser light from the one laser light source; and a lighting unit configured to form the predetermined light distribution pattern with the laser light propagating through the N optical fibers. In this vehicle lighting fixture, when each one of the plurality of diffractive optical elements is disposed in the optical path of laser light from corresponding one of the laser light sources, the one of the plurality of diffractive optical elements can be configured to deflect the laser light from the corresponding one of the laser light sources toward respective incident end faces of the N optical fibers at disperse ratios different from each other by diffracting the laser light from the laser light source. The actuator can be configured to switch over each one of the diffractive optical elements to be disposed in the optical path of laser light of the corresponding one of the laser light sources for each laser light source so that an output of laser light exiting through an output end face of at least one optical fiber out of the N optical fibers increases, to thereby change the light intensity of at least one partial light distribution pattern out of the N partial light distribution patterns.

The vehicle lighting fixture according to the above-described aspect is configured to form predetermined light distribution patterns (for example, a high-beam (driving) light distribution pattern and a low-beam (passing) light distribution pattern) by superimposing a plurality of partial light distribution patterns. Further, the vehicle lighting fixture can change the light intensity of at least one partial light distribution pattern out of the plurality of partial light distribution patterns. As a result, the predetermined light distribution pattern (for example, a high-beam (driving) light distribution pattern or a low-beam (passing) light distribution pattern) can be made appropriate for the conditions surrounding the vehicle (namely, the running condition).

This can be achieved by switching over the diffractive optical element to be disposed in the optical path of laser light of the laser light source for each laser light source so that an output of laser light exiting through the output end face of at least one optical fiber out of the N optical fibers increases, whereby the laser light with the relatively increased output can form a particular partial light distribution pattern.

Furthermore, with the above-described vehicle lighting fixture, without changing the outputs of laser light from the respective laser light sources (i.e., with the outputs of laser light from the respective laser light sources being maintained), at least one partial light distribution pattern can be changed in terms of light intensity.

This is because the diffractive optical element to be disposed in the optical path of laser light of the laser light source is switched over to another for each laser light source, thereby changing the light intensity of the particular partial light distribution pattern.

According to another aspect of the presently disclosed subject matter, the vehicle lighting fixture according to the above-mentioned aspect can be configured to form the plurality of predestined light distribution patterns, and when a particular light distribution pattern among the plurality of predetermined light distribution patterns is selected on the basis of a manual operation or an automatic operation based on information from a sensor installed in a vehicle, the actuator can switch over the diffractive optical element to be disposed in the optical path of the laser light of the laser light source for each laser light source so as to form the particular light distribution pattern selected manually or automatically.

The vehicle lighting fixture according to the above-described aspect is configured to manually or automatically form the predetermined light distribution pattern (for example, a high-beam (driving) light distribution pattern and a low-beam (passing) light distribution pattern) that can be made appropriate for the conditions surrounding the vehicle (namely, the running condition).

According to another aspect of the presently disclosed subject matter, the vehicle lighting fixture according to any of the above-mentioned aspects is configured such that the diffractive optical elements can each be any one of a holographic optical element (HOE) and a blazed diffractive optical element.

In the vehicle lighting fixture with the above configuration, the laser light from each of the laser light sources can be deflected with high efficiency.

BRIEF DESCRIPTION OF DRAWINGS

These and other characteristics, features, and advantages of the presently disclosed subject matter will become clear from the following description with reference to the accompanying drawings, wherein:

FIG. 2 is a schematic diagram illustrating a configuration of a vehicle lighting fixture utilizing a coupler/distributer made in accordance with principles of the presently disclosed subject matter;

FIG. 9 is a perspective view illustrating an optical deflector 201 utilizing a 2-D optical scanner (fast resonant and slow static combination);

FIG. 15 is a table summarizing the conditions to be satisfied in order to change the scanning regions $A_{Wide}$, $A_{Mid}$, and $A_{Hot}$ when the distances between each of the optical deflectors $201_{Wide}$, $201_{Mid}$, and $201_{Hot}$ (the center of the mirror part 202) and the wavelength conversion member 18 are the same (or substantially the same) as each other;

FIG. 18 shows tables summarizing the conditions to be satisfied in order to change the sizes of the scanning regions $A_{Wide}$, $A_{Mid}$, and $A_{Hot}$ when the drive voltage to be applied to each of the optical deflectors $201_{Wide}$, $201_{Mid}$, and $201_{Hot}$ is the same (or substantially the same) as each other;

FIG. 33A is a table summarizing the relationship between the light distribution selected manually or automatically and the diffractive optical element $80_{DO1}$ to $80_{DO3}$ used when that light distribution is selected, and FIG. 33B is a table summarizing the relationship between the light distribution selected manually or automatically and the light scattering ratio when that light distribution is selected;

DESCRIPTION OF EXEMPLARY EMBODIMENTS

Figure 1:
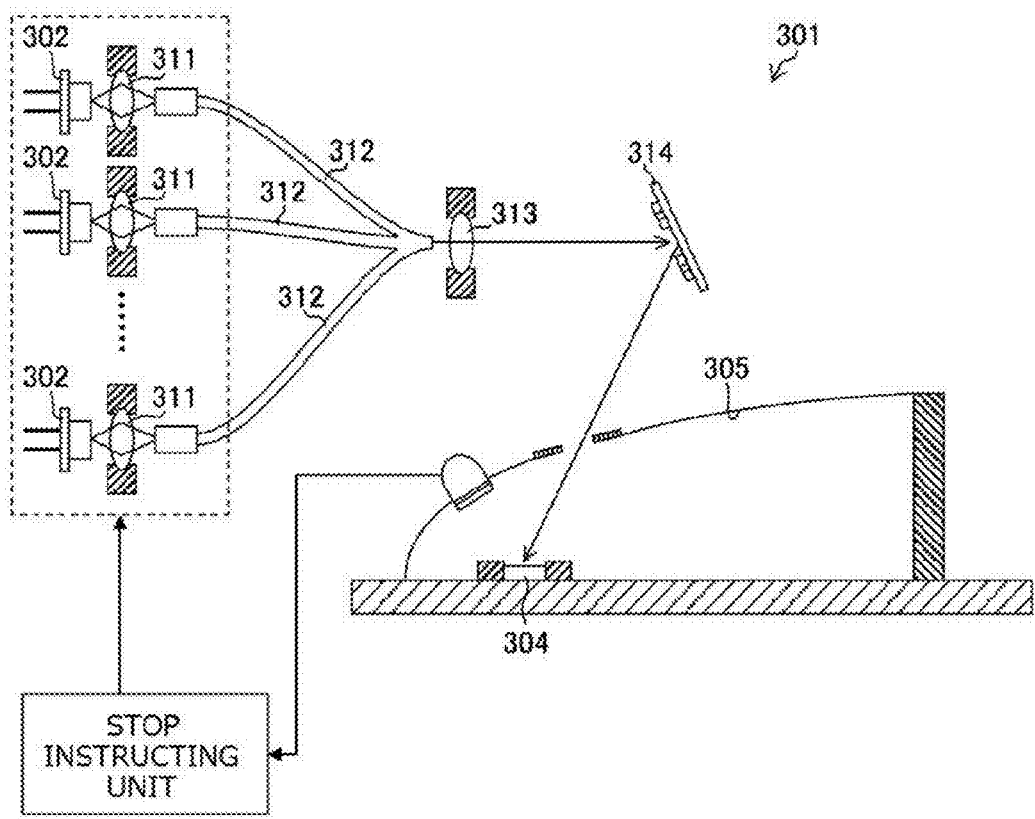
FIG. 1 is a schematic diagram illustrating a configuration of a conventional vehicle lighting fixture disclosed in Japanese Patent Application Laid-Open No. 2013-016277 (or US2014/0168940A1 corresponding to the Japanese publication)

A description will now be made below to vehicle lighting fixtures of the presently disclosed subject matter utilizing a coupler/distributer with reference to the accompanying drawings in accordance with exemplary embodiments.

In the specification, the term "hot-zone" member/part can mean a member/part for use in forming a hot-zone partial light distribution pattern (with highest intensity), the term "middle-zone" member/part can mean a member/part for use in forming a middle-zone partial light distribution pattern (diffused more than the hot-zone partial light distribution pattern), and the term "wide-zone" member/part can mean a member/part for use in forming a wide-zone partial light distribution pattern (diffused more than the middle-zone partial light distribution pattern), unless otherwise specified.

FIG. 2 is a schematic diagram illustrating a configuration of a vehicle lighting fixture 100 utilizing a coupler/distributer 70 made in accordance with the principles of the presently disclosed subject matter.

As illustrated in FIG. 2, the vehicle lighting fixture 100 can include the coupler/distributer 70, a wide-zone optical fiber $36_{Wide}$, a middle-zone optical finger $36_{Mid}$, a hot-zone optical fiber $36_{Hot}$, a lighting unit 40, etc. The vehicle lighting fixture 100 can further include a housing 22 and an outer lens 16 to define a lighting chamber 24. The lighting unit 40 can be disposed within the lighting chamber 24 together with an extension 12. Reference numeral 26 denotes a member serving as a fixing mechanism and an optical axis adjustment mechanism. The coupler/distributer 70 can be accommodated in a casing 30 together with a control circuit 28 to be modularized therewith.

Each of the optical fibers $36_{Wide}$, $36_{Mid}$, and $36_{Hot}$ can be coupled at its incident end to corresponding one of optical fiber coupling parts $72_{Wide}$, $72_{Mid}$, and $72_{Hot}$ of the coupler/distributer 70. Furthermore, each of the optical fibers $36_{Wide}$, $36_{Mid}$, and $36_{Hot}$ can be coupled at its output end to the lighting unit 40.

Figure 3A:
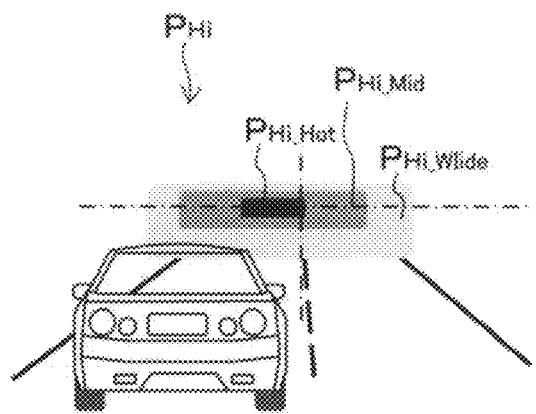
FIG. 3A is a view illustrating an exemplary high-beam light distribution pattern $P_{Hi}$ formed by a vehicle lighting fixture 100 on a virtual vertical screen assumed to be disposed in front of a vehicle body, approximately 25 m away from the vehicle front face.

The lighting unit 40 can be configured to form a high-beam light distribution pattern $P_{Hi}$, as illustrated in FIG. 3A, using laser light propagated through the respective optical fibers $36_{Wide}$, $36_{Mid}$, and $36_{Hot}$. FIG. 3A illustrates an exemplary high-beam light distribution pattern $P_{Hi}$ formed by the vehicle lighting fixture 100 on a virtual vertical screen assumed to be disposed in front of a vehicle body (approximately 25 m away from the vehicle front face). The high-beam light distribution pattern $P_{Hi}$ can be formed by superimposing the respective partial light distribution patterns $P_{Hi\_Wide}$, $P_{Hi\_Mid}$, and $P_{Hi\_Hot}$.

The high-beam light distribution pattern $P_{Hi}$ can correspond to the "predetermined light distribution pattern formed by superimposing N partial light distribution patterns" as defined in the presently disclosed subject matter. The wide-zone optical fiber $36_{Wide}$, middle-zone optical finger $36_{Mid}$, and hot-zone optical fiber $36_{Hot}$ can correspond to the "N optical fibers provided corresponding to the respective N partial light distribution patterns" as defined in the presently disclosed subject matter. The lighting unit 40 can correspond to the "lighting unit configured to form the predetermined light distribution pattern with the laser light propagating through the N optical fibers" as defined in the presently disclosed subject matter. In FIG. 2, N is 3, for example, which is not limitative and may be a natural number of 2 or more.

Figure 3B:
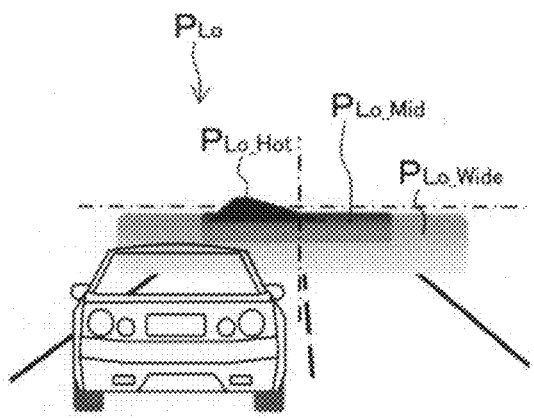
FIG. 3B is a view illustrating an exemplary low-beam light distribution pattern $P_{Lo}$.

The above-described configuration is not limitative, and the lighting unit 40 can be configured to form a low-beam light distribution pattern $P_{Lo}$, as illustrated in FIG. 3B, using the laser light propagated through the respective optical fibers $36_{Wide}$, $36_{Mid}$, and $36_{Hot}$. FIG. 3B illustrates an exemplary low-beam light distribution pattern $P_{Lo}$ formed by the vehicle lighting fixture 100 on the virtual vertical screen by superimposing the respective partial light distribution patterns $P_{Lo\_Wide}$, $P_{Lo\_Mid}$, and $P_{Lo\_Hot}$.

The lighting unit 40 can be configured, as illustrated in FIGS. 4 to 8, as a direct projection type lighting unit. The lighting unit 40 can include three optical deflectors $201_{Wide}$, $201_{Mid}$, and $201_{Hot}$ each including a mirror part 202, a wavelength conversion member 18, a projection lens assembly 20, etc. The three optical deflectors $201_{Wide}$, $201_{Mid}$, and $201_{Hot}$ can be provided corresponding to the three optical fibers $36_{Wide}$, $36_{Mid}$, and $36_{Hot}$ (output ends thereof). The wavelength conversion member 18 can include three scanning regions $A_{Wide}$, $A_{Mid}$, and $A_{Hot}$ (see FIG. 4) provided corresponding to the three optical deflectors $201_{Wide}$, $201_{Mid}$, and $201_{Hot}$. Partial light intensity distributions can be formed within the respective scanning regions $A_{Wide}$, $A_{Mid}$, and $A_{Hot}$, and can be projected through the projection lens assembly 20 serving as an optical system for forming the high-beam light distribution pattern $P_{Hi}$ (or the low-beam light distribution pattern $P_{Lo}$).

Figure 7:
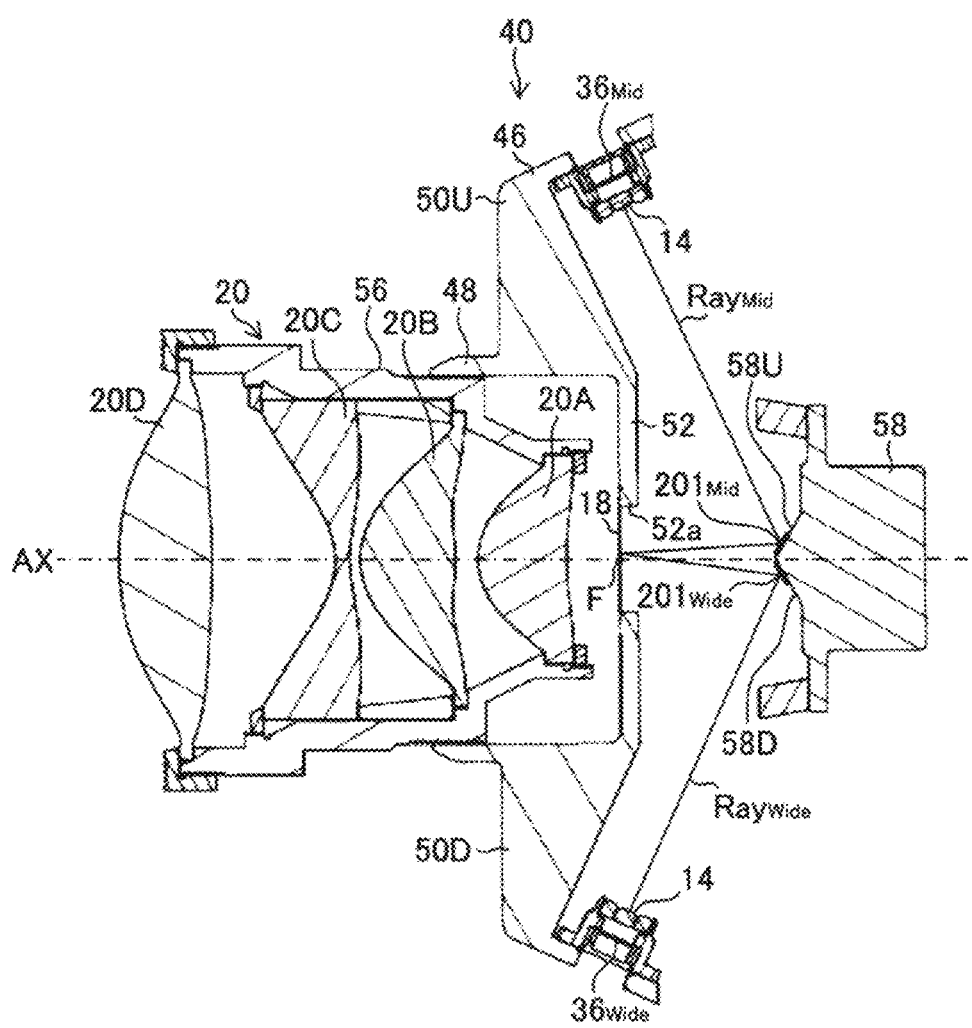
FIG. 7 is a cross-sectional view of the lighting unit of FIG. 6 taken along line A-A.

As illustrated in FIG. 7, the projection lens assembly 20, the wavelength conversion member 18, and the optical deflectors 201 ($201_{Wide}$, $201_{Mid}$, and $201_{Hot}$) can be disposed in this order along a reference axis AX (or referred to as an optical axis) extending in, in general, the front-to-rear direction of a vehicle body.

The lighting unit 40 can further include an optical fiber holder 46. The optical fiber holder 46 can be disposed to surround the reference axis AX and can hold the optical fibers $36_{Wide}$, $36_{Mid}$, and $36_{Hot}$ (output ends thereof) with a posture tilted in such a manner that laser light rays $Ray_{Wide}$, $Ray_{Mid}$, and $Ray_{Hot}$ are directed rearward and toward the reference axis AX, as illustrated in FIG. 7.

Specifically, the optical fibers $36_{Wide}$, $36_{Mid}$, and $36_{Hot}$ (or the output ends thereof) can be disposed by being fixed to the optical fiber holder 46 in the following manner.

Figure 6:
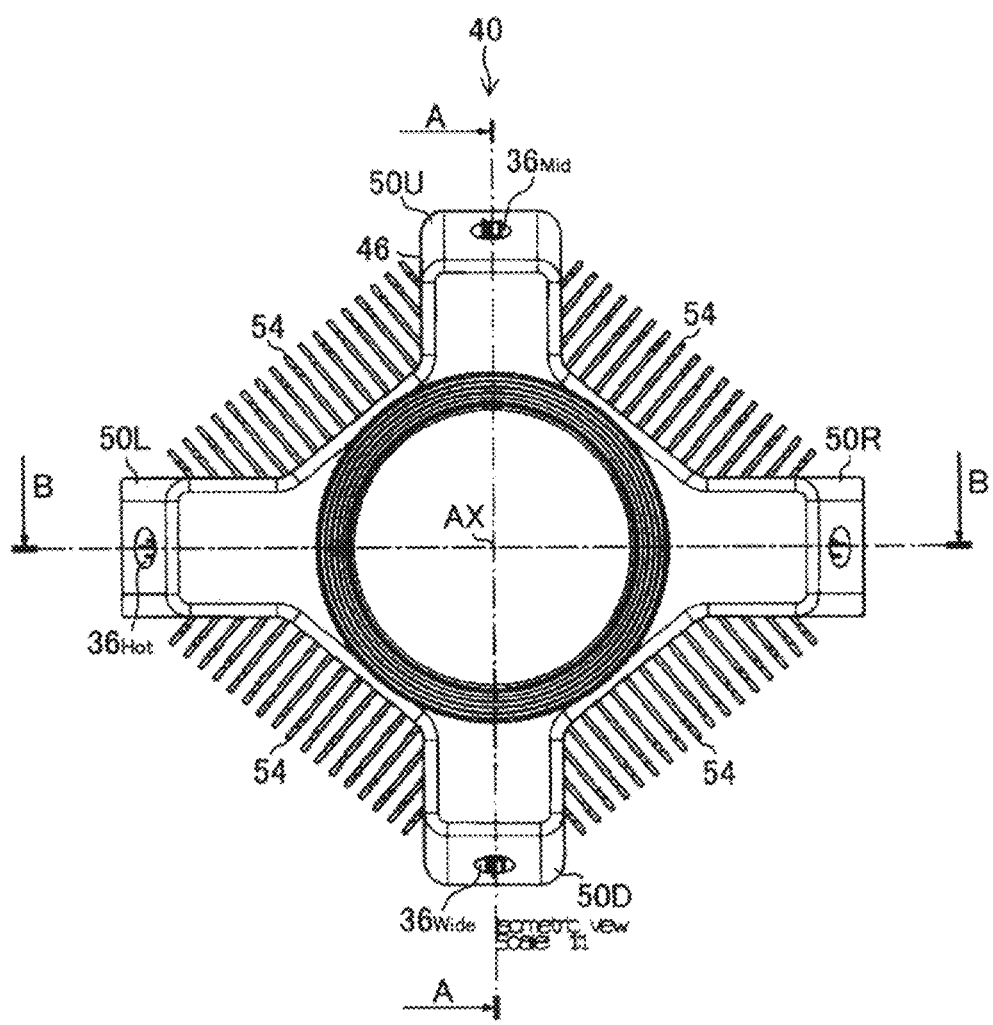
FIG. 6 is a front view illustrating the lighting unit 40.

As illustrated in FIG. 6, the optical fiber holder 46 can be configured to include a tubular part 48 extending in the reference axis AX, and extension parts 50U, 50D, 50L, and 50R each radially extending from the outer peripheral face at its upper, lower, left, or right part in an upper, lower, left, or right direction perpendicular to the reference axis AX. Specifically, the respective extension parts 50U, 50D, 50L, and 50R can be inclined rearward to the tip ends thereof, as illustrated in FIG. 7. Between the adjacent extension parts, there can be formed a heat dissipation part 54 (heat dissipation fin), as illustrated in FIG. 6.

As illustrated in FIG. 7, the wide-zone optical fiber $36_{Wide}$ can be fixed to the tip end of the extension part 50D with a posture tilted so that the laser light rays $Ray_{Wide}$ is directed to a rearward and obliquely upward direction. Similarly, the middle-zone optical fiber $36_{Mid}$ can be fixed to the tip end of the extension part 50U with a posture tilted so that the laser light rays $Ray_{Mid}$ is directed to a rearward and obliquely downward direction. Similarly, the hot-zone optical fiber $36_{Hot}$ can be fixed to the tip end of the extension part 50L with a posture tilted so that the laser light rays $Ray_{Hot}$ is directed to a rearward and obliquely rightward direction.

The lighting unit 40 can further include a lens holder 56 to which the projection lens assembly 20 (lenses 20A to 20D) is fixed. The lens holder 56 can be screwed at its rear end to the opening of the tubular part 48 so as to be fixed to the tubular part 48.

A condenser lens 14 can be disposed in front of each of the optical fibers $36_{Wide}$, $36_{Mid}$, and $36_{Hot}$ (output end faces thereof). The laser light rays $Ray_{Wide}$, $Ray_{Mid}$, and $Ray_{Hot}$ can be output from the optical fibers $36_{Wide}$, $36_{Mid}$, and $36_{Hot}$ (output end faces thereof) and condensed by the respective condenser lenses 14 (for example, collimated) to be incident on the respective mirror parts 202 of the optical deflectors $201_{Wide}$, $201_{Mid}$, and $201_{Hot}$.

The optical deflectors $201_{Wide}$, $201_{Mid}$, and $201_{Hot}$ can be configured by, for example, an MEMS scanner. The driving system of the optical deflectors $201_{Wide}$, $201_{Mid}$, and $201_{Hot}$ is not limited to a particular system, and examples thereof may include a piezoelectric system, an electrostatic system, and an electromagnetic system.

The piezoelectric system used in the optical deflector is not limited to a particular system, and examples thereof may include a one-dimensional nonresonance/one-dimensional resonance type, a two-dimensional nonresonance type, and a two-dimensional resonance type.

The following exemplary embodiment may employ the one-dimensional nonresonance/one-dimensional resonance type (2-D optical scanner (fast resonant and slow static combination)) of optical deflector using the piezoelectric system, as one example.

FIG. 9 is a perspective view illustrating the optical deflector 201 utilizing a 2-D optical scanner (fast resonant and slow static combination).

As illustrated in FIG. 9, the optical deflector 201 can include the mirror part 202 (also called as MEMS mirror), first piezoelectric actuators 203 and 204, a movable frame 212, second piezoelectric actuators 205 and 206, and a base 215. The first piezoelectric actuators 203 and 204 can drive the mirror part 202 via torsion bars 211a and 211b. The movable frame 212 can support the first piezoelectric actuators 203 and 204. The second piezoelectric actuators 205 and 206 can drive the movable frame 212. The base 215 can support the second piezoelectric actuators 205 and 206.

The mirror part 202 can be formed in a circle shape and the torsion bars 211a and 211b can be connected to the mirror part 202 so as to extend outward from both ends of the mirror part 202. The first piezoelectric actuators 203 and 204 can be formed in a semi-circle shape so as to surround the mirror part 202 while disposed with a gap between them. Furthermore, the first piezoelectric actuators 203 and 204 can be coupled to each other with the torsion bars 211a and 211b interposed therebetween at their respective ends. The movable frame 212 can be disposed to surround the mirror part 202 and the first piezoelectric actuators 203 and 204.

The first piezoelectric actuators 203 and 204 can be coupled to and supported by the movable frame 212 at respective outer central portions of the semi-circle (arc) shape.

The movable frame 212 can have a rectangular shape and include a pair of sides disposed in a direction perpendicular to the directions of the torsion bars 211a and 211b, at which the movable frame 212 can be coupled to the respective tip ends of the second piezoelectric actuators 205 and 206 opposite to each other with the movable frame 212 interposed therebetween. The base 215 can include a supporting base part 214 formed thereon so as to surround the movable frame 212 and the second piezoelectric actuators 205 and 206. In this configuration, the second piezoelectric actuators 205 and 206 can be coupled to and supported at respective base ends thereof by the supporting base part 214.

Figure 10A:
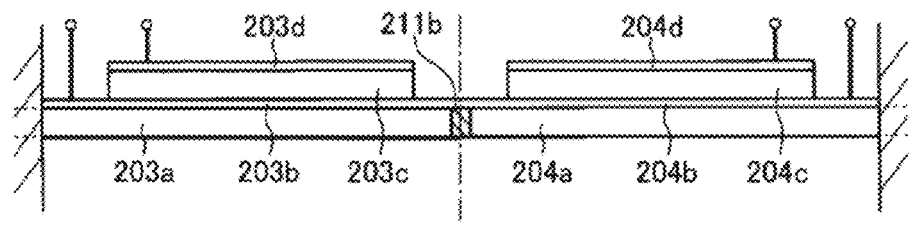
FIG. 10A is a schematic diagram illustrating the state in which first piezoelectric actuators 203 and 204 are not applied with a voltage.

The first piezoelectric actuators 203 and 204 each can include a single piezoelectric cantilever composed of a support 203a, 204a, a lower electrode 203b, 204b, a piezoelectric body 203c, 204c, and an upper electrode 203d, 204d, as illustrated in FIG. 10A.

Further, as illustrated in FIG. 9, the second piezoelectric actuators 205 and 206 each can include six piezoelectric cantilevers 205A to 205F, 206A to 206F, which are coupled to adjacent ones thereof so as to be folded back at its end. As a result, the second piezoelectric actuators 205 and 206 can be formed in an accordion shape as a whole. Each of the piezoelectric cantilevers 205A to 205F and 206A to 206F can have the same configuration as those of the piezoelectric cantilevers of the first piezoelectric actuators 203 and 204.

A description will now be given of the action of the mirror part 202 (swing motion around a first axis X1).

Figure 10B:
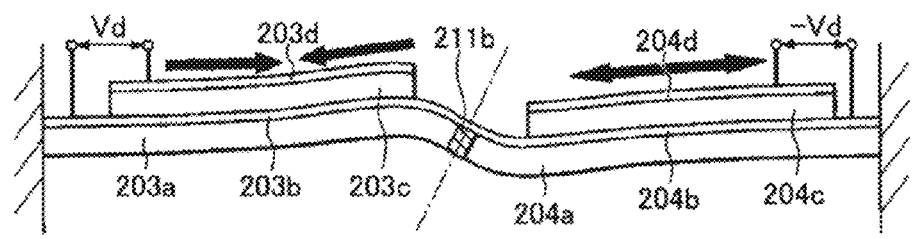
FIG. 10B is a schematic diagram illustrating the state in which they are applied with a voltage.

FIGS. 10A and 10B each show the cross-sectional view of the part where the first piezoelectric actuators 203 and 204 are provided, while taken along line A-A in FIG. 9. Specifically, FIG. 10A is a schematic diagram illustrating the state in which the first piezoelectric actuators 203 and 204 are not applied with a voltage, and FIG. 10B is a schematic diagram illustrating the state in which they are applied with a voltage.

As illustrated in FIG. 10B, voltages of +Vd and −Vd, which have respective reversed polarity, can be applied to between the upper electrode 203d and the lower electrode 203b of the first piezoelectric actuator 203 and between the upper electrode 204d and the lower electrode 204b of the first piezoelectric actuator 204, respectively. As a result, they can be deformed while being bent in respective opposite directions.

This bent deformation can rotate the torsion bar 211b in such a state as illustrated in FIG. 10B. The torsion bar 211a can receive the same rotation. Upon rotation of the torsion bars 211a and 211b, the mirror part 201 can be swung around the first axis X1 with respect to the movable frame 212.

A description will now be given of the action of the mirror part 202 (swing motion around a second axis X2). Note that the second axis X2 is perpendicular to the first axis X1 at the center (center of gravity) of the mirror part 202.

Figure 11A:
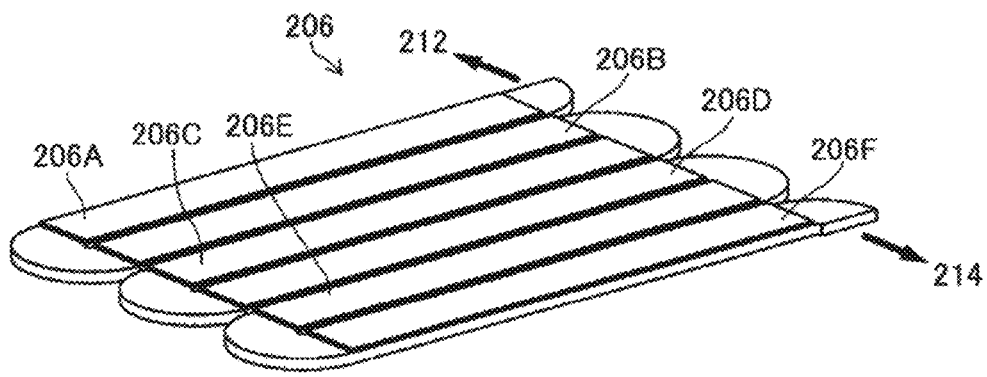
FIG. 11A is a schematic diagram illustrating the state in which second piezoelectric actuators 205 and 206 are not applied with a voltage.
Figure 11B:
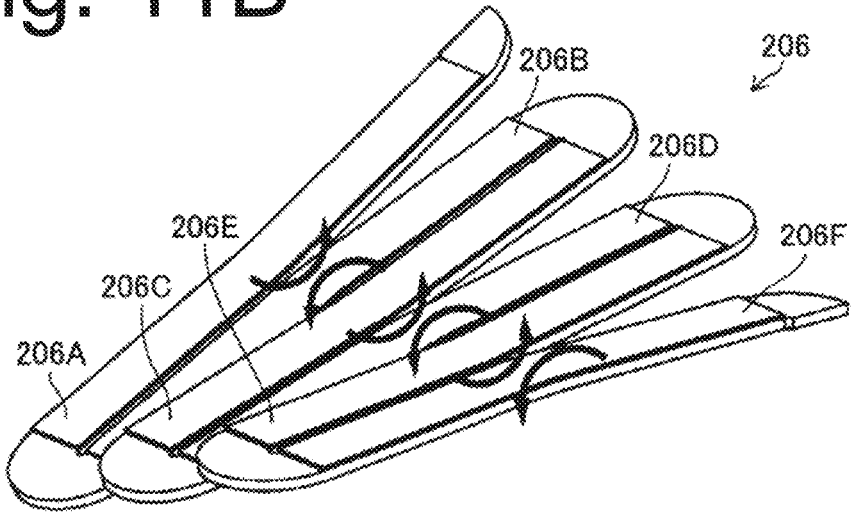
FIG. 11B is a schematic diagram illustrating the state in which they are applied with a voltage.

FIG. 11A is a schematic diagram illustrating the state in which the second piezoelectric actuators 205 and 206 are not applied with a voltage, and FIG. 11B is a schematic diagram illustrating the state in which they are applied with a voltage.

As illustrated in FIG. 11B, when the second piezoelectric actuator 206 is applied with a voltage, the odd-numbered piezoelectric cantilevers 206A, 206C, and 206E from the movable frame 212 side can be deformed and bent upward while the even-numbered piezoelectric cantilevers 206B, 206D, and 206F can be deformed and bent downward. As a result, the piezoelectric actuator 206 as a whole can be deformed with a larger angle (angular variation) accumulated by the magnitudes of the respective bent deformation of the piezoelectric cantilevers 206A to 206F. The second piezoelectric actuator 205 can also be driven in the same manner. This angular variation of the second piezoelectric actuators 205 and 206 can cause the movable frame 212 (and the mirror part 202 supported by the movable frame 212) to rotate with respect to the base 215 around the second axis X2 perpendicular to the first axis X1.

A single support formed by processing a silicon substrate can constitute a mirror part support for the mirror part 202, the torsion bars 211a and 211b, supports for the first piezoelectric actuators 203 and 204, the movable frame 212, supports for the second piezoelectric actuators 205 and 206, and the supporting base part 214 on the base 215. Furthermore, the base 215 can be formed from a silicon substrate, and therefore, it can be integrally formed from the above single support by processing a silicon substrate. The technique of processing such a silicon substrate can employ those described in, for example, Japanese Patent Application Laid-Open No. 2008-040240, which is hereby incorporated in its entirety by reference. There can be a gap between the mirror part 202 and the movable frame 212, so that the mirror part 202 can be swung around the first axis X1 with respect to the movable frame 212 within a predestined angle range. Furthermore, there can be a gap between the movable frame 212 and the base 215, so that the movable frame 212 (and together with the mirror part 202 supported by the movable frame 212) can be swung around the second axis X2 with respect to the base 215 within a predetermined angle range.

The optical deflector 201 can include electrode sets 207 and 208 to apply a drive voltage to the respective piezoelectric actuators 203 to 206.

The electrode set 207 can include an upper electrode pad 207a, a first upper electrode pad 207b, a second upper electrode pad 207c, and a common lower electrode 207d. The upper electrode pad 207a can be configured to apply a drive voltage to the first piezoelectric actuator 203. The first upper electrode pad 207b can be configured to apply a drive voltage to the odd-numbered piezoelectric cantilevers 205A, 205C, and 205E of the second piezoelectric actuator 205. The second upper electrode pad 207c can be configured to apply a drive voltage to the even-numbered piezoelectric cantilevers 205B, 205D, and 205F of the second piezoelectric actuator 205. The common lower electrode 207d can be used as a lower electrode common to the upper electrode pads 207a to 207c.

Similarly thereto, the electrode set 208 can include an upper electrode pad 208a, a first upper electrode pad 208b, a second upper electrode pad 208c, and a common lower electrode 208d. The upper electrode pad 208a can be configured to apply a drive voltage to the first piezoelectric actuator 204. The first upper electrode pad 208b can be configured to apply a drive voltage to the odd-numbered piezoelectric cantilevers 206A, 206C, and 206E of the second piezoelectric actuator 206. The second upper electrode pad 208c can be configured to apply a drive voltage to the even-numbered piezoelectric cantilevers 206B, 206D, and 206F of the second piezoelectric actuator 206. The common lower electrode 208d can be used as a lower electrode common to the upper electrode pads 208a to 208c.

In the present exemplary embodiment, the first piezoelectric actuator 203 can be applied with a first AC voltage as a drive voltage, while the first piezoelectric actuator 204 can be applied with a second AC voltage as a drive voltage, wherein the first AC voltage and the second AC voltage can be different from each other in phase, such as a sinusoidal wave with an opposite phase or shifted phase. In this case, an AC voltage with a frequency close to a mechanical resonance frequency (first resonance point) of the mirror part 202 including the torsion bars 211a and 211b can be applied to resonantly drive the first piezoelectric actuators 203 and 204. This can cause the mirror part 202 to be reciprocately swung around the first axis X1 with respect to the movable frame 212, so that the laser light rays from the optical fibers $36_{Wide}$, $36_{Mid}$, and $36_{Hot}$ (or the output end faces thereof) and incident on the mirror part 202 can scan in a first direction (for example, horizontal direction).

A third AC voltage can be applied to each of the second piezoelectric actuators 205 and 206 as a drive voltage. In this case, an AC voltage with a frequency equal to or lower than a predetermined value that is smaller than a mechanical resonance frequency (first resonance point) of the movable frame 212 including the mirror part 202, the torsion bars 211a and 211b, and the first piezoelectric actuators 203 and 204 can be applied to nonresonantly drive the second piezoelectric actuators 205 and 206. This can cause the mirror part 202 to be reciprocately swung around the second axis X2 with respect to the base 215, so that the laser light rays from the optical fibers $36_{Wide}$, $36_{Mid}$, and $36_{Hot}$ (or the output end faces thereof) and incident on the mirror part 202 can scan in a second direction (for example, vertical direction).

The optical deflector 201 utilizing a 2-D optical scanner (fast resonant and slow static combination) can be arranged so that the first axis X1 is contained in a vertical plane and the second axis X2 is contained in a horizontal plane. With this arrangement, a predetermined light distribution pattern (two-dimensional image corresponding to the required predetermined light distribution pattern) being wide in the horizontal direction and narrow in the vertical direction for use in a vehicular headlight can be easily formed (drawn).

Figure 12A:
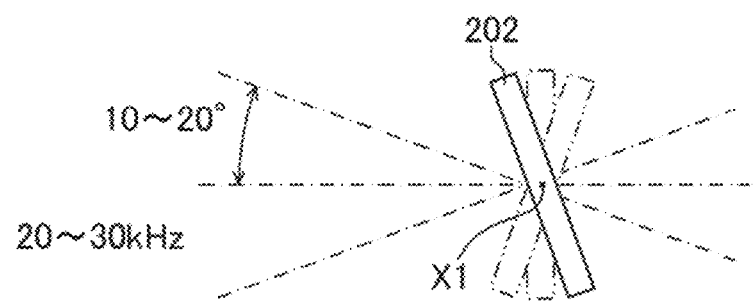
FIG. 12A is a diagram illustrating the maximum swing angle of a mirror part 202 around a first axis X1.
Figure 12B:
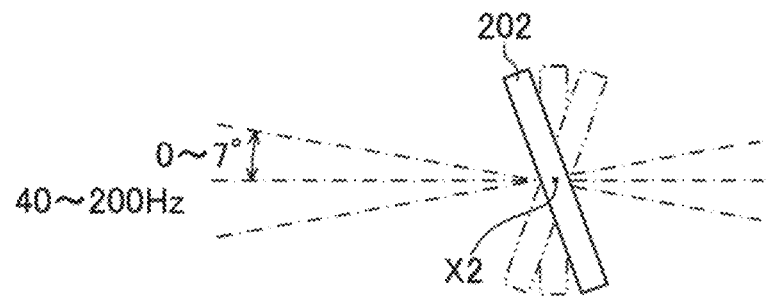
FIG. 12B is a diagram illustrating the maximum swing angle of the mirror part 202 around a second axis X2.

Specifically, the optical deflector 201 utilizing a 2-D optical scanner (fast resonant and slow static combination) can be configured such that the maximum swing angle of the mirror part 202 around the first axis X1 is larger than the maximum swing angle of the mirror part 202 around the second axis X2. For example, since the reciprocal swing of the mirror part 202 around the first axis X1 is caused due to the resonance driving, the maximum swing angle of the mirror part 202 around the first axis X1 ranges from 10 degrees to 20 degrees as illustrated in FIG. 12A. On the contrary, since the reciprocal swing of the mirror part 202 around the second axis X2 is caused due to the nonresonance driving, the maximum swing angle of the mirror part 202 around the second axis X2 becomes about 7 degrees as illustrated in FIG. 12B. As a result, the above-described arrangement of the optical deflector 201 utilizing a 2-D optical scanner (fast resonant and slow static combination) can easily form (draw) a predetermined light distribution pattern (two-dimensional image corresponding to the required predetermined light distribution pattern) being wide in the horizontal direction and narrow in the vertical direction for use in a vehicular headlight.

As described above, by driving the respective piezoelectric actuators 203 to 206, the laser light rays from the optical fibers $36_{Wide}$, $36_{Mid}$, and $36_{Hot}$ (or the output end faces thereof) and incident on the mirror part 202 can scan in a two dimensional manner (for example, in the horizontal and vertical directions).

Figure 8:
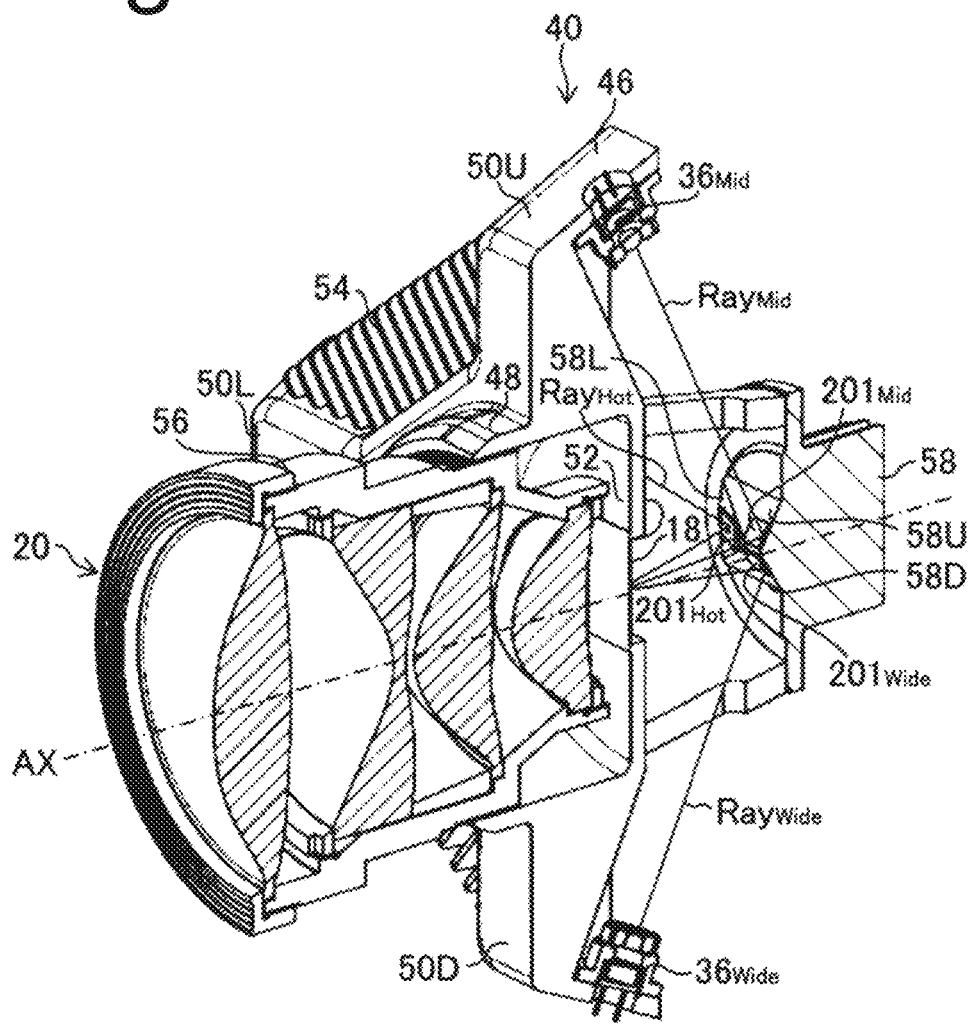
FIG. 8 is a perspective view including the cross-sectional view of FIG. 7 illustrating the lighting unit of FIG. 6 taken along line A-A.

As illustrated in FIG. 8, the optical deflectors $201_{Wide}$, $201_{Mid}$, and $201_{Hot}$ with the above-described configuration can be disposed to surround the reference axis AX and be closer to the reference axis AX than the optical fibers $36_{Wide}$, $36_{Mid}$, and $36_{Hot}$ (output ends thereof) so that the laser light rays output from the optical fibers $36_{Wide}$, $36_{Mid}$, and $36_{Hot}$ (output end faces thereof) can be incident on the corresponding mirror parts 202 of the optical deflectors $201_{Wide}$, $201_{Mid}$, and $201_{Hot}$ and reflected by the same to be directed to the corresponding scanning regions $A_{Wide}$, $A_{Mid}$, and $A_{Hot}$, respectively.

Specifically, the optical deflectors $201_{Wide}$, $201_{Mid}$, and $201_{Hot}$ can be secured to an optical deflector holder 58 as follows.

The optical deflector holder 58 can have a square pyramid shape projected forward, and its front face can be composed of an upper face 58U, a lower face 58D, a left face 58L, and a right face 58R (not shown in the drawings), as illustrated in FIG. 8.

The wide-zone optical deflector $201_{Wide}$ can be secured to the lower face 58D of the square pyramid face while being tilted so that the mirror part 202 thereof is positioned in an optical path of the laser light rays $Ray_{Wide}$ output from the wide-zone optical fiber $36_{Wide}$ (the output end faces thereof). Similarly thereto, the middle-zone optical deflector $201_{Mid}$ can be secured to the upper face 58U of the square pyramid face while being tilted so that the mirror part 202 thereof is positioned in an optical path of the laser light rays $Ray_{Mid}$ output from the middle-zone optical fiber $36_{Mid}$ (the output end faces thereof). Similarly thereto, the hot-zone optical deflector $201_{Hot}$ can be secured to the left face 58L (when viewed from front) of the square pyramid face while being tilted so that the mirror part 202 thereof is positioned in an optical path of the laser light rays $Ray_{Hot}$ output from the hot-zone optical fiber $36_{Hot}$ (the output end faces thereof).

The optical deflectors $201_{Wide}$, $201_{Mid}$, and $201_{Hot}$ each can be arranged so that the first axis X1 is contained in a vertical plane and the second axis X2 is contained in a horizontal plane. As a result, the above-described arrangement of the optical deflectors $201_{Wide}$, $201_{Mid}$, and $201_{Hot}$ can easily form (draw) a predetermined light distribution pattern (two-dimensional image corresponding to the required predetermined light distribution pattern) being wide in the horizontal direction and narrow in the vertical direction for use in a vehicular headlight.

The wide-zone optical deflector $201_{Wide}$ can draw a first two-dimensional image on the wide-zone scanning region $A_{Wide}$ with the laser light rays $Ray_{Wide}$ two-dimensionally scanning in the horizontal and vertical directions by the mirror part 202 thereof, to thereby form a first light intensity distribution on the wide-zone scanning region $A_{Wide}$.

Figure 31:
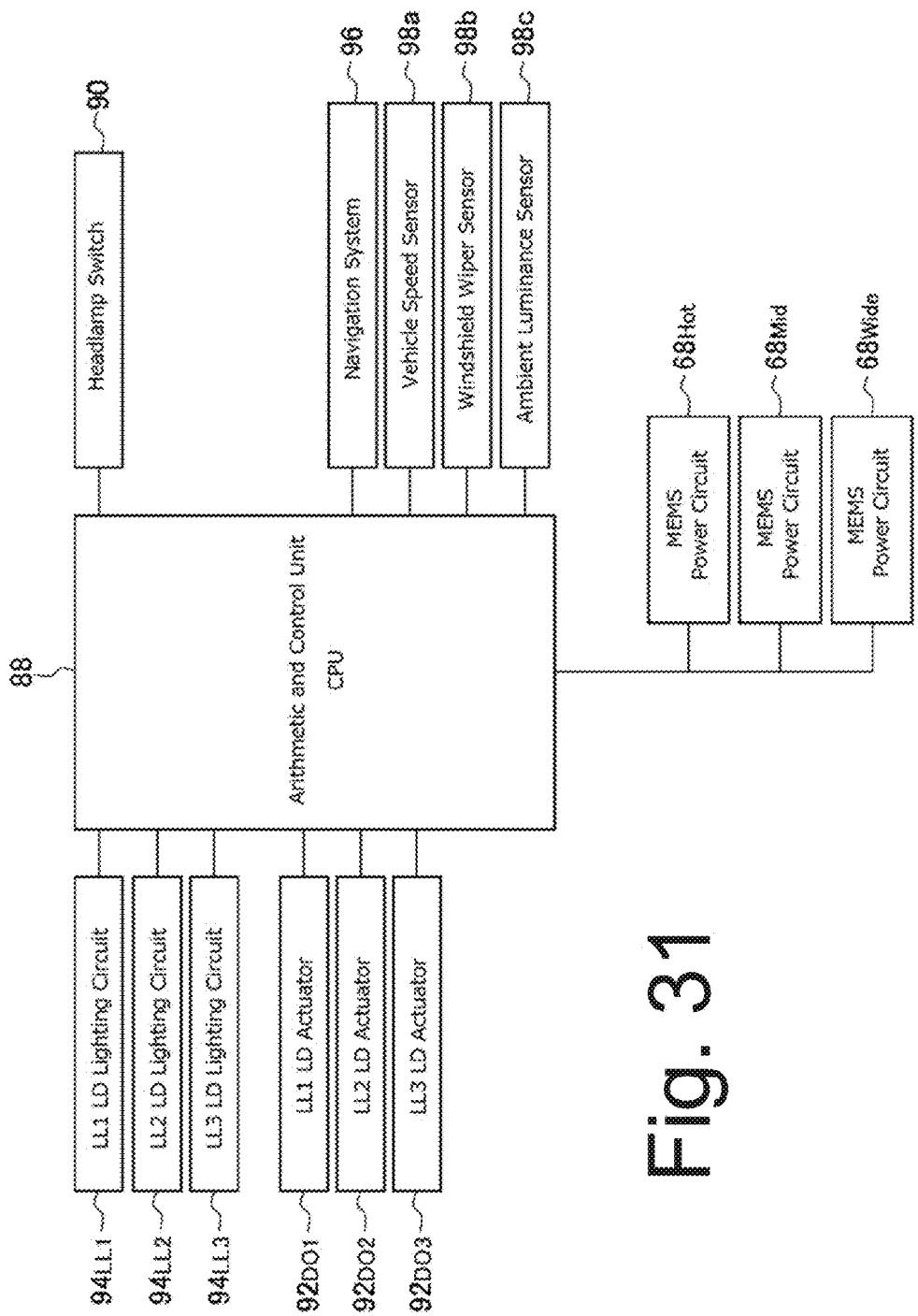
FIG. 31 is a functional block diagram representing the functional configuration of the coupler/distributer 70.

Specifically, the vehicle lighting fixture 100 can include a MEMS power circuit $68_{Wide}$ and a CPU 88, as illustrated in FIG. 31. In response to a command from the CPU 88, the MEMS power circuit $68_{Wide}$ can apply first and second AC voltages to the first piezoelectric actuators 203 and 204 of the wide-zone optical deflector $201_{Wide}$, to thereby resonantly drive the first piezoelectric actuators 203 and 204. As a result, the mirror part 202 of the wide-zone optical deflector $201_{Wide}$ can be reciprocately swung around the first axis X1. Furthermore, the MEMS power circuit $68_{Wide}$ can apply a third AC voltage to the second piezoelectric actuators 205 and 206 of the wide-zone optical deflector $201_{Wide}$, to thereby nonresonantly drive the second piezoelectric actuators 205 and 206. As a result, the mirror part 202 of the wide-zone optical deflector $201_{Wide}$ can be reciprocately swung around the second axis X2. In this manner, the laser light rays incident on the mirror part 202 can scan two-dimensionally (in the horizontal and vertical direction) to thereby form the first light intensity distribution on the wide-zone scanning region $A_{Wide}$.

The middle-zone optical deflector $201_{Mid}$ can draw a second two-dimensional image on the middle-zone scanning region $A_{Mid}$ with the laser light rays $Ray_{Mid}$ two-dimensionally scanning in the horizontal and vertical directions by the mirror part 202 thereof in such a manner that the second two-dimensional image overlaps the first two-dimensional image in part, to thereby form a second light intensity distribution on the middle-zone scanning region $A_{Mid}$ with a higher light intensity than that of the first light intensity distribution.

Specifically, the vehicle lighting fixture 100 can include a MEMS power circuit $68_{Mid}$ as illustrated in FIG. 31. In response to a command from the CPU 88, the MEMS power circuit $68_{Mid}$ can apply first and second AC voltages to the first piezoelectric actuators 203 and 204 of the middle-zone optical deflector $201_{Mid}$, to thereby resonantly drive the first piezoelectric actuators 203 and 204. As a result, the mirror part 202 of the middle-zone optical deflector $201_{Mid}$ can be reciprocately swung around the first axis X1. Furthermore, the MEMS power circuit $68_{Mid}$ can apply a third AC voltage to the second piezoelectric actuators 205 and 206 of the middle-zone optical deflector $201_{Mid}$, to thereby nonresonantly drive the second piezoelectric actuators 205 and 206. As a result, the mirror part 202 of the middle-zone optical deflector $201_{Mid}$ can be reciprocately swung around the second axis X2. In this manner, the laser light rays incident on the mirror part 202 can scan two-dimensionally (in the horizontal and vertical direction) to thereby form the second light intensity distribution on the middle-zone scanning region $A_{Mid}$.

Figure 4:
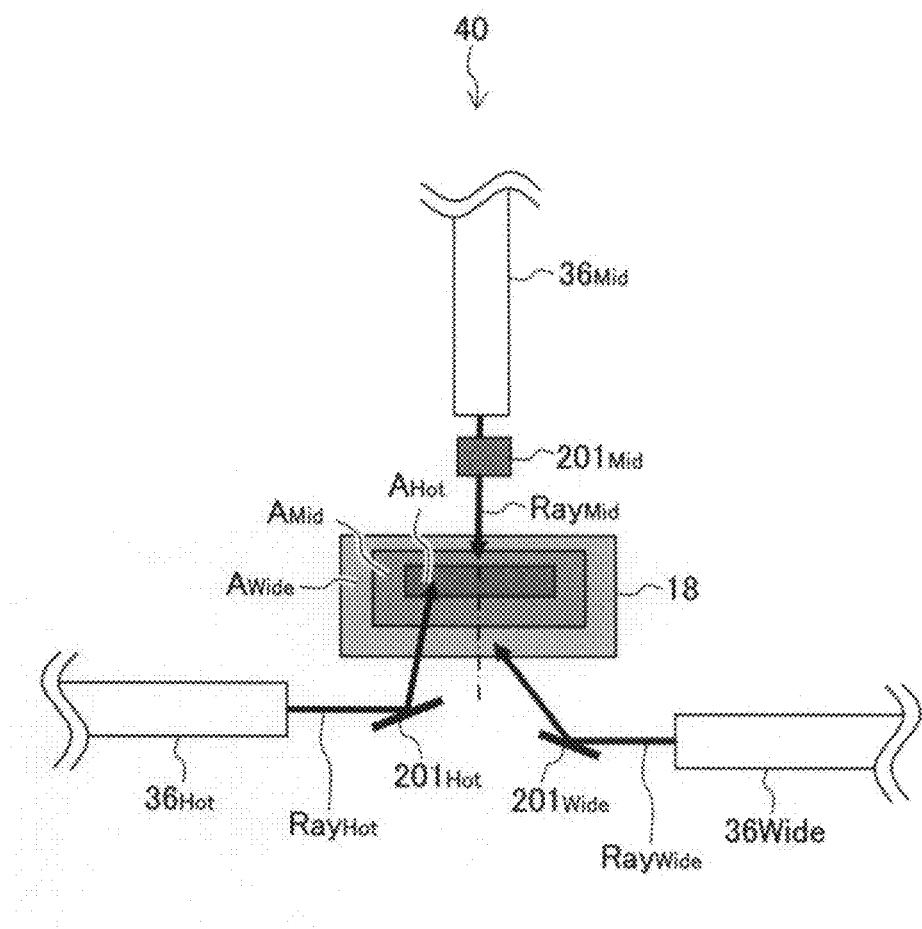
FIG. 4 is a schematic diagram illustrating a lighting unit 40.
Figure 5:
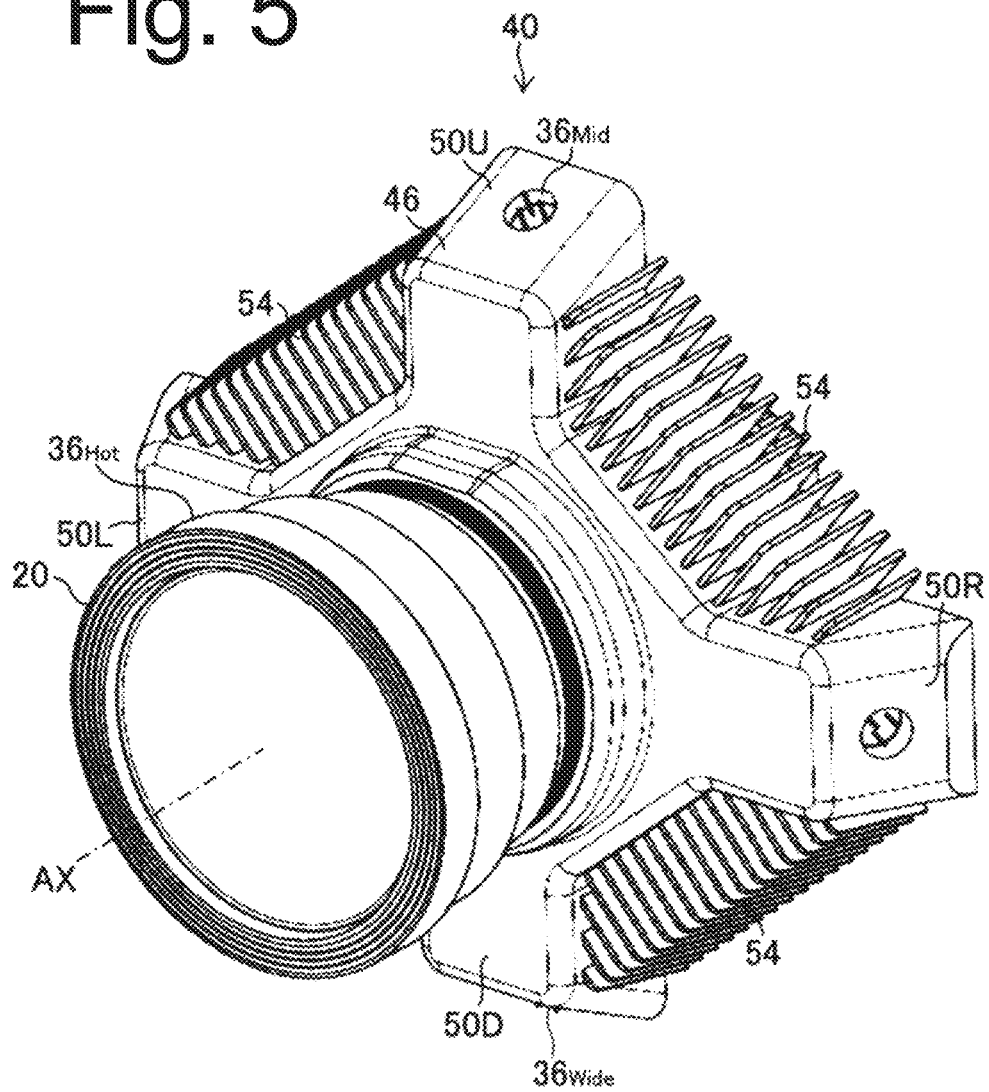
FIG. 5 is a perspective view illustrating the lighting unit 40.

As illustrated in FIG. 4, the middle-zone scanning region $A_{Mid}$ can be smaller than the wide-zone scanning region $A_{Wide}$ in size and overlap part of the wide-zone scanning region $A_{Wide}$. As a result of the overlapping, the overlapped middle-zone scanning region $A_{Mid}$ can have the relatively higher light intensity distribution.

The hot-zone optical deflector $201_{Hot}$ can draw a third two-dimensional image on the hot-zone scanning region $A_{Hot}$ with the laser light rays $Ray_{Hot}$ two-dimensionally scanning in the horizontal and vertical directions by the mirror part 202 thereof in such a manner that the third two-dimensional image overlaps the first and second two-dimensional images in part, to thereby form a third light intensity distribution on the hot-zone scanning region $A_{Hot}$ with a higher light intensity than that of the second light intensity distribution.

Specifically, the vehicle lighting fixture 100 can include a MEMS power circuit $68_{Hot}$ as illustrated in FIG. 31. In response to a command from the CPU 88, the MEMS power circuit $68_{Hot}$ can apply first and second AC voltages to the first piezoelectric actuators 203 and 204 of the hot-zone optical deflector $201_{Hot}$, to thereby resonantly drive the first piezoelectric actuators 203 and 204. As a result, the mirror part 202 of the hot-zone optical deflector $201_{Hot}$ can be reciprocately swung around the first axis X1. Furthermore, the MEMS power circuit $68_{Hot}$ can apply a third AC voltage to the second piezoelectric actuators 205 and 206 of the hot-zone optical deflector $201_{Hot}$, to thereby nonresonantly drive the second piezoelectric actuators 205 and 206. As a result, the mirror part 202 of the hot-zone optical deflector $201_{Hot}$ can be reciprocately swung around the second axis X2. In this manner, the laser light rays incident on the mirror part 202 can scan two-dimensionally (in the horizontal and vertical direction) to thereby form the third light intensity distribution on the hot-zone scanning region $A_{Hot}$.

As illustrated in FIG. 4, the hot-zone scanning region $A_{Hot}$ can be smaller than the middle-zone scanning region $A_{Mid}$ in size and overlap part of the middle-zone scanning region $A_{Mid}$. As a result of the overlapping, the overlapped hot-zone scanning region $A_{Hot}$ can have the relatively higher light intensity distribution.

The shape of the illustrated scanning regions $A_{Wide}$, $A_{Mid}$, and $A_{Hot}$ in FIG. 4 is a rectangular outer shape, but it is not limitative. The outer shape thereof can be a circle, an oval, or other shapes.

Figure 13A:
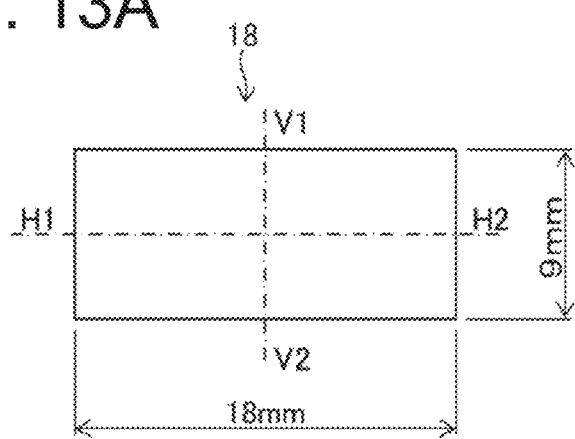
FIGS. 13A, 13B, and 13C are a front view, a top plan view, and a side view of a wavelength conversion member 18, respectively.
Figure 13C:
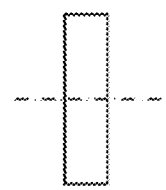
Figure 13B:
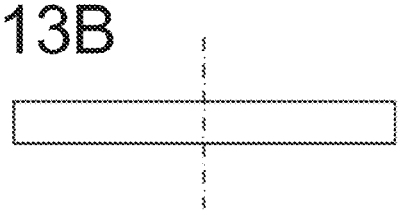

FIGS. 13A, 13B, and 13C are a front view, a top plan view, and a side view of the wavelength conversion member 18, respectively.

The illustrated wavelength conversion member 18 can be configured to be a rectangular plate with a horizontal length of 18 mm and a vertical length of 9 mm. The wavelength conversion member 18 can also be referred to as a phosphor panel.

The wavelength conversion member 18 can be a rectangular plate or laminate configured to receive and convert at least part of the laser light rays, which two-dimensionally scan (in the horizontal and vertical directions) by means of the optical deflectors $201_{Wide}$, $201_{Mid}$, and $201_{Hot}$, to light rays with different wavelength.

As illustrated in FIGS. 7 and 8, the lighting unit 40 can include a phosphor holder 52 which can close the rear end opening of the tubular part 48. The wavelength conversion member 18 can be secured to the phosphor holder 52. Specifically, the phosphor holder 52 can have an opening 52a formed therein and the wavelength conversion member 18 can be secured to the periphery of the opening 52a of the phosphor holder 52 at its outer periphery of the rear surface 18a thereof. The position of the wavelength conversion member 18 can be substantially at the focal point F of the projection lens 20 in a state where the wavelength conversion member 18 covers the opening 52a.

Examples of the wavelength conversion member 18 may include a phosphor plate (or laminate) excited by blue laser to emit yellow light. When the laser light rays $Ray_{Wide}$, $Ray_{Mid}$, and $Ray_{Hot}$ output from the optical fibers $36_{Wide}$, $36_{Mid}$, and $36_{Hot}$ (output end faces thereof) are those in a blue wavelength region, the wavelength conversion member 18 can be excited by the blue laser light rays $Ray_{Wide}$, $Ray_{Mid}$, and $Ray_{Hot}$ to thereby emit yellow light. In other words, the blue laser light rays $Ray_{Wide}$, $Ray_{Mid}$, and $Ray_{Hot}$ can two dimensionally scan the wavelength conversion member 18 (in the horizontal and vertical directions) by means of the optical deflectors $201_{Wide}$, $201_{Mid}$, and $201_{Hot}$, to draw a two-dimensional image corresponding to the partial light distribution patterns $P_{Hi\_Wide}$, $P_{Hi\_Mid}$, and $P_{Hi\_Hot}$ as a white image. The two-dimensional white image (pseudo-white image) can be formed (drawn) by color mixture of the original blue laser light passing through the wavelength conversion member 18 and the yellow light emitted by the wavelength conversion member 18 as a result of excitation by the blue laser light.

As another example of the wavelength conversion member, a phosphor plate (or laminate) excited by near UV laser to emit three primary colored light rays, or red, green, and blue light. When the laser light rays $Ray_{Wide}$, $Ray_{Mid}$, and $Ray_{Hot}$ output from the optical fibers $36_{Wide}$, $36_{Mid}$, and $36_{Hot}$ (output end faces thereof) are those in a near UV wavelength region, the wavelength conversion member 18 can be excited by the near UV laser light rays $Ray_{Wide}$, $Ray_{Mid}$, and $Ray_{Hot}$ to thereby emit red, green, and blue light. In other words, the near UV laser light rays $Ray_{Wide}$, $Ray_{Mid}$, and $Ray_{Hot}$ can two dimensionally scan the wavelength conversion member 18 (in the horizontal and vertical directions) by means of the optical deflectors $201_{Wide}$, $201_{Mid}$, and $201_{Hot}$, to draw a two-dimensional image corresponding to the partial light distribution patterns $P_{Hi\_Wide}$, $P_{Hi\_Mid}$, and $P_{Hi\_Hot}$ as a white image. The two-dimensional white image (pseudo-white image) can be formed (drawn) by color mixture of the red, blue, and green light emitted by the wavelength conversion member 18 as a result of excitation by the near UV laser light.

The laser light rays $Ray_{Wide}$, $Ray_{Mid}$, and $Ray_{Hot}$ output from the optical fibers $36_{Wide}$, $36_{Mid}$, and $36_{Hot}$ (output end faces thereof) can be condensed (or, for example, collimated) by the condenser lens 14 to be incident on the respective mirror parts 202 of the optical deflectors $201_{Wide}$, $201_{Mid}$, and $201_{Hot}$.

The projection lens 20 can be composed of a group of four lenses 20A to 20D that have been aberration-corrected (have been corrected in terms of the field curvature) to provide a planar image formed, as illustrated in FIGS. 7 and 8. The lenses may also be color aberration-corrected. Then, the planar wavelength conversion member 18 can be disposed in alignment with the image plane.

The projection lens 20 composed of a group of plural lenses is not limitative, and may be composed of a single aspheric lens without aberration correction (correction of the field curvature) to form a planar image. In this case, the wavelength conversion member 18 should be a curved one corresponding to the field curvature and disposed along the field curvature.

The focal point F of the projection lens 20 can be located at or near the wavelength conversion member 18. When the projection lens 20 is a group of plural lenses, the projection lens 20 can remove the adverse effect of the aberration on the high-beam light distribution pattern $P_{Hi}$ more than a single convex lens used. With this projection lens 20, the planar wavelength conversion member 18 can be employed. This is advantageous because the planar wavelength conversion member 18 can be produced easier than a curved wavelength conversion member. Furthermore, this is advantageous because the planar wavelength conversion member 18 can facilitate the drawing of a two-dimensional image thereon easier than a curved wavelength conversion member.

The projection lens 20 can project the light intensity distribution formed in the wavelength conversion member 18 (three scanning regions $A_{Wide}$, $A_{Mid}$, and $A_{Hot}$) forward to form the high-beam light distribution pattern $P_{Hi}$ on a virtual vertical screen.

Figure 16A:
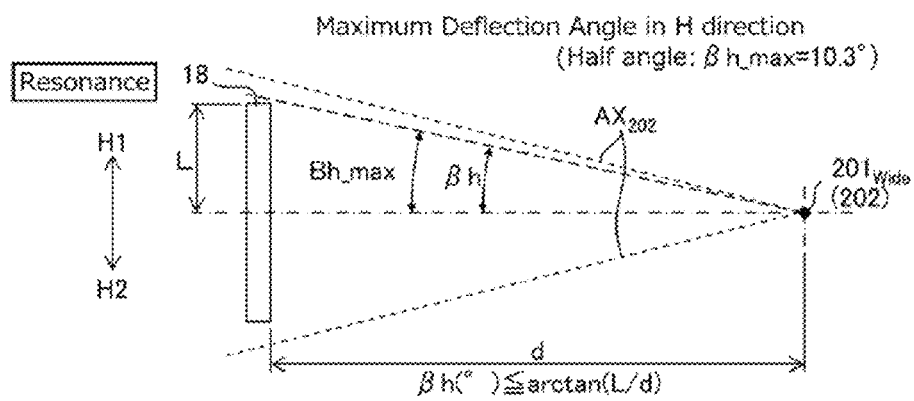
FIG. 16A is a diagram for illustrating the "L" and "βh_max" illustrated in FIG. 15A.
Figure 16B:
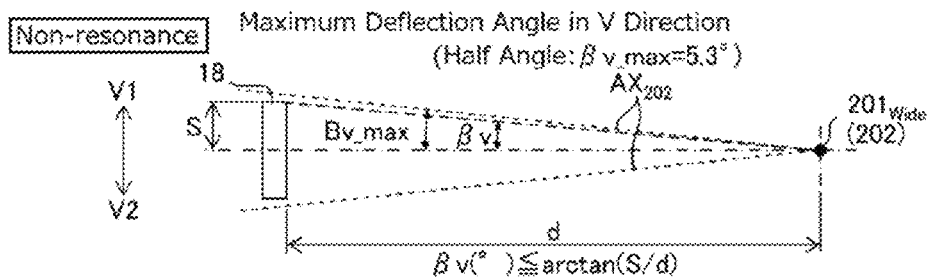
FIG. 16B is a diagram for illustrating the "S," "βv_max," and L illustrated in FIG. 15B.
Figure 17:
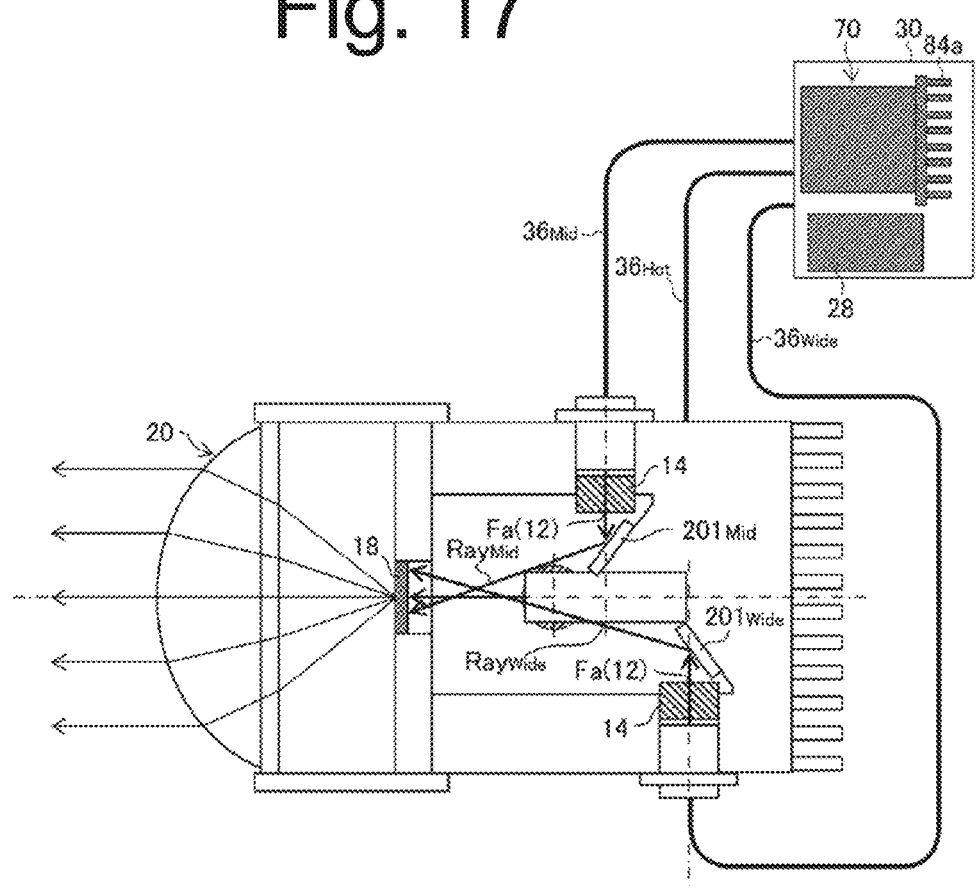
FIG. 17 is a schematic diagram illustrating an example in which the distance between each of the optical deflectors $201_{Wide}$, $201_{Mid}$, and $201_{Hot}$ (the center of the mirror part 202) and the wavelength conversion member 18.

The wavelength conversion member 18 can be disposed to be confined between the center line $AX_{202}$ of the mirror part 202 of the wide-zone optical deflector $201_{Wide}$ at the maximum deflection angle βh_max (see FIG. 16A) and the center line $AX_{202}$ of the mirror part 202 of the wide-zone optical deflector $201_{Wide}$ at the maximum deflection angle βv_max (see FIG. 16B). Specifically, the wavelength conversion member 18 should be disposed to satisfy the following two formulas 1 and 2:

$$\tan(\beta h\_max) \geq L/d \qquad \text{(Formula 1), and}$$

$$\tan(\beta v\_max) \geq S/d \qquad \text{(Formula 1),}$$

wherein L is ½ of a horizontal length of the wavelength conversion member 18, S is ½ of a vertical length of the wavelength conversion member 18, and d is the distance from the wavelength conversion member 18 and the optical deflector 201 (mirror part 202).

A description will next be given of how to adjust the sizes (horizontal length and vertical length) of the scanning regions $A_{Wide}$, $A_{Mid}$, and $A_{Hot}$.

The sizes (horizontal length and vertical length) of the scanning regions $A_{Wide}$, $A_{Mid}$, and $A_{Hot}$ can be adjusted by changing the swinging ranges of the mirror parts 202 of the optical deflectors $201_{Wide}$, $201_{Mid}$, and $201_{Hot}$ around the first axis X1 and the swinging ranges of the mirror parts 202 of the optical deflectors $201_{Wide}$, $201_{Mid}$, and $201_{Hot}$ around the second axis X2. This can be done by changing the first and second AC voltages to be applied to the first piezoelectric actuators 203 and 204 and the third AC voltage to be applied to the second piezoelectric actuators 205 and 206 when the distances between each of the optical deflectors $201_{Wide}$, $201_{Mid}$, and $201_{Hot}$ (the center of the mirror part 202) and the wavelength conversion member 18 are the same (or substantially the same) as each other. (See FIGS. 6 and 7.) The reasons therefore are as follows.

Figure 14A:
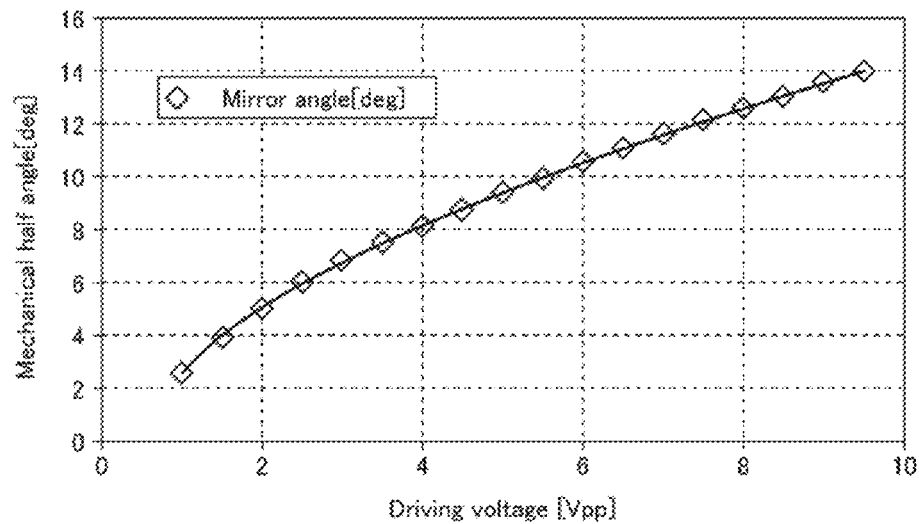
FIG. 14A is a graph showing the relationship between a mechanical swing angle (half angle) of the mirror part 202 around the first axis X1 and the drive voltage to be applied to the first piezoelectric actuator 203 and 204.
Figure 14B:
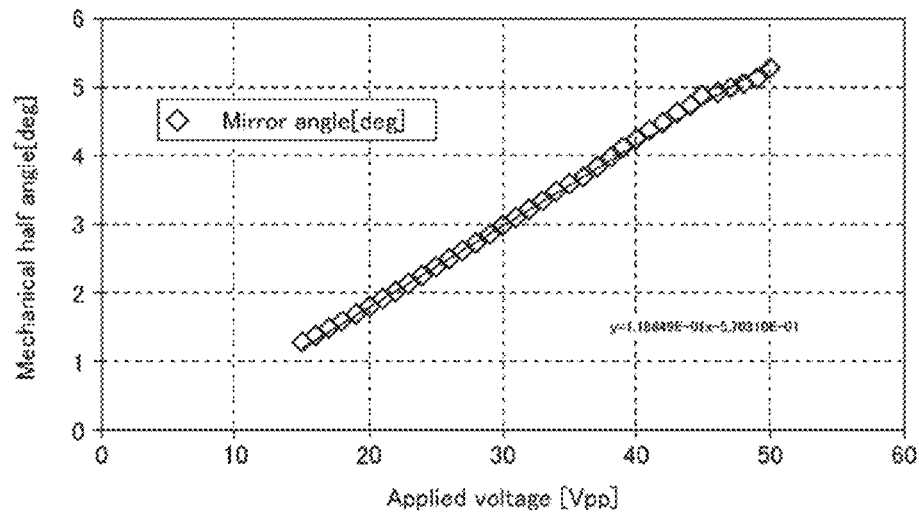
FIG. 14B is a graph showing the relationship between a mechanical swing angle (half angle) of the mirror part 202 around the second axis X2 and the drive voltage to be applied to the second piezoelectric actuators 205 and 206.

Specifically, as illustrated in FIG. 14A, in the optical deflectors $201_{Wide}$, $201_{Mid}$, and $201_{Hot}$, the mechanical swing angle (half angle, see the vertical axis) of the mirror part 202 around the first axis X1 is increased as the drive voltage (see the horizontal axis) to be applied to the first piezoelectric actuators 203 and 204 is increased. Furthermore, as illustrated in FIG. 14B, the mechanical swing angle (half angle, see the vertical axis) of the mirror part 202 around the second axis X2 is increased as the drive voltage (see the horizontal axis) to be applied to the second piezoelectric actuators 205 and 206 is increased.

Thus, when the distances between each of the optical deflectors $201_{Wide}$, $201_{Mid}$, and $201_{Hot}$ (the center of the mirror part 202) and the wavelength conversion member 18 are the same (or substantially the same) as each other (see FIGS. 6 and 7), the sizes (horizontal length and vertical length) of the scanning regions $A_{Wide}$, $A_{Mid}$, and $A_{Hot}$ can be adjusted by changing the first and second AC voltages to be applied to the first piezoelectric actuators 203 and 204 and the third AC voltage to be applied to the second piezoelectric actuators 205 and 206, and thereby changing the swinging ranges of the mirror parts 202 of the optical deflectors $201_{Wide}$, $201_{Mid}$, and $201_{Hot}$ around the first axis X1 and the swinging ranges of the mirror parts 202 of the optical deflectors $201_{Wide}$, $201_{Mid}$, and $201_{Hot}$ around the second axis X2.

Next, a description will be given of a concrete adjustment example. In the following description, it is assumed that the distances between each of the optical deflectors $201_{Wide}$, $201_{Mid}$, and $201_{Hot}$ (the center of the mirror part 202) and the wavelength conversion member 18 are the same (or substantially the same) as each other and d=24.0 mm as illustrated in FIGS. 16A and 16B and the focal distance of the projection lens 20 is 32 mm.

As shown in the row "WIDE" of the table of FIG. 15A, when 5.41 $V_{pp}$ as a drive voltage is applied to the first piezoelectric actuators 203 and 204 of the wide-zone optical deflector $201_{Wide}$, the mechanical swing angle (half angle: γh_max) around the first axis X1 and the maximum deflection angle (half angle: βh_max) are ±9.8 degrees and ±19.7 degrees, respectively. In this case, the size (horizontal length) of the wide-zone scanning region $A_{Wide}$ is adjusted to be ±8.57 mm.

The "L" and "βh_max" described in FIG. 15A represent the distance and the angle shown in FIG. 16A. The "mirror mechanical half angle" (also referred to as "mechanical half angle") described in FIG. 15A means the angle at which the mirror part 202 actually moves, and represents an angle of the mirror part 202 with respect to the normal direction with the sign "+" or "−." The "mirror deflection angle" (also referred to as "optical half angle") means the angle formed between the laser light (light rays) reflected by the mirror part and the normal direction of the mirror part 202, and also represents an angle of the mirror part 202 with respect to the normal direction with the sign "+" or "−." According to the Fresnel's law, the optical half angle is twice the mechanical half angle.

As shown in the row "WIDE" of the table of FIG. 15B, when 41.2 $V_{pp}$ as a drive voltage is applied to the second piezoelectric actuators 205 and 206 of the wide-zone optical deflector $201_{Wide}$, the mechanical swing angle (half angle: γh_max) around the first axis X1 and the maximum deflection angle (half angle: βh_max) are ±4.3 degrees and ±8.6 degrees, respectively. In this case, the size (vertical length) of the wide-zone scanning region $A_{Wide}$ is adjusted to be ±3.65 mm.

The "S" and "βv_max" described in FIG. 15B represent the distance and the angle shown in FIG. 16B, respectively.

As described above, by applying 5.41 $V_{pp}$ as a drive voltage (the first and second AC voltages) to the first piezoelectric actuators 203 and 204 of the wide-zone optical deflector $201_{Wide}$, and applying 41.2 $V_{pp}$ as a drive voltage (the third AC voltage) to the second piezoelectric actuators 205 and 206 of the wide-zone optical deflector $201_{Wide}$, and thereby changing the swinging range of the mirror part 202 of the wide-zone optical deflector $201_{Wide}$ around the first axis X1 and the swinging range of the mirror part 202 of the wide-zone optical deflector $201_{Wide}$ around the second axis X2, the size (horizontal length) of the wide-zone scanning region $A_{Wide}$ can be adjusted to be ±8.57 mm and the size (vertical length) of the wide-zone scanning region $A_{Wide}$ can be adjusted to be ±3.65 mm to form a rectangular shape with the horizontal length of ±8.57 mm and the vertical length of ±3.65 mm.

The light intensity distribution formed in the wide-zone scanning region $A_{Wide}$ with the above-described dimensions can be projected forward through the projection lens 20 to thereby form the wide-zone partial light distribution pattern $P_{Hi\_Wide}$ with a rectangle of the width of ±15 degrees in the horizontal direction and the width of ±6.5 degrees in the vertical direction on the virtual vertical screen.

As shown in the row "MID" of the table of FIG. 15A, when 2.31 $V_{pp}$ as a drive voltage is applied to the first piezoelectric actuators 203 and 204 of the middle-zone optical deflector $201_{Mid}$, the mechanical swing angle (half angle: γh_max) around the first axis X1 and the maximum deflection angle (half angle: βh_max) are ±5.3 degrees and ±11.3 degrees, respectively. In this case, the size (horizontal length) of the middle-zone scanning region $A_{Mid}$ is adjusted to be ±4.78 mm.

As shown in the row "WIDE" of the table of FIG. 15B, when 24.4 $V_{pp}$ as a drive voltage is applied to the second piezoelectric actuators 205 and 206 of the middle-zone optical deflector $201_{Mid}$, the mechanical swing angle (half angle: γh_max) around the first axis X1 and the maximum deflection angle (half angle: βh_max) are ±2.3 degrees and ±4.7 degrees, respectively. In this case, the size (vertical length) of the middle-zone scanning region $A_{Mid}$ is adjusted to be ±1.96 mm.

As described above, by applying 2.31 $V_{pp}$ as a drive voltage (the first and second AC voltages) to the first piezoelectric actuators 203 and 204 of the middle-zone optical deflector $201_{Mid}$, and applying 24.4 $V_{pp}$ as a drive voltage (the third AC voltage) to the second piezoelectric actuators 205 and 206 of the middle-zone optical deflector $201_{Mid}$, and thereby changing the swinging range of the mirror part 202 of the middle-zone optical deflector $201_{Mid}$ around the first axis X1 and the swinging range of the mirror part 202 of the middle-zone optical deflector $201_{Mid}$ around the second axis X2, the size (horizontal length) of the middle-zone scanning region $A_{Mid}$ can be adjusted to be ±4.78 mm and the size (vertical length) of the middle-zone scanning region $A_{Mid}$ can be adjusted to be ±1.96 mm to form a rectangular shape with the horizontal length of ±4.78 mm and the vertical length of ±1.96 mm.

The light intensity distribution formed in the middle-zone scanning region $A_{Mid}$ with the above-described dimensions can be projected forward through the projection lens 20 to thereby form the middle-zone partial light distribution pattern $P_{Hi\_Mid}$ with a rectangle of the width of ±8.5 degrees in the horizontal direction and the width of ±3.5 degrees in the vertical direction on the virtual vertical screen.

As shown in the row "HOT" of the table of FIG. 15A, when 0.93 $V_{pp}$ as a drive voltage is applied to the first piezoelectric actuators 203 and 204 of the hot-zone optical deflector $201_{Hot}$, the mechanical swing angle (half angle: γh_max) around the first axis X1 and the maximum deflection angle (half angle: βh_max) are ±2.3 degrees and ±4.7 degrees, respectively. In this case, the size (horizontal length) of the hot-zone scanning region $A_{Hot}$ is adjusted to be ±1.96 mm.

As shown in the row "HOT" of the table of FIG. 15B, when 13.3 $V_{pp}$ as a drive voltage is applied to the second piezoelectric actuators 205 and 206 of the hot-zone optical deflector $201_{Hot}$, the mechanical swing angle (half angle: γh_max) around the first axis X1 and the maximum deflection angle (half angle: βh_max) are ±1.0 degrees and ±2.0 degrees, respectively. In this case, the size (vertical length) of the hot-zone scanning region $A_{Hot}$ is adjusted to be ±0.84 mm.

As described above, by applying 0.93 $V_{pp}$ as a drive voltage (the first and second AC voltages) to the first piezoelectric actuators 203 and 204 of the hot-zone optical deflector $201_{Hot}$, and applying 13.3 $V_{pp}$ as a drive voltage (the third AC voltage) to the second piezoelectric actuators 205 and 206 of the hot-zone optical deflector $201_{Hot}$, and thereby changing the swinging range of the mirror part 202 of the hot-zone optical deflector $201_{Hot}$ around the first axis X1 and the swinging range of the mirror part 202 of the hot-zone optical deflector $201_{Hot}$ around the second axis X2, the size (horizontal length) of the hot-zone scanning region $A_{Hot}$ can be adjusted to be ±1.96 mm and the size (vertical length) of the hot-zone scanning region $A_{Hot}$ can be adjusted to be ±0.84 mm to form a rectangular shape with the horizontal length of ±1.96 mm and the vertical length of ±0.84 mm.

The light intensity distribution formed in the hot-zone scanning region $A_{Hot}$ with the above-described dimensions can be projected forward through the projection lens 20 to thereby form the hot-zone partial light distribution pattern $P_{Hi\_Hot}$ with a rectangle of the width of ±3.5 degrees in the horizontal direction and the width of ±1.5 degrees in the vertical direction on the virtual vertical screen.

Thus, when the distances between each of the optical deflectors $201_{Wide}$, $201_{Mid}$, and $201_{Hot}$ (the center of the mirror part 202) and the wavelength conversion member 18 are the same (or substantially the same) as each other (see FIGS. 6 and 7), the sizes (horizontal length and vertical length) of the scanning regions $A_{Wide}$, $A_{Mid}$, and $A_{Hot}$ can be adjusted by changing the first and second AC voltages to be applied to the first piezoelectric actuators 203 and 204 and the third AC voltage to be applied to the second piezoelectric actuators 205 and 206, and thereby changing the swinging ranges of the mirror parts 202 of the optical deflectors 201$_{Wide}$, 201$_{Mid}$, and 201$_{Hot}$ around the first axis X1 and the swinging ranges of the mirror parts 202 of the optical deflectors 201$_{Wide}$, 201$_{Mid}$, and 201$_{Hot}$ around the second axis X2.

A description will next be given of another technique of adjusting the sizes (horizontal length and vertical length) of the scanning regions A$_{Wide}$, A$_{Mid}$, and A$_{Hot}$.

When the drive voltages to be applied to the respective optical deflectors 201$_{Wide}$, 201$_{Mid}$, and 201$_{Hot}$ are the same (or substantially the same) as each other, the sizes (horizontal length and vertical length) of the scanning regions A$_{Wide}$, A$_{Mid}$, and A$_{Hot}$ can be adjusted by changing the distances between each of the optical deflectors 201$_{Wide}$, 201$_{Mid}$, and 201$_{Hot}$ (the center of the mirror part 202) and the wavelength conversion member 18.

Next, a description will be given of a concrete adjustment example. In the following description, it is assumed that the drive voltages to be applied to the respective optical deflectors 201$_{Wide}$, 201$_{Mid}$, and 201$_{Hot}$ are the same as each other and the focal distance of the projection lens 20 is 32 mm.

For example, as shown in the row "WIDE" of the table of FIG. 18A, when the distance between the wide-zone optical deflector 201$_{Wide}$ (the center of the mirror part 202) and the wavelength conversion member 18 is set to 24.0 mm and 5.41 V$_{pp}$ as a drive voltage is applied to the first piezoelectric actuators 203 and 204 of the wide-zone optical deflector 201$_{Wide}$, the mechanical swing angle (half angle: γh_max) around the first axis X1 and the maximum deflection angle (half angle: βh_max) are ±9.8 degrees and ±19.7 degrees, respectively. In this case, the size (horizontal length) of the wide-zone scanning region A$_{Wide}$ is adjusted to be ±8.57 mm.

The "L" and "d," and "βh_max" described in FIG. 18A represent the distance and the angle shown in FIG. 16A, respectively.

Then, as shown in the row "WIDE" of the table of FIG. 18B, when the distance between the wide-zone optical deflector 201$_{Wide}$ (the center of the mirror part 202) and the wavelength conversion member 18 is set to 24.0 mm and 41.2 V$_{pp}$ as a drive voltage is applied to the second piezoelectric actuators 205 and 206 of the wide-zone optical deflector 201$_{Wide}$, the mechanical swing angle (half angle: γh_max) around the first axis X1 and the maximum deflection angle (half angle: βh_max) are ±4.3 degrees and ±8.6 degrees, respectively. In this case, the size (vertical length) of the wide-zone scanning region A$_{Wide}$ is adjusted to be ±3.65 mm.

The "S" and "d," and "βv_max" described in FIG. 18B represent the distance and the angle shown in FIG. 16B, respectively.

As described above, by setting the distance between the wide-zone optical deflector 201$_{Wide}$ (the center of the mirror part 202) and the wavelength conversion member 18 to 24.0 mm, the size (horizontal length) of the wide-zone scanning region A$_{Wide}$ can be adjusted to be ±8.57 mm and the size (vertical length) of the wide-zone scanning region A$_{Wide}$ can be adjusted to be ±3.65 mm to form a rectangular shape with the horizontal length of ±8.57 mm and the vertical length of ±3.65 mm.

The light intensity distribution formed in the wide-zone scanning region A$_{Wide}$ with the above-described dimensions can be projected forward through the projection lens 20 to thereby form the wide-zone partial light distribution pattern P$_{Hi\_Wide}$ with a rectangle of the width of ±15 degrees in the horizontal direction and the width of ±6.5 degrees in the vertical direction on the virtual vertical screen.

Next, as shown in the row "MID" of the table of FIG. 18A, when the distance between the middle-zone optical deflector 201$_{Mid}$ (the center of the mirror part 202) and the wavelength conversion member 18 is set to 13.4 mm and 5.41 V$_{pp}$ as a drive voltage is applied to the first piezoelectric actuators 203 and 204 of the middle-zone optical deflector 201$_{Mid}$ as in the wide-zone optical deflector 201$_{Wide}$, the mechanical swing angle (half angle: γh_max) around the first axis X1 and the maximum deflection angle (half angle: βh_max) are ±9.8 degrees and ±19.7 degrees, respectively, as in the wide-zone optical deflector 201$_{Wide}$. However, the distance (13.4 mm) between the middle-zone optical deflector 201$_{Mid}$ (the center of the mirror part 202) and the wavelength conversion member 18 is set to be shorter than the distance (24.0 mm) between the wide-zone optical deflector 201$_{Wide}$ (the center of the mirror part 202) and the wavelength conversion member 18. Thus, the size (horizontal length) of the middle-zone scanning region A$_{Mid}$ is adjusted to be ±4.78 mm.

Then, as shown in the row "MID" of the table of FIG. 18B, when the distance between the middle-zone optical deflector 201$_{Mid}$ (the center of the mirror part 202) and the wavelength conversion member 18 is set to 13.4 mm and 41.2 V$_{pp}$ as a drive voltage is applied to the second piezoelectric actuators 205 and 206 of the middle-zone optical deflector 201$_{Mid}$ as in the wide-zone optical deflector 201$_{Wide}$, the mechanical swing angle (half angle: γh_max) around the first axis X1 and the maximum deflection angle (half angle: βh_max) are ±4.3 degrees and ±8.6 degrees, respectively, as in the wide-zone optical deflector 201$_{Wide}$. However, the distance (13.4 mm) between the middle-zone optical deflector 201$_{Mid}$ (the center of the mirror part 202) and the wavelength conversion member 18 is set to be shorter than the distance (24.0 mm) between the wide-zone optical deflector 201$_{Wide}$ (the center of the mirror part 202) and the wavelength conversion member 18. Thus, the size (vertical length) of the middle-zone scanning region A$_{Mid}$ is adjusted to be ±1.96 mm.

As described above, by setting the distance between the middle-zone optical deflector 201$_{Mid}$ (the center of the mirror part 202) and the wavelength conversion member 18 to 13.4 mm, the size (horizontal length) of the middle-zone scanning region A$_{Mid}$ can be adjusted to be ±4.78 mm and the size (vertical length) of the middle-zone scanning region A$_{Mid}$ can be adjusted to be ±1.96 mm to form a rectangular shape with the horizontal length of ±4.78 mm and the vertical length of ±1.96 mm.

The light intensity distribution formed in the middle-zone scanning region A$_{Mid}$ with the above-described dimensions can be projected forward through the projection lens 20 to thereby form the middle-zone partial light distribution pattern P$_{Hi\_Mid}$ with a rectangle of the width of ±8.5 degrees in the horizontal direction and the width of ±3.6 degrees in the vertical direction on the virtual vertical screen.

Next, as shown in the row "HOT" of the table of FIG. 18A, when the distance between the hot-zone optical deflector 201$_{Hot}$ (the center of the mirror part 202) and the wavelength conversion member 18 is set to 5.5 mm and 5.41 V$_{pp}$ as a drive voltage is applied to the first piezoelectric actuators 203 and 204 of the hot-zone optical deflector 201$_{Hot}$ as in the wide-zone optical deflector 201$_{Wide}$, the mechanical swing angle (half angle: γh_max) around the first axis X1 and the maximum deflection angle (half angle: βh_max) are ±9.8 degrees and ±19.7 degrees, respectively, as in the wide-zone optical deflector 201$_{Wide}$. However, the distance (5.5 mm) between the hot-zone optical deflector 201$_{Hot}$ (the center of the mirror part 202) and the wavelength conversion member 18 is set to be shorter than the distance (13.4 mm) between the middle-zone optical deflector $201_{Mid}$ (the center of the mirror part 202) and the wavelength conversion member 18. Thus, the size (horizontal length) of the hot-zone scanning region $A_{Hot}$ is adjusted to be ±1.96 mm.

Then, as shown in the row "HOT" of the table of FIG. 18B, when the distance between the hot-zone optical deflector $201_{Hot}$ (the center of the mirror part 202) and the wavelength conversion member 18 is set to 5.5 mm and 41.2 $V_{pp}$ as a drive voltage is applied to the second piezoelectric actuators 205 and 206 of the hot-zone optical deflector $201_{Hot}$ as in the wide-zone optical deflector $201_{Wide}$, the mechanical swing angle (half angle: γh_max) around the first axis X1 and the maximum deflection angle (half angle: βh_max) are ±4.3 degrees and ±8.6 degrees, respectively, as in the wide-zone optical deflector $201_{Wide}$. However, the distance (5.5 mm) between the hot-zone optical deflector $201_{Hot}$ (the center of the mirror part 202) and the wavelength conversion member 18 is set to be shorter than the distance (13.4 mm) between the middle-zone optical deflector $201_{Mid}$ (the center of the mirror part 202) and the wavelength conversion member 18. Thus, the size (vertical length) of the hot-zone scanning region $A_{Hot}$ is adjusted to be ±0.84 mm.

As described above, by setting the distance between the hot-zone optical deflector $201_{Hot}$ (the center of the mirror part 202) and the wavelength conversion member 18 to 5.5 mm, the size (horizontal length) of the hot-zone scanning region $A_{Hot}$ can be adjusted to be ±1.96 mm and the size (vertical length) of the hot-zone scanning region $A_{Hot}$ can be adjusted to be ±0.84 mm to form a rectangular shape with the horizontal length of ±1.96 mm and the vertical length of ±0.84 mm.

The light intensity distribution formed in the hot-zone scanning region $A_{Hot}$ with the above-described dimensions can be projected forward through the projection lens 20 to thereby form the hot-zone partial light distribution pattern $P_{Hi\_Hot}$ with a rectangle of the width of ±3.5 degrees in the horizontal direction and the width of ±1.5 degrees in the vertical direction on the virtual vertical screen.

As described above, when the drive voltages to be applied to the respective optical deflectors $201_{Wide}$, $201_{Mid}$, and $201_{Hot}$ are the same (or substantially the same) as each other, the sizes (horizontal length and vertical length) of the scanning regions $A_{Wide}$, $A_{Mid}$, and $A_{Hot}$ can be adjusted by changing the distances between each of the optical deflectors $201_{Wide}$, $201_{Mid}$, and $201_{Hot}$ (the center of the mirror part 202) and the wavelength conversion member 18.

When the first and second AC voltages to be applied to the respective optical deflectors $201_{Wide}$, $201_{Mid}$, and $201_{Hot}$ are feedback-controlled, the drive voltages applied to the respective optical deflectors $201_{Wide}$, $201_{Mid}$, and $201_{Hot}$ are not completely the same. Even in this case, the sizes (horizontal length and vertical length) of the scanning regions $A_{Wide}$, $A_{Mid}$, and $A_{Hot}$ can be adjusted by changing the distance between each of the optical deflectors $201_{Wide}$, $201_{Mid}$, and $201_{Hot}$ (the center of each of the mirror parts 202) and the wavelength conversion member 18.

A description will next be given of still another technique of adjusting the sizes (horizontal length and vertical length) of the scanning regions $A_{Wide}$, $A_{Mid}$, and $A_{Hot}$.

Figure 19:
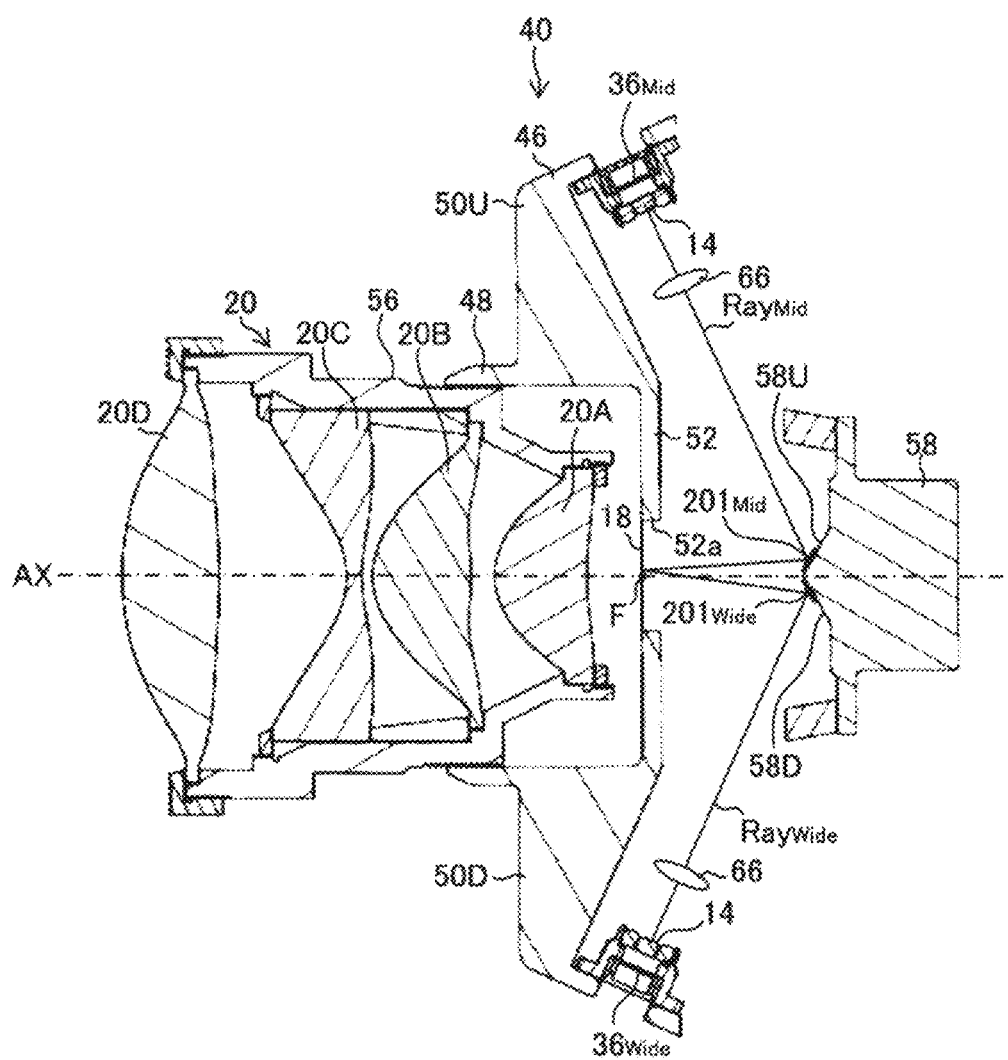
FIG. 19 is a longitudinal cross-sectional view illustrating a modified example of the lighting unit 40.

It is conceivable that the sizes (horizontal length and vertical length) of the scanning regions $A_{Wide}$, $A_{Mid}$, and $A_{Hot}$ can be adjusted by disposing a lens 66 between each of the optical fibers $36_{Wide}$, $36_{Mid}$, and $36_{Hot}$ (output end) and each of the optical deflectors $201_{Wide}$, $201_{Mid}$, and $201_{Hot}$ (between each of the optical deflectors $201_{Wide}$, $201_{Mid}$, and $201_{Hot}$ and the wavelength conversion member 18), as illustrated in FIG. 19. The lens 66 may be a lens having a different focal distance.

Figure 20A:
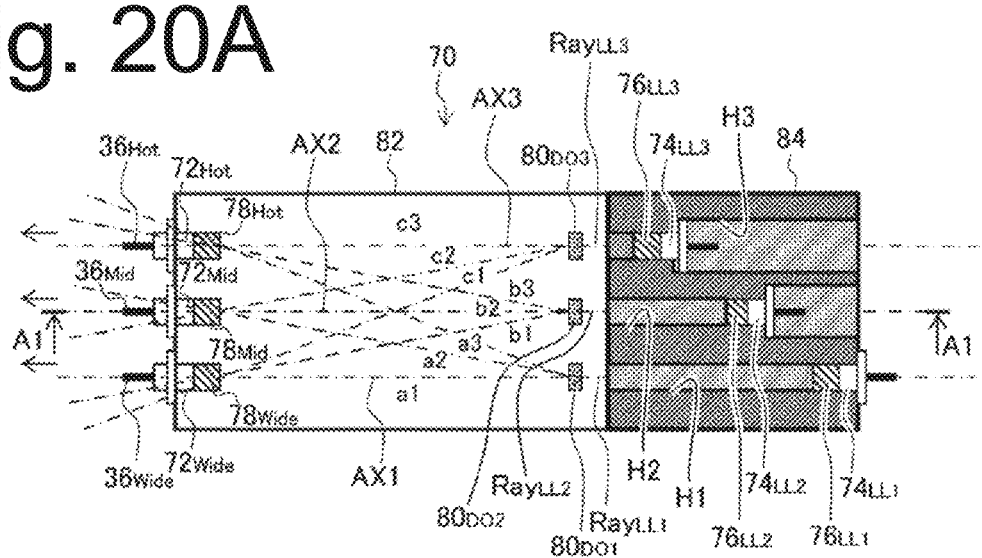
FIG. 20A is a schematic longitudinal cross-sectional view illustrating a coupler/distributer 70.
Figure 20B:
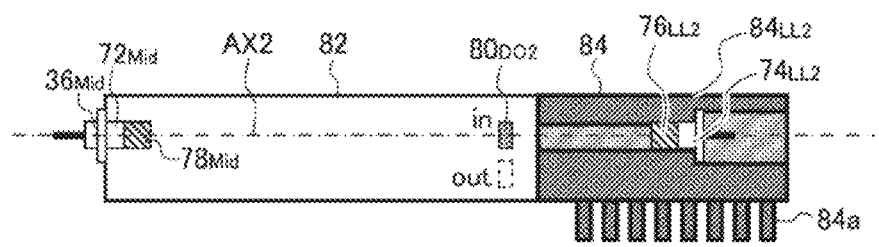
FIG. 20B is a cross-sectional view of the coupler/distributer 70 of FIG. 20A taken along line A1-A1.

FIG. 20A is a schematic longitudinal cross-sectional view illustrating a coupler/distributer 70, and FIG. 20B is a cross-sectional view of the coupler/distributer 70 of FIG. 20A taken along line A1-A1.

As illustrated in FIGS. 20A and 20B, the coupler/distributer 70 can include optical fiber attaching parts $72_{Wide}$, $72_{Mid}$, and $72_{Hot}$ to which the optical fibers $36_{Wide}$, $36_{Mid}$, and $36_{Hot}$ (input ends thereof) are attached respectively, first to third laser light sources $74_{LL1}$, $74_{LL2}$, and $74_{LL3}$, first to third collimating lenses $76_{LL1}$, $76_{LL2}$, and $76_{LL3}$, first to third condenser lenses $78_{Wide}$, $78_{Mid}$, and $78_{Hot}$, a plurality of diffraction optical elements $80_{DO1}$, $80_{DO2}$, and $80_{DO3}$, an actuator (not illustrated), a casing 82, a casing heat dissipation part 84 including a heat dissipation plate 84a (heat dissipation fin), etc.

The first to third laser light sources $74_{LL1}$, $74_{LL2}$, and $74_{LL3}$ correspond to the "N laser light sources provided corresponding to the respective N optical fibers" as defined in the presently disclosed subject matter. The plurality of diffraction optical elements $80_{DO1}$, $80_{DO2}$, and $80_{DO3}$ correspond to the "plurality of diffractive optical elements provided corresponding to the respective N laser light sources" as defined in the presently disclosed subject matter. The example illustrated in FIG. 20A is a case where N is 3 (three), which is not limitative and N may be a natural number of 3 or more.

The optical fiber attaching parts $72_{Wide}$, $72_{Mid}$, and $72_{Hot}$ can be secured to the front face of the casing 82. The first to third condenser lenses $78_{Wide}$, $78_{Mid}$, and $78_{Hot}$ can be disposed close to and behind the optical fiber attaching parts $72_{Wide}$, $72_{Mid}$, and $72_{Hot}$.

The casing heat dissipation part 84 including a heat dissipation plate 84a can be attached to the rear face of the casing 82, and the first to third laser light sources $74_{LL1}$, $74_{LL2}$, and $74_{LL3}$ and the first to third collimating lenses $76_{LL1}$, $76_{LL2}$, and $76_{LL3}$, can be secured to the casing heat dissipation part 84. Specifically, the casing heat dissipation part 84 can include first to third through holes H1, H2, and H3 formed and extending in a first reference axis AX1, in a second reference axis AX2, and in a third reference axis AX3, respectively. The first laser light source $74_{LL1}$ and the first collimating lens $76_{LL1}$ can be secured to the casing heat dissipation part 84 while being inserted into the first through hole H1 formed in the casing heat dissipation part 84 and extending in the first reference axis AX1. Similarly, the second laser light source $74_{LL2}$ and the second collimating lens $76_{LL2}$ can be secured to the casing heat dissipation part 84 while being inserted into the second through hole H2 formed the casing heat dissipation part 84 and extending in the second reference axis AX2. Also the third laser light source $74_{LL3}$ and the third collimating lens $76_{LL3}$ can be secured to the casing heat dissipation part 84 while being inserted into the third through hole H3 formed in the casing heat dissipation part 84 and extending in the third reference axis AX3.

The first to third laser light sources $74_{LL1}$, $74_{LL2}$, and $74_{LL3}$ can include semiconductor lasers $LD_{LL1}$, $LD_{LL2}$, and $LD_{LOL3}$ housed in a cap, and LD output monitors $PD_{LL1}$, $PD_{LL2}$, and $PD_{LOL3}$, such as monitoring photodiodes and the like.

Figure 21:
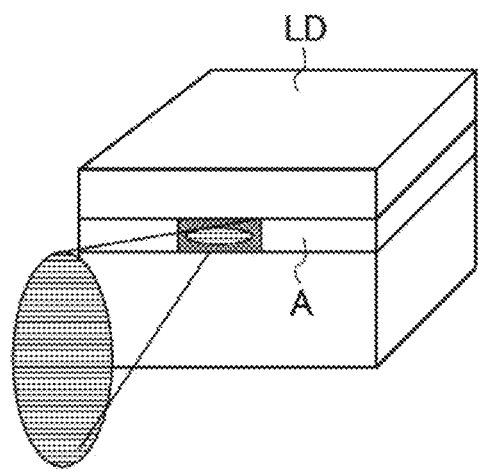
FIG. 21 is a schematic perspective view illustrating a semiconductor laser LD ($LD_{LL1}$, $LD_{LL2}$, and $LD_{LL3}$)

FIG. 21 is a schematic perspective view of a semiconductor laser LD ($LD_{LL1}$, $LD_{LL2}$, and $LD_{LOL3}$).

As illustrated in FIG. 20, the semiconductor laser LD can be a semiconductor light-emitting element, such as a laser diode, configured to emit laser light (linearly polarized light) in an TE mode in which the electric field component is parallel to the junction plane A (active region). Although the semiconductor laser can emit laser light in a TM mode in which the electric field component is perpendicular to the junction plane A (active region), it can dominantly emit laser light in a TE mode with larger gain. The emission wavelength of such a semiconductor laser LD may fall within a blue region, and can be, for example, 450 nm. Also, the emission wavelength of such a semiconductor laser LD may fall within a near UV region, and can be, for example, 405 nm.

The laser light sources $74_{LL1}$, $74_{LL2}$, and $74_{LL3}$ can be arranged in a dispersed state along the reference axes AX1 to AX3, respectively, as illustrated in FIG. 20A. This arrangement can improve the heat dissipation property when compared with a case where laser light sources are arranged in line in a dense manner.

The first diffraction optical element $80_{DO1}$ can include a plurality of diffraction optical elements $80_{DO1-1}$ to $80_{DO1-3}$.

Figure 22A:
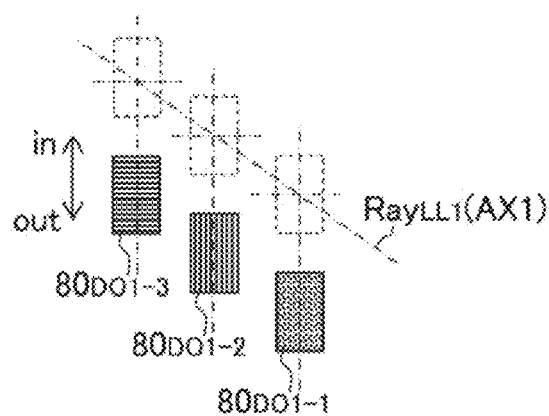
FIG. 22A is a schematic diagram illustrating an example of diffractive optical elements $80_{DO1-1}$ to $80_{DO1-3}$.
Figure 22B:
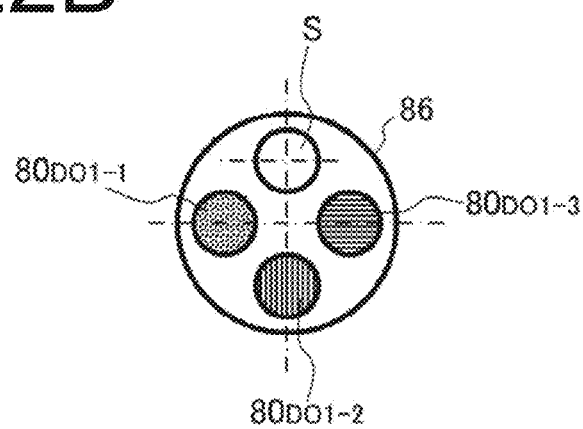
FIG. 22B is a schematic diagram illustrating another example of diffractive optical elements $80_{DO1-1}$ to $80_{DO1-3}$.

The respective diffraction optical elements $80_{DO1-1}$ to $80_{DO1-3}$ can be arranged along the optical path (or the reference axis AX1) of the laser light rays $Ray_{LL1}$ emitted from the first laser light source $74_{LL1}$ and collimated by the first collimating lens $76_{LL1}$ as illustrated in FIG. 22A. Or as illustrated in FIG. 22B, they can be arranged circularly while they are secured to a rotary plate 86, although the arrangement of these elements is not limited to a particular one. In FIG. 22B, the portion denoted by S may be a circular opening without any element or may be omitted.

The respective diffraction optical elements $80_{DO1-1}$ to $80_{DO1-3}$ can be moved by a not-illustrated actuator, such as a solenoid, to be disposed in the optical path of the laser light rays $Ray_{LL1}$ emitted from the first laser light source $74_{LL1}$ and collimated by the first collimating lens $76_{LL1}$ or outside of the optical path.

When the respective diffraction optical elements $80_{DO1}$ to $80_{DO3}$ are secured to the rotary plate 86, the rotary plate 86 can be rotated and stopped by a not-illustrated actuator, such as a solenoid, so that the respective diffraction optical elements $80_{DO1}$ to $80_{DO3}$ are disposed in the optical path of the laser light rays $Ray_{LL1}$ emitted from the first laser light source $74_{LL1}$ and collimated by the first collimating lens $76_{LL1}$ or outside of the optical path.

Figure 23:
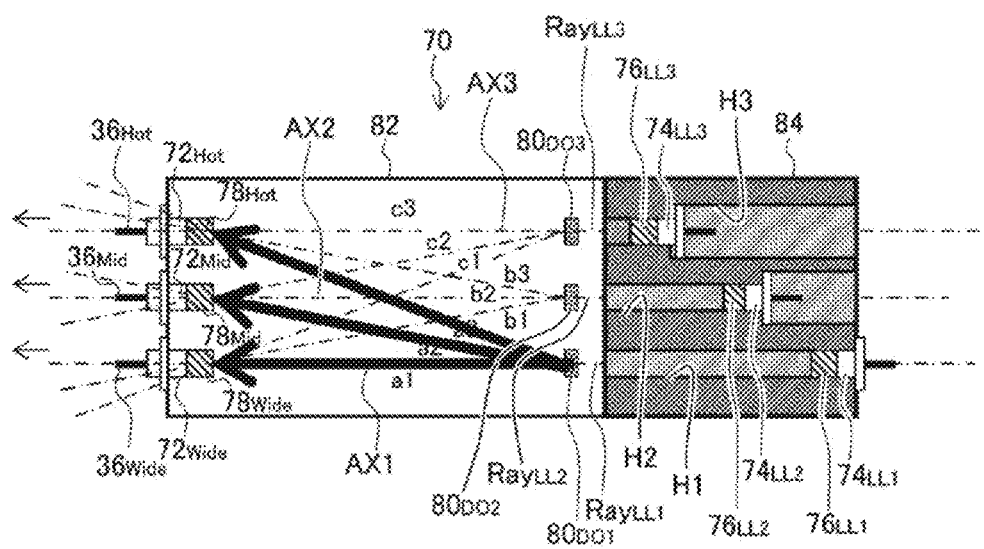
FIG. 23 is a schematic diagram illustrating the state in which laser light rays $Ray_{LL1}$ is dispersed by diffraction at the diffractive optical element $80_{DO1}$ ($80_{DO1-1}$ to $80_{DO1-3}$)

When the respective diffraction optical elements $80_{DO1}$ to $80_{DO3}$ are disposed in the optical path of the laser light rays $Ray_{LL1}$ emitted from the first laser light source $74_{LL1}$ and collimated by the first collimating lens $76_{LL1}$, as illustrated in FIG. 23, they can deflect the laser light rays $Ray_{LL1}$ and direct them to the input end faces of the optical fibers $36_{Wide}$, $36_{Mid}$, and $36_{Hot}$ (strictly speaking, the first to third condenser lenses $78_{Wide}$, $78_{Mid}$, and $78_{Hot}$) at respective different ratios (disperse ratio) due to the diffraction. In order to achieve this configuration, the respective diffraction optical elements $80_{DO1-1}$ to $80_{DO1-3}$ can be configured by a holographic optical element (HOE). In another exemplary embodiment, they can be configured by a blazed diffractive optical element (DOE).

Specifically, they can be configured as follows.

The diffraction optical element $80_{DO1-1}$ can be configured as a holographic optical element that is configured to deflect the laser light rays $Ray_{LL1}$ emitted from the first laser light source $74_{LL1}$ and collimated by the first collimating lens $76_{LL1}$ and direct them to the respective input end faces of the optical fibers $36_{Wide}$, $36_{Mid}$, and $36_{Hot}$ (strictly speaking, the respective first to third condenser lenses $78_{Wide}$, $78_{Mid}$, and $78_{Hot}$) at a ratio of 1/3:1/3:1/3 (disperse ratio) due to the diffraction.

Figure 24:
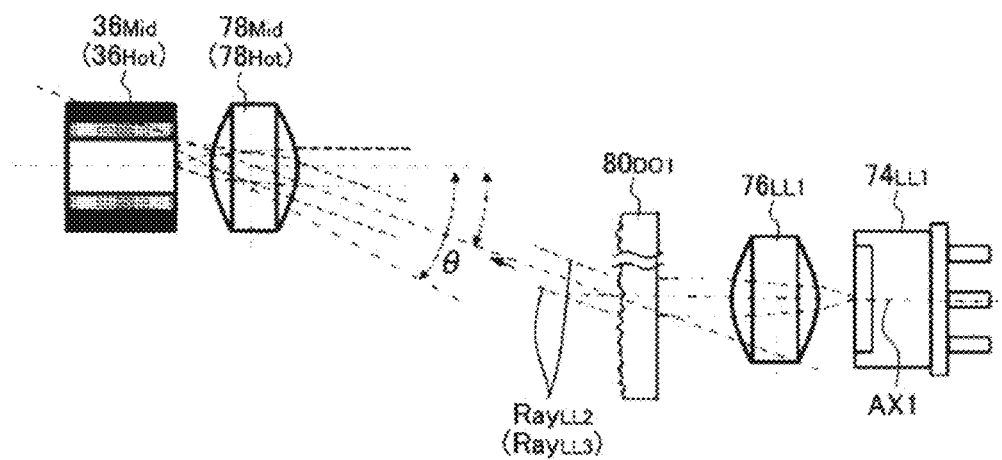
FIG. 24 is a schematic diagram illustrating the relationship among optical fibers $36_{Mid}$ and $36_{Hot}$, diffractive optical element $80_{DO1}$, laser light source $74_{LL1}$, etc.
Figure 25:
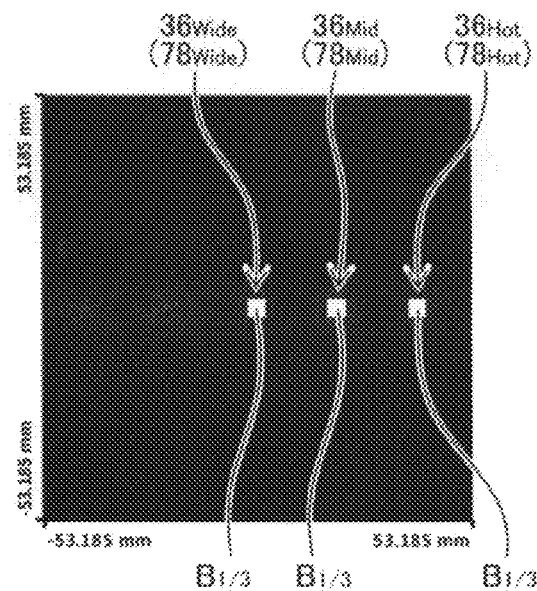
FIG. 25 is a diagram illustrating an example of shining light $B_{1/3}$, $B_{1/3}$, and $B_{1/3}$ formed (reproduced) by diffraction by means of the diffractive optical element $80_{DO1}$ ($80_{DO1-1}$ to $80_{DO1-3}$)

Specifically, the diffraction optical element $80_{DO1-1}$ can be configured as a holographic optical element that is configured to, when the laser light rays $Ray_{LL1}$ emitted from the first laser light source $74_{LL1}$ and collimated by the first collimating lens $76_{LL1}$ is used as a reference light ray, direct the reproduced light rays to ranges of respective light receiving angles θ (effective lens incident angle) of the respective first to third condenser lenses $78_{Wide}$, $78_{Mid}$, and $78_{Hot}$ at a ratio of 1/3:1/3:1/3 (disperse ratio) (see FIG. 24) and reproduce shining light $B_{1/3}$, $B_{1/3}$, and $B_{1/3}$, as illustrated in FIG. 25.

The diffraction optical element $80_{DO1-2}$ can be configured as a holographic optical element that is configured to deflect the laser light rays $Ray_{LL1}$ emitted from the first laser light source $74_{LL1}$ and collimated by the first collimating lens $76_{LL1}$ and direct them to the respective input end faces of the optical fibers $36_{Wide}$, $36_{Mid}$, and $36_{Hot}$ (strictly speaking, the respective first to third condenser lenses $78_{Wide}$, $78_{Mid}$, and $78_{Hot}$) at a ratio of 1/2:1/4:1/4 (disperse ratio) due to the diffraction. The diffraction optical element $80_{DO1-2}$ can have the same configuration as that of the diffraction optical element $80_{DO1-1}$ except for the disperse ratio.

Specifically, the diffraction optical element $80_{DO1-2}$ can be configured as a holographic optical element that is configured to, when the laser light rays $Ray_{LL1}$ emitted from the first laser light source $74_{LL1}$ and collimated by the first collimating lens $76_{LL1}$ is used as a reference light ray, direct the reproduced light rays to ranges of respective light receiving angles θ (effective lens incident angle) of the respective first to third condenser lenses $78_{Wide}$, $78_{Mid}$, and $78_{Hot}$ at a ratio of 1/2:1/4:1/4 (disperse ratio) (see FIG. 24) and reproduce shining light $B_{1/2}$, $B_{1/4}$, and $B_{1/4}$, as illustrated in FIG. 25.

The diffraction optical element $80_{DO1-3}$ can be configured as a holographic optical element that is configured to deflect the laser light rays $Ray_{LL1}$ emitted from the first laser light source $74_{LL1}$ and collimated by the first collimating lens $76_{LL1}$ and direct them to the respective input end faces of the optical fibers $36_{Wide}$, $36_{Mid}$, and $36_{Hot}$ (strictly speaking, the respective first to third condenser lenses $78_{Wide}$, $78_{Mid}$, and $78_{Hot}$) at a ratio of 1/4:1/4:1/2 (disperse ratio) due to the diffraction. The diffraction optical element $80_{DO1-3}$ can have the same configuration as that of the diffraction optical element $80_{DO1-1}$ except for the disperse ratio.

Specifically, the diffraction optical element $80_{DO1-3}$ can be configured as a holographic optical element that is configured to, when the laser light rays $Ray_{LL1}$ emitted from the first laser light source $74_{LL1}$ and collimated by the first collimating lens $76_{LL1}$ is used as a reference light ray, direct the reproduced light rays to ranges of respective light receiving angles θ (effective lens incident angle) of the respective first to third condenser lenses $78_{Wide}$, $78_{Mid}$, and $78_{Hot}$ at a ratio of 1/4:1/4:1/2 (disperse ratio) (see FIG. 24) and reproduce shining light $B_{1/4}$, $B_{1/4}$, and $B_{1/2}$, as illustrated in FIG. 25.

The second diffraction optical element $80_{DO2}$ can include a plurality of diffraction optical elements $80_{DO2-1}$ to $80_{DO2-3}$.

The respective diffraction optical elements $80_{DO2-1}$ to $80_{DO2-3}$ can be arranged along the optical path (or the reference axis AX2) of the laser light rays $Ray_{LL2}$ emitted from the second laser light source $74_{LL2}$ and collimated by the second collimating lens $76_{LL2}$ as illustrated in FIG. 22A. Or as illustrated in FIG. 22B, they can be arranged circularly while they are secured to a rotary plate 86, although the arrangement of these elements is not limited to a particular one.

The respective diffraction optical elements $80_{DO2-1}$ to $80_{DO2-3}$ can be moved by a not-illustrated actuator, such as a solenoid, to be disposed in the optical path of the laser light rays $Ray_{LL2}$ emitted from the second laser light source $74_{LL2}$ and collimated by the second collimating lens $76_{LL2}$ or outside of the optical path.

When the respective diffraction optical elements $80_{DO2-1}$ to $80_{DO2-3}$ are secured to the rotary plate 86, the rotary plate 86 can be rotated and stopped by a not-illustrated actuator, such as a solenoid, so that the respective diffraction optical elements $80_{DO2-1}$ to $80_{DO2-3}$ are disposed in the optical path of the laser light rays $Ray_{LL2}$ emitted from the second laser light source $74_{LL2}$ and collimated by the second collimating lens $76_{LL2}$ or outside of the optical path.

Figure 26:
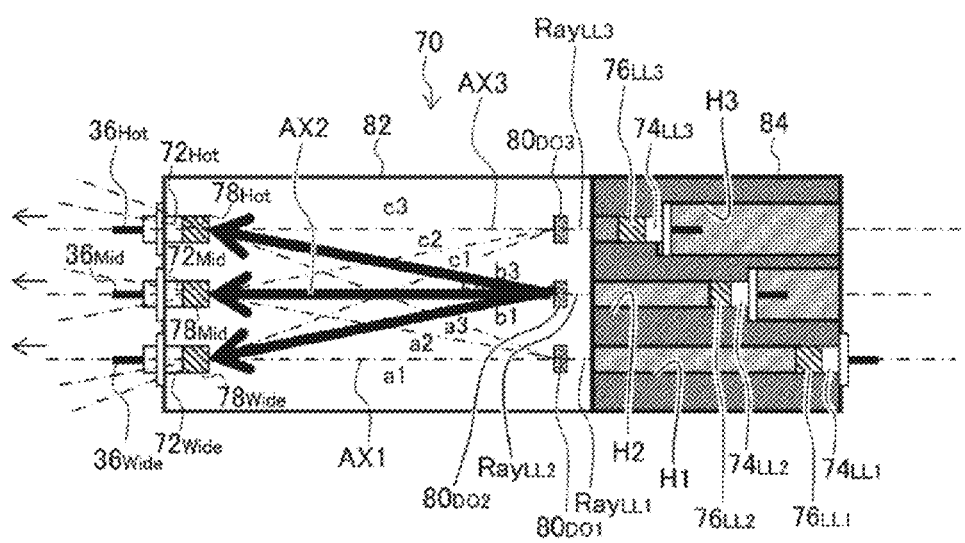
FIG. 26 is a schematic diagram illustrating the state in which laser light rays $Ray_{LL2}$ is dispersed by diffraction at the diffractive optical element $80_{DO2}$ ($80_{DO2-1}$ to $80_{DO2-3}$)

When the respective diffraction optical elements $80_{DO2-1}$ to $80_{DO2-3}$ are disposed in the optical path of the laser light rays $Ray_{LL2}$ emitted from the second laser light source $74_{LL2}$ and collimated by the second collimating lens $76_{LL2}$, as illustrated in FIG. 26, they can deflect the laser light rays $Ray_{LL2}$ and direct them to the input end faces of the optical fibers $36_{Wide}$, $36_{Mid}$, and $36_{Hot}$ (strictly speaking, the first to third condenser lenses $78_{Wide}$, $78_{Mid}$, and $78_{Hot}$) at respective different ratios (disperse ratio) due to the diffraction. In order to achieve this configuration, the respective diffraction optical elements $80_{DO2-1}$ to $80_{DO2-3}$ can be configured by a holographic optical element (HOE). In another exemplary embodiment, they can be configured by a blazed diffractive optical element (DOE).

Specifically, they can be configured as follows.

The diffraction optical element $80_{DO2-1}$ can be configured as a holographic optical element that is configured to deflect the laser light rays $Ray_{LL2}$ emitted from the second laser light source $74_{LL2}$ and collimated by the second collimating lens $76_{LL2}$ and direct them to the respective input end faces of the optical fibers $36_{Wide}$, $36_{Mid}$, and $36_{Hot}$ (strictly speaking, the respective first to third condenser lenses $78_{Wide}$, $78_{Mid}$, and $78_{Hot}$) at a ratio of 1/3:1/3:1/3 (disperse ratio) due to the diffraction.

Figure 27:
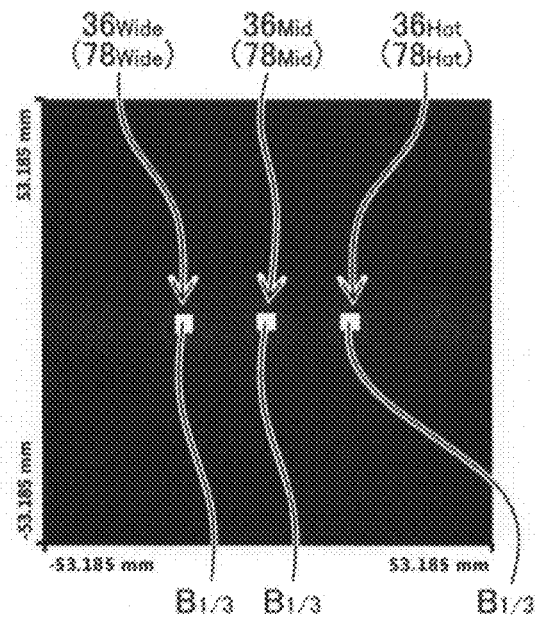
FIG. 27 is a diagram illustrating an example of shining light $B_{1/3}$, $B_{1/3}$, and $B_{1/3}$ formed (reproduced) by diffraction by means of the diffractive optical element $80_{DO2}$ ($80_{DO2-1}$ to $80_{DO2-3}$)

Specifically, the diffraction optical element $80_{DO2-1}$ can be configured as a holographic optical element that is configured to, when the laser light rays $Ray_{LL2}$ emitted from the second laser light source $74_{LL2}$ and collimated by the second collimating lens $76_{LL2}$ is used as a reference light ray, direct the reproduced light rays to ranges of respective light receiving angles θ (effective lens incident angle) of the respective first to third condenser lenses $78_{Wide}$, $78_{Mid}$, and $78_{Hot}$ at a ratio of 1/3:1/3:1/3 (disperse ratio) (see FIG. 24) and reproduce shining light $B_{1/3}$, $B_{1/3}$, and $B_{1/3}$, as illustrated in FIG. 27.

The diffraction optical element $80_{DO2-2}$ can be configured as a holographic optical element that is configured to deflect the laser light rays $Ray_{LL2}$ emitted from the second laser light source $74_{LL2}$ and collimated by the second collimating lens $76_{LL2}$ and direct them to the respective input end faces of the optical fibers $36_{Wide}$, $36_{Mid}$, and $36_{Hot}$ (strictly speaking, the respective first to third condenser lenses $78_{Wide}$, $78_{Mid}$, and $78_{Hot}$) at a ratio of 1/2:1/4:1/4 (disperse ratio) due to the diffraction. The diffraction optical element $80_{DO2-2}$ can have the same configuration as that of the diffraction optical element $80_{DO2-1}$ except for the disperse ratio.

Specifically, the diffraction optical element $80_{DO2-2}$ can be configured as a holographic optical element that is configured to, when the laser light rays $Ray_{LL2}$ emitted from the second laser light source $74_{LL2}$ and collimated by the second collimating lens $76_{LL2}$ is used as a reference light ray, direct the reproduced light rays to ranges of respective light receiving angles θ (effective lens incident angle) of the respective first to third condenser lenses $78_{Wide}$, $78_{Mid}$, and $78_{Hot}$ at a ratio of 1/2:1/4:1/4 (disperse ratio) (see FIG. 24) and reproduce shining light $B_{1/2}$, $B_{1/4}$, and $B_{1/4}$, as illustrated in FIG. 27.

The diffraction optical element $80_{DO2-3}$ can be configured as a holographic optical element that is configured to deflect the laser light rays $Ray_{LL2}$ emitted from the second laser light source $74_{LL2}$ and collimated by the second collimating lens $76_{LL2}$ and direct them to the respective input end faces of the optical fibers $36_{Wide}$, $36_{Mid}$, and $36_{Hot}$ (strictly speaking, the respective first to third condenser lenses $78_{Wide}$, $78_{Mid}$, and $78_{Hot}$) at a ratio of 1/4:1/4:1/2 (disperse ratio) due to the diffraction. The diffraction optical element $80_{DO2-3}$ can have the same configuration as that of the diffraction optical element $80_{DO2-1}$ except for the disperse ratio.

Specifically, the diffraction optical element $80_{DO2-3}$ can be configured as a holographic optical element that is configured to, when the laser light rays $Ray_{LL2}$ emitted from the second laser light source $74_{LL2}$ and collimated by the second collimating lens $76_{LL2}$ is used as a reference light ray, direct the reproduced light rays to ranges of respective light receiving angles θ (effective lens incident angle) of the respective first to third condenser lenses $78_{Wide}$, $78_{Mid}$, and $78_{Hot}$ at a ratio of 1/4:1/4:1/2 (disperse ratio) (see FIG. 24) and reproduce shining light $B_{1/4}$, $B_{1/4}$, and $B_{1/2}$, as illustrated in FIG. 27.

The third diffraction optical element $80_{DO3}$ can include a plurality of diffraction optical elements $80_{DO3-1}$ to $80_{DO3-3}$.

The respective diffraction optical elements $80_{DO3-1}$ to $80_{DO3-3}$ can be arranged along the optical path (or the reference axis AX3) of the laser light rays $Ray_{LL3}$ emitted from the third laser light source $74_{LL3}$ and collimated by the third collimating lens $76_{LL3}$ as illustrated in FIG. 22A. Or as illustrated in FIG. 22B, they can be arranged circularly while they are secured to a rotary plate 86, although the arrangement of these elements is not limited to a particular one.

The respective diffraction optical elements $80_{DO3-1}$ to $80_{DO3-3}$ can be moved by a not-illustrated actuator, such as a solenoid, to be disposed in the optical path of the laser light rays $Ray_{LL3}$ emitted from the third laser light source $74_{LL3}$ and collimated by the third collimating lens $76_{LL3}$ or outside of the optical path.

When the respective diffraction optical elements $80_{DO3-1}$ to $80_{DO3-3}$ are secured to the rotary plate 86, the rotary plate 86 can be rotated and stopped by a not-illustrated actuator, such as a solenoid, so that the respective diffraction optical elements $80_{DO3-1}$ to $80_{DO3-3}$ are disposed in the optical path of the laser light rays $Ray_{LL3}$ emitted from the third laser light source $74_{LL3}$ and collimated by the third collimating lens $76_{LL3}$ or outside of the optical path.

Figure 28:
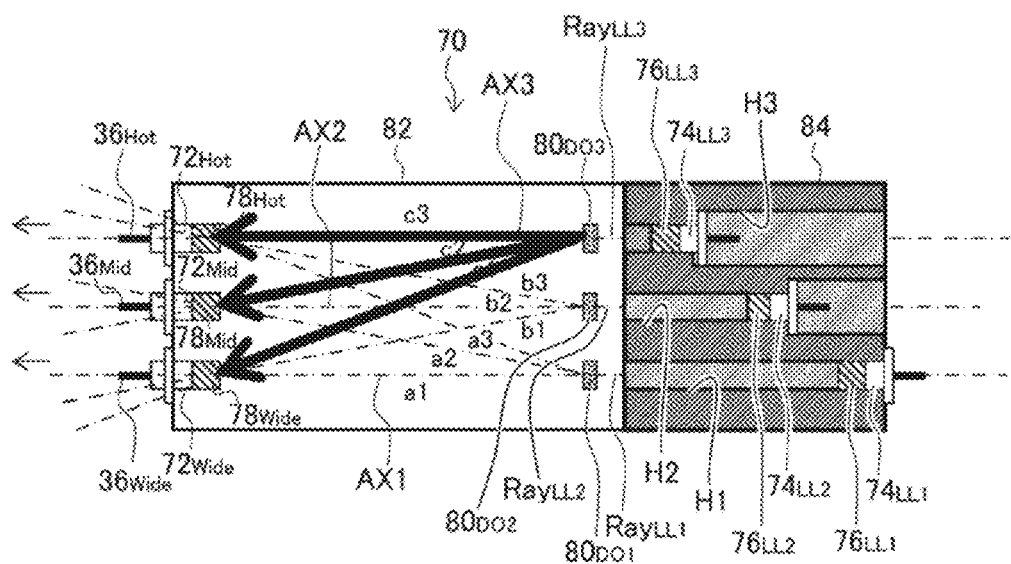
FIG. 28 is a schematic diagram illustrating the state in which laser light rays $Ray_{LL3}$ is dispersed by diffraction at the diffractive optical element $80_{DO3}$ ($80_{DO3-1}$ to $80_{DO3-3}$)

When the respective diffraction optical elements $80_{DO3-1}$ to $80_{DO3-3}$ are disposed in the optical path of the laser light rays $Ray_{LL3}$ emitted from the third laser light source $74_{LL3}$ and collimated by the third collimating lens $76_{LL3}$, as illustrated in FIG. 28, they can deflect the laser light rays $Ray_{LL3}$ and direct them to the input end faces of the optical fibers $36_{Wide}$, $36_{Mid}$, and $36_{Hot}$ (strictly speaking, the first to third condenser lenses $78_{Wide}$, $78_{Mid}$, and $78_{Hot}$) at respective different ratios (disperse ratio) due to the diffraction. In order to achieve this configuration, the respective diffraction optical elements $80_{DO3-1}$ to $80_{DO2-3}$ can be configured by a holographic optical element (HOE). In another exemplary embodiment, they can be configured by a blazed diffractive optical element (DOE).

Specifically, they can be configured as follows.

The diffraction optical element $80_{DO3\text{-}1}$ can be configured as a holographic optical element that is configured to deflect the laser light rays $Ray_{LL3}$ emitted from the third laser light source $74_{LL3}$ and collimated by the third collimating lens $76_{LL3}$ and direct them to the respective input end faces of the optical fibers $36_{Wide}$, $36_{Mid}$, and $36_{Hot}$ (strictly speaking, the respective first to third condenser lenses $78_{Wide}$, $78_{Mid}$, and $78_{Hot}$) at a ratio of 1/3:1/3:1/3 (disperse ratio) due to the diffraction.

Figure 29:
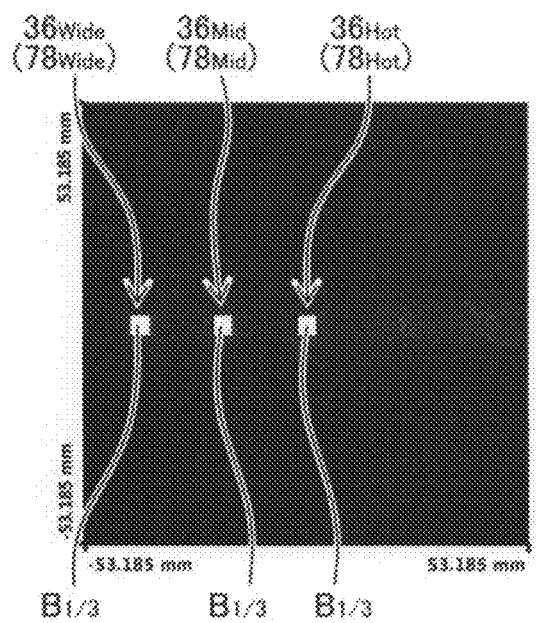
FIG. 29 is a diagram illustrating an example of shining light $B_{1/3}$, $B_{1/3}$, and $B_{1/3}$ formed (reproduced) by diffraction by means of the diffractive optical element $80_{DO3}$ ($80_{DO3-1}$ to $80_{DO3-3}$)

Specifically, the diffraction optical element $80_{DO3\text{-}1}$ can be configured as a holographic optical element that is configured to, when the laser light rays $Ray_{LL3}$ emitted from the third laser light source $74_{LL3}$ and collimated by the third collimating lens $76_{LL3}$ is used as a reference light ray, direct the reproduced light rays to ranges of respective light receiving angles θ (effective lens incident angle) of the respective first to third condenser lenses $78_{Wide}$, $78_{Mid}$, and $78_{Hot}$ at a ratio of 1/3:1/3:1/3 (disperse ratio) (see FIG. 24) and reproduce shining light $B_{1/3}$, $B_{1/3}$, and $B_{1/3}$, as illustrated in FIG. 29.

The diffraction optical element $80_{DO3\text{-}2}$ can be configured as a holographic optical element that is configured to deflect the laser light rays $Ray_{LL3}$ emitted from the third laser light source $74_{LL3}$ and collimated by the third collimating lens $76_{LL3}$ and direct them to the respective input end faces of the optical fibers $36_{Wide}$, $36_{Mid}$, and $36_{Hot}$ (strictly speaking, the respective first to third condenser lenses $78_{Wide}$, $78_{Mid}$, and $78_{Hot}$) at a ratio of 1/2:1/4:1/4 (disperse ratio) due to the diffraction. The diffraction optical element $80_{DO3\text{-}2}$ can have the same configuration as that of the diffraction optical element $80_{DO3\text{-}1}$ except for the disperse ratio.

Specifically, the diffraction optical element $80_{DO3\text{-}2}$ can be configured as a holographic optical element that is configured to, when the laser light rays $Ray_{LL3}$ emitted from the third laser light source $74_{LL3}$ and collimated by the third collimating lens $76_{LL3}$ is used as a reference light ray, direct the reproduced light rays to ranges of respective light receiving angles θ (effective lens incident angle) of the respective first to third condenser lenses $78_{Wide}$, $78_{Mid}$, and $78_{Hot}$ at a ratio of 1/2:1/4:1/4 (disperse ratio) (see FIG. 24) and reproduce shining light $B_{1/2}$, $B_{1/4}$, and $B_{1/4}$, as illustrated in FIG. 29.

The diffraction optical element $80_{DO3\text{-}3}$ can be configured as a holographic optical element that is configured to deflect the laser light rays $Ray_{LL3}$ emitted from the third laser light source $74_{LL3}$ and collimated by the third collimating lens $76_{LL3}$ and direct them to the respective input end faces of the optical fibers $36_{Wide}$, $36_{Mid}$, and $36_{Hot}$ (strictly speaking, the respective first to third condenser lenses $78_{Wide}$, $78_{Mid}$, and $78_{Hot}$) at a ratio of 1/4:1/4:1/2 (disperse ratio) due to the diffraction. The diffraction optical element $80_{DO3\text{-}3}$ can have the same configuration as that of the diffraction optical element $80_{DO3\text{-}1}$ except for the disperse ratio.

Specifically, the diffraction optical element $80_{DO3\text{-}3}$ can be configured as a holographic optical element that is configured to, when the laser light rays $Ray_{LL3}$ emitted from the third laser light source $74_{LL3}$ and collimated by the third collimating lens $76_{LL3}$ is used as a reference light ray, direct the reproduced light rays to ranges of respective light receiving angles θ (effective lens incident angle) of the respective first to third condenser lenses $78_{Wide}$, $78_{Mid}$, and $78_{Hot}$ at a ratio of 1/4:1/4:1/2 (disperse ratio) (see FIG. 24) and reproduce shining light $B_{1/4}$, $B_{1/4}$, and $B_{1/2}$, as illustrated in FIG. 29.

The diffraction optical elements $80_{DO1\text{-}1}$ to $80_{DO1\text{-}3}$, $80_{DO2\text{-}1}$ to $80_{DO2\text{-}3}$, and $80_{DO3\text{-}1}$ to $80_{DO3\text{-}3}$ can each be a holographic optical element made from a computer generated hologram (CGH).

Figure 30A:
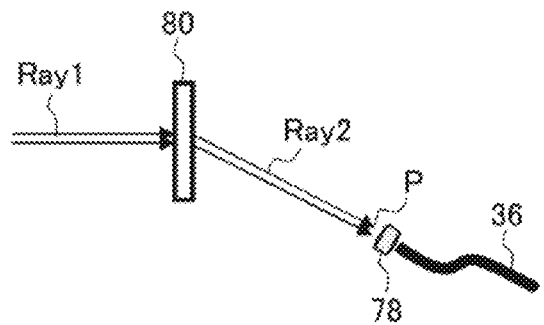
FIG. 30A is a diagram illustrating the fundamental concept of reproduction by a holographic optical element.

The fundamental concept of reproduction by a holographic optical element will be described. FIG. 30A is a diagram illustrating the fundamental concept of reproduction by a holographic optical element The holographic optical element 80 can be produced by irradiating a hologram base material with reference light and to-be-reproduced light obtained by dividing coherent laser light, and recording the interference state (holographic pattern) onto the base material. The resulting holographic optical element 80 can be irradiated with only the reference light Ray1 to reproduce the to-be-reproduced light as interference light with a holographic pattern (reproduced light). Specifically, the reference light Ray1 can impinge on the interference pattern on the holographic optical element 80 to become reproduced light Ray2 to be converged to the output point P.

The holographic optical element 80 can be produced by CGH. In a conventional holographic recording method, interference fringes are formed by a wave front from an object and a reference wave front to be used for recording a complex amplitude distribution. The CGH is a method of recording such a complex amplitude distribution only by calculating the above processes of the conventional holographic recording method. Specifically, a wave front reaching the surface of a holographic base material can be calculated on the basis of data of to-be-reproduced object or wave front, and the calculated wave front or holographic base image can be displayed on an appropriate display device to photographically reduce the size thereof to be used as a hologram. Thus, in principle, any wave forms of objects that can be mathematically described and have not been reproduced by the conventional holographic reproducing method can be recorded.

Figure 30B:
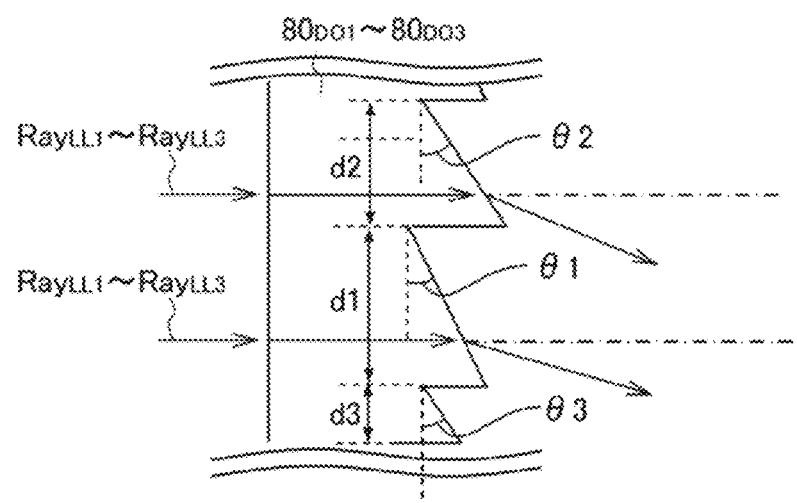
FIG. 30B is a partial enlarged cross-sectional view illustrating the diffractive optical element $80_{DO1}$ to $80_{DO3}$ constituted as a blazed diffractive optical element.

The diffraction optical elements $80_{DO1\text{-}1}$ to $80_{DO3}$, $80_{DO2\text{-}1}$ to $80_{DO2\text{-}3}$, and $80_{DO3\text{-}1}$ to $80_{DO3\text{-}3}$ can each be a blazed diffraction optical element which can be configured by setting blazed angles θ1, θ2, and θ3, and blazed distances d1, d2, and d3, as illustrated in FIG. 30B. The adjustment of the blazed distance and/or blazed surface ratio can control the deflection (disperse light) of the laser light rays $Ray_{LL1}$, $Ray_{LL2}$, and $Ray_{LL3}$ emitted from the respective laser light sources $74_{LL1}$, $74_{LL2}$, and $74_{LL3}$ and collimated by the respective collimating lenses $76_{LL1}$, $76_{LL2}$, and $76_{LL3}$ in different directions at predetermined ratios (disperse ratio).

A description will now be given of the functional configuration of the coupler/distributer 70 with the above-described configuration with reference to the drawing.

FIG. 31 is a functional block diagram representing the functional configuration of the coupler/distributer 70.

As illustrated in FIG. 31, the coupler/distributer 70 can include the CPU 88 that can control the entire operations. The CPU 88 can be coupled with, via a bus, a headlamp switch 90; first to third actuators $92_{DO1}$, $92_{DO2}$, and $92_{DO3}$ corresponding to the first to third diffraction optical elements $80_{DO1}$, $80_{DO2}$, and $80_{DO3}$; first to third LD lighting circuits $94_{LL1}$, $94_{LL2}$, and $94_{LL3}$, provided corresponding to the first to third laser light sources $74_{LL1}$, $74_{LL2}$, and $74_{LL3}$ (semiconductor lasers $LD_{LL1}$, $LD_{LL2}$, and $LD_{LL3}$), for supplying a current to the respective laser light sources $74_{LL1}$, $74_{LL2}$, and $74_{LL3}$, (semiconductor lasers $LD_{LL1}$, $LD_{LL2}$, and $LD_{LL3}$); a navigation system 96; a vehicle speed sensor 98a; a windshield wiper sensor 98b; an ambient luminance sensor 98c; first to third MEMS power circuits $68_{Wide}$, $68_{Mid}$, and $68_{Hot}$;

a program storage unit (not illustrated) configured to store various programs executed by the CPU 88; a RAM (not illustrated) configured to serve to provide a work area and the like, etc. The first to third actuators $92_{DO1}$, $92_{DO2}$, and $92_{DO3}$ correspond to the "actuator provided corresponding to each one of the N laser light sources and configured to dispose any one of the plurality of diffractive optical elements corresponding to the one of the N laser light sources in an optical path of laser light from the one laser light source, for each laser light source" as defined in the presently disclosed subject matter.

The navigation system 96, vehicle speed sensor 98a, windshield wiper sensor 98b, and ambient luminance sensor 98c correspond to the "sensor installed in a vehicle" as defined in the presently disclosed subject matter.

Next, the operation of the coupler/distributer 70 with the above configuration will be described with reference to the drawings.

Figure 32:
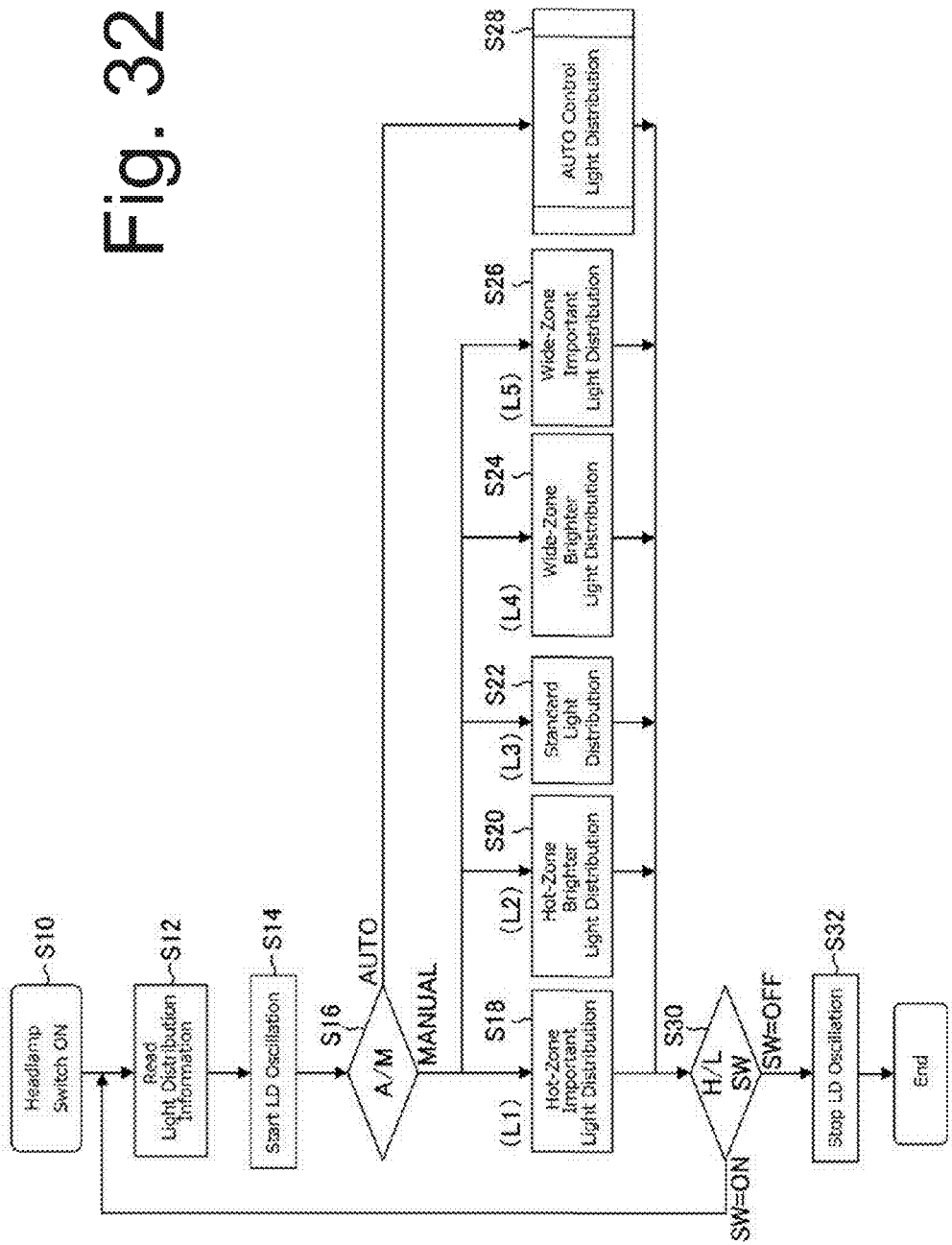
FIG. 32 is a flow chart showing the basic action of the coupler/distributer 70.

FIG. 32 is a flow chart showing the basic action of the coupler/distributer 70. The following process may be achieved in such a manner that the CPU 88 can read various predetermined programs stored in the program storage unit in the RAM and the like and execute the same. The following process can correspond to the "light intensity changing unit" as defined in the presently disclosed subject matter.

First, the headlamp switch 90 is turned on (step S10) to read light distribution setting information (step S12).

The light distribution setting information can be information indicating that the light distribution setting is automatically (AUTO) or manually (MANUAL) achieved, and can be stored in a storage device (not illustrated) connected to the CPU 88 upon operation of an automatic/manual operation selector switch or the like installed in a vehicle interior and operated by a driver or the like.

Next, according to an instruction from the CPU 88, the respective LD lighting circuits $94_{LL1}$, $94_{LL2}$, and $94_{LL3}$ can control the first to third laser light sources $74_{LL1}$, $74_{LL2}$, and $74_{LL3}$ (semiconductor lasers $LD_{LL1}$, $LD_{LL2}$, and $LD_{LL3}$) to emit laser light with respective predetermined outputs (for example, maximum output) (step S14).

If the light distribution setting information is determined to indicate the manual operation (step S16, MANUAL), the following processes can be executed in accordance with the manually selected light distribution. The processes may include "hot-zone important light distribution process" (step S18), "hot-zone brighter light distribution process" (step S20), "standard light distribution process" (step S22), "wide-zone brighter light distribution process" (step S24), and "wide-zone important light distribution process" (step S26). The "hot-zone important light distribution", "hot-zone brighter light distribution", "standard light distribution", "wide-zone brighter light distribution", and "wide-zone important light distribution" correspond to the "plurality of predetermined light distribution patterns" as defined in the presently disclosed subject matter.

Which light distribution has manually been selected can be determined on the basis of, for example, a light distribution discrimination flag.

For example, if a driver manually operates a light distribution selector switch installed in a vehicle interior to select "hot-zone important light distribution," the light distribution discrimination flag is set to include information indicating the "hot-zone important light distribution" manually selected by a driver, for example, as "L1." In this case, it is determined that the manually selected light distribution is "hot-zone important light distribution" on the basis of the light distribution discrimination flag (step S16: L1), and the "hot-zone important light distribution process" can be performed (step S18).

The "hot-zone important light distribution process" (step S18) can control the respective actuators $92_{DO1}$, $92_{DO2}$, and $92_{DO3}$ to switch over and move the diffraction optical elements to be disposed within the optical paths of laser light rays from the respective laser light sources $74_{LL1}$, $74_{LL2}$, and $74_{LL3}$ (semiconductor lasers $LD_{LL1}$, $LD_{LL2}$, and $LD_{LL3}$) in such a manner that the outputs of laser light rays output from the hot-zone optical fiber $36_{Hot}$ (output end face thereof) become relatively high.

Specifically, in accordance with the instruction from the CPU 88, the respective actuators $92_{DO1}$, $92_{DO2}$, and $92_{DO3}$ can dispose the diffraction optical elements $80_{DO1\text{-}3}$, $80_{DO2\text{-}3}$, and $80_{DO3\text{-}3}$ in the optical path of the laser light rays $Ray_{LL1}$ emitted from the first laser light source $74_{LL1}$, in the optical path of the laser light rays $Ray_{LL2}$ emitted from the second laser light source $74_{LL2}$, and in the optical path of the laser light rays $Ray_{LL3}$ emitted from the third laser light source $74_{LL3}$, respectively (see the row of "L1: hot-zone important" in the table of FIG. 33A).

By doing so, the laser light rays $Ray_{LL1}$ to $Ray_{LL3}$ emitted from the respective laser light sources $74_{LL1}$ to $74_{LL3}$ can be dispersed at respective disperse ratios as shown in the row of "L1: hot-zone important" in the table of FIG. 33B.

For example, the laser light rays $Ray_{LL1}$ emitted from the first laser light source $74_{LL1}$ can be directed to the condenser lenses $78_{Wide}$, $78_{Mid}$, and $78_{Hot}$ at a ratio of 1/4:1/4:1/2 due to diffraction at the diffraction optical element $80_{DO1\text{-}3}$ and condensed by the condenser lenses $78_{Wide}$, $78_{Mid}$, and $78_{Hot}$ to be incident on the input end faces of the optical fibers $36_{Wide}$, $36_{Mid}$, and $36_{Hot}$.

Similarly, the laser light rays $Ray_{LL2}$ emitted from the second laser light source $74_{LL2}$ can be directed to the condenser lenses $78_{Wide}$, $78_{Mid}$, and $78_{Hot}$ at a ratio of 1/4:1/4:1/2 due to diffraction at the diffraction optical element $80_{DO2\text{-}3}$ and condensed by the condenser lenses $78_{Wide}$, $78_{Mid}$, and $78_{Hot}$ to be incident on the input end faces of the optical fibers $36_{Wide}$, $36_{Mid}$, and $36_{Hot}$.

Similarly, the laser light rays $Ray_{LL3}$ emitted from the third laser light source $74_{LL3}$ can be directed to the condenser lenses $78_{Wide}$, $78_{Mid}$, and $78_{Hot}$ at a ratio of 1/4:1/4:1/2 due to diffraction at the diffraction optical element $80_{DO3\text{-}3}$ and condensed by the condenser lenses $78_{Wide}$, $78_{Mid}$, and $78_{Hot}$ to be incident on the input end faces of the optical fibers $36_{Wide}$, $36_{Mid}$, and $36_{Hot}$.

The laser light rays having been incident on the respective input end faces of the optical fibers $36_{Wide}$, $36_{Mid}$, and $36_{Hot}$ can be propagated and output through the output end faces of the optical fibers $36_{Wide}$, $36_{Mid}$, and $36_{Hot}$ to enter the lighting unit 40, to thereby form a high-beam light distribution pattern $P_{Hi}$ as illustrated in FIG. 3A.

Specifically, the laser light rays output from the respective output end faces of the optical fibers $36_{Wide}$, $36_{Mid}$, and $36_{Hot}$ can two-dimensionally scan in the horizontal and vertical directions by means of the respective optical deflectors $201_{Wide}$, $201_{Mid}$, and $201_{Hot}$, to thereby form the first to third light intensity distributions within the respective scanning regions $A_{Wide}$, $A_{Mid}$, and $A_{Hot}$. The first to third light intensity distributions formed in the respective scanning regions $A_{Wide}$, $A_{Mid}$, and $A_{Hot}$ of the wavelength conversion member 18 can be projected forward through the projection lens 20, so that the high-beam light distribution pattern $P_{Hi}$ can be formed on a virtual vertical screen by overlaying the respective partial light distribution patterns $P_{Hi\_Wide}$, $P_{Hi\_Mid}$, and $P_{Hi\_Hot}$.

In the present exemplary embodiment, the output ratios of the laser light rays output from the respective output end faces of the wide-zone, middle-zone, and hot-zone optical fibers $36_{Wide}$, $36_{Mid}$, and $36_{Hot}$ can be the relationship of 3/4:3/4:3/2 as shown in the table of FIG. 33B. Specifically, the output of the laser light rays from the output end face of the hot-zone optical fiber $36_{Hot}$ can become relatively high, for example, 3/2 of the maximum output. As a result, the light intensity of the hot-zone partial light distribution pattern $P_{Hi\_Hot}$ can be changed, so that the high-beam light distribution pattern $P_{Hi}$ can be formed as a hot-zone important light distribution pattern with the brighter hot-zone partial light distribution pattern $P_{Hi\_Hot}$. In this manner, the high-beam light distribution pattern $P_{Hi}$ can be formed to be made appropriate for the conditions surrounding the vehicle body, or the running condition.

Furthermore, for example, if a driver manually operates a light distribution selector switch installed in a vehicle interior to select "hot-zone brighter light distribution," the light distribution discrimination flag is set to include information indicating the "hot-zone brighter light distribution" manually selected by a driver, for example, as "L2." In this case, it is determined that the manually selected light distribution is "hot-zone brighter light distribution" on the basis of the light distribution discrimination flag (step S16: L2), and the "hot-zone brighter light distribution process" can be performed (step S20).

The "hot-zone brighter light distribution process" (step S20) can control the respective actuators $92_{DO1}$, $92_{DO2}$, and $92_{DO3}$ to switch over and move the diffraction optical elements to be disposed within the optical paths of laser light rays from the respective laser light sources $74_{LL1}$, $74_{LL2}$, and $74_{LL3}$ (semiconductor lasers $LD_{LL1}$, $LD_{LL2}$, and $LD_{LL3}$) in such a manner that the outputs of laser light rays output from the hot-zone optical fiber $36_{Hot}$ (output end face thereof) become relatively high.

Specifically, in accordance with the instruction from the CPU 88, the respective actuators $92_{DO1}$, $92_{DO2}$, and $92_{DO3}$ can dispose the diffraction optical elements $80_{DO1-3}$, $80_{DO2-1}$, and $80_{DO3-1}$ in the optical path of the laser light rays $Ray_{LL1}$ emitted from the first laser light source $74_{LL1}$, in the optical path of the laser light rays $Ray_{LL2}$ emitted from the second laser light source $74_{LL2}$, and in the optical path of the laser light rays $Ray_{LL3}$ emitted from the third laser light source $74_{LL3}$, respectively (see the row of "L2: hot-zone brighter" in the table of FIG. 33A).

By doing so, the laser light rays $Ray_{LL1}$ to $Ray_{LL3}$ emitted from the respective laser light sources $74_{LL1}$ to $74_{LL3}$ can be dispersed at respective disperse ratios as shown in the row of "L2: hot-zone brighter" in the table of FIG. 33B.

For example, the laser light rays $Ray_{LL1}$ emitted from the first laser light source $74_{LL1}$ can be directed to the condenser lenses $78_{Wide}$, $78_{Mid}$, and $78_{Hot}$ at a ratio of 1/4:1/4:1/2 due to diffraction at the diffraction optical element $80_{DO1-3}$ and condensed by the condenser lenses $78_{Wide}$, $78_{Mid}$, and $78_{Hot}$ to be incident on the input end faces of the optical fibers $36_{Wide}$, $36_{Mid}$, and $36_{Hot}$.

Similarly, the laser light rays $Ray_{LL2}$ emitted from the second laser light source $74_{LL2}$ can be directed to the condenser lenses $78_{Wide}$, $78_{Mid}$, and $78_{Hot}$ at a ratio of 1/3:1/3:1/3 due to diffraction at the diffraction optical element $80_{DO2-1}$ and condensed by the condenser lenses $78_{Wide}$, $78_{Mid}$, and $78_{Hot}$ to be incident on the input end faces of the optical fibers $36_{Wide}$, $36_{Mid}$, and $36_{Hot}$.

Similarly, the laser light rays $Ray_{LL3}$ emitted from the third laser light source $74_{LL3}$ can be directed to the condenser lenses $78_{Wide}$, $78_{Mid}$, and $78_{Hot}$ at a ratio of 1/3:1/3: 1/3 due to diffraction at the diffraction optical element $80_{DO3-1}$ and condensed by the condenser lenses $78_{Wide}$, $78_{Mid}$, and $78_{Hot}$ to be incident on the input end faces of the optical fibers $36_{Wide}$, $36_{Mid}$, and $36_{Hot}$.

The laser light rays having been incident on the respective input end faces of the optical fibers $36_{Wide}$, $36_{Mid}$, and $36_{Hot}$ can be propagated and output through the output end faces of the optical fibers $36_{Wide}$, $36_{Mid}$, and $36_{Hot}$ to enter the lighting unit 40, to thereby form a high-beam light distribution pattern $P_{Hi}$ as illustrated in FIG. 3A.

In the present exemplary embodiment, the output ratios of the laser light rays output from the respective output end faces of the wide-zone, middle-zone, and hot-zone optical fibers $36_{Wide}$, $36_{Mid}$, and $36_{Hot}$ can be the relationship of 11/12:11/12:7/6 as shown in the table of FIG. 33B. Specifically, the output of the laser light rays from the output end face of the hot-zone optical fiber $36_{Hot}$ can become relatively high, for example, 7/6 of the maximum output. As a result, the light intensity of the hot-zone partial light distribution pattern $P_{Hi\_Hot}$ can be changed, so that the high-beam light distribution pattern $P_{Hi}$ can be formed as a hot-zone brighter light distribution pattern with the slightly brighter hot-zone partial light distribution pattern $P_{Hi\_Hot}$. In this manner, the high-beam light distribution pattern $P_{Hi}$ can be formed to be made appropriate for the conditions surrounding the vehicle body, or the running condition.

Furthermore, for example, if a driver manually operates a light distribution selector switch installed in a vehicle interior to select "standard light distribution," the light distribution discrimination flag is set to include information indicating the "standard light distribution" manually selected by a driver, for example, as "L3." In this case, it is determined that the manually selected light distribution is "standard light distribution" on the basis of the light distribution discrimination flag (step S16: L3), and the "standard light distribution process" can be performed (step S22).

The "standard light distribution process" (step S22) can control the respective actuators $92_{DO1}$, $92_{DO2}$, and $92_{DO3}$ to switch over and move the diffraction optical elements to be disposed within the optical paths of laser light rays from the respective laser light sources $74_{LL1}$, $74_{LL2}$, and $74_{LL3}$ (semiconductor lasers $LD_{LL1}$, $LD_{LL2}$, and $LD_{LL3}$) in such a manner that the outputs of laser light rays output from the respective optical fiber $36_{Wide}$, $36_{Mid}$, and $36_{Hot}$ (output end faces thereof) become even.

Specifically, in accordance with the instruction from the CPU 88, the respective actuators $92_{DO1}$, $92_{DO2}$, and $92_{DO3}$ can dispose the diffraction optical elements $80_{DO1-1}$, $80_{DO2-1}$, and $80_{DO3-1}$ in the optical path of the laser light rays $Ray_{LL1}$ emitted from the first laser light source $74_{LL1}$, in the optical path of the laser light rays $Ray_{LL2}$ emitted from the second laser light source $74_{LL2}$, and in the optical path of the laser light rays $Ray_{LL3}$ emitted from the third laser light source $74_{LL3}$, respectively (see the row of "L3: standard" in the table of FIG. 33A).

By doing so, the laser light rays $Ray_{LL1}$ to $Ray_{LL3}$ emitted from the respective laser light sources $74_{LL1}$ to $74_{LL3}$ can be dispersed at respective disperse ratios as shown in the row of "L3: standard" in the table of FIG. 33B.

For example, the laser light rays $Ray_{LL1}$ emitted from the first laser light source $74_{LL1}$ can be directed to the condenser lenses $78_{Wide}$, $78_{Mid}$, and $78_{Hot}$ at a ratio of 1/3:1/3:1/3 due to diffraction at the diffraction optical element $80_{DO1-1}$ and condensed by the condenser lenses $78_{Wide}$, $78_{Mid}$, and $78_{Hot}$ to be incident on the input end faces of the optical fibers $36_{Wide}$, $36_{Mid}$, and $36_{Hot}$.

Similarly, the laser light rays Ray$_{LL2}$ emitted from the second laser light source 74$_{LL2}$ can be directed to the condenser lenses 78$_{Wide}$, 78$_{Mid}$, and 78$_{Hot}$ at a ratio of 1/3:1/3:1/3 due to diffraction at the diffraction optical element 80$_{DO2-1}$ and condensed by the condenser lenses 78$_{Wide}$, 78$_{Mid}$, and 78$_{Hot}$ to be incident on the input end faces of the optical fibers 36$_{Wide}$, 36$_{Mid}$, and 36$_{Hot}$.

Similarly, the laser light rays Ray$_{LL3}$ emitted from the third laser light source 74$_{LL3}$ can be directed to the condenser lenses 78$_{Wide}$, 78$_{Mid}$, and 78$_{Hot}$ at a ratio of 1/3:1/3:1/3 due to diffraction at the diffraction optical element 80$_{DO3-1}$ and condensed by the condenser lenses 78$_{Wide}$, 78$_{Mid}$, and 78$_{Hot}$ to be incident on the input end faces of the optical fibers 36$_{Wide}$, 36$_{Mid}$, and 36$_{Hot}$.

The laser light rays having been incident on the respective input end faces of the optical fibers 36$_{Wide}$, 36$_{Mid}$, and 36$_{Hot}$ can be propagated and output through the output end faces of the optical fibers 36$_{Wide}$, 36$_{Mid}$, and 36$_{Hot}$ to enter the lighting unit 40, to thereby form a high-beam light distribution pattern P$_{Hi}$ as illustrated in FIG. 3A.

In the present exemplary embodiment, the output ratios of the laser light rays output from the respective output end faces of the wide-zone, middle-zone, and hot-zone optical fibers 36$_{Wide}$, 36$_{Mid}$, and 36$_{Hot}$ can be the relationship of 3/3:3/3:3/3 as shown in the table of FIG. 33B. Specifically, the outputs of the laser light rays from the output end faces of the respective optical fibers 36$_{Wide}$, 36$_{Mid}$, and 36$_{Hot}$ can become even. As a result, the light intensity of the hot-zone partial light distribution pattern P$_{Hi\_Hot}$ can be changed. In this manner, the high-beam light distribution pattern P$_{Hi}$ can be formed to be made appropriate for the conditions surrounding the vehicle body, or the running conditions.

Furthermore, for example, if a driver manually operates a light distribution selector switch installed in a vehicle interior to select "wide-zone brighter light distribution," the light distribution discrimination flag is set to include information showing the "wide-zone brighter light distribution" manually selected by a driver, for example, as "L4." In this case, it is determined that the manually selected light distribution is "wide-zone brighter light distribution" on the basis of the light distribution discrimination flag (step S16: L4), and the "wide-zone brighter light distribution process" can be performed (step S24).

The "wide-zone brighter light distribution process" (step S24) can control the respective actuators 92$_{DO1}$, 92$_{DO2}$, and 92$_{DO3}$ to switch over and move the diffraction optical elements to be disposed within the optical paths of laser light rays from the respective laser light sources 74$_{LL1}$, 74$_{LL2}$, and 74$_{LL3}$ (semiconductor lasers LD$_{LL1}$, LD$_{LL2}$, and LD$_{LL3}$) in such a manner that the outputs of laser light rays output from the wide-zone optical fiber 36$_{Wide}$ (output end face thereof) become relatively high.

Specifically, in accordance with the instruction from the CPU 88, the respective actuators 92$_{DO1}$, 92$_{DO2}$, and 92$_{DO3}$ can dispose the diffraction optical elements 80$_{DO1-2}$, 80$_{DO2-1}$, and 80$_{DO3-1}$ in the optical path of the laser light rays Ray$_{LL1}$ emitted from the first laser light source 74$_{LL1}$, in the optical path of the laser light rays Ray$_{LL2}$ emitted from the second laser light source 74$_{LL2}$, and in the optical path of the laser light rays Ray$_{LL3}$ emitted from the third laser light source 74$_{LL3}$, respectively (see the row of "L4: wide-zone brighter" in the table of FIG. 33A).

By doing so, the laser light rays Ray$_{LL1}$ to Ray$_{LL3}$ emitted from the respective laser light sources 74$_{LL1}$ to 74$_{LL3}$ can be dispersed at respective disperse ratios as shown in the row of "L4: wide-zone brighter" in the table of FIG. 33B.

For example, the laser light rays Ray$_{LL1}$ emitted from the first laser light source 74$_{LL1}$ can be directed to the condenser lenses 78$_{Wide}$, 78$_{Mid}$, and 78$_{Hot}$ at a ratio of 1/2:1/4:1/4 due to diffraction at the diffraction optical element 80$_{DO1-2}$ and condensed by the condenser lenses 78$_{Wide}$, 78$_{Mid}$, and 78$_{Hot}$ to be incident on the input end faces of the optical fibers 36$_{Wide}$, 36$_{Mid}$, and 36$_{Hot}$.

Similarly, the laser light rays Ray$_{LL2}$ emitted from the second laser light source 74$_{LL2}$ can be directed to the condenser lenses 78$_{Wide}$, 78$_{Mid}$, and 78$_{Hot}$ at a ratio of 1/3:1/3:1/3 due to diffraction at the diffraction optical element 80$_{DO2-1}$ and condensed by the condenser lenses 78$_{Wide}$, 78$_{Mid}$, and 78$_{Hot}$ to be incident on the input end faces of the optical fibers 36$_{Wide}$, 36$_{Mid}$, and 36$_{Hot}$.

Similarly, the laser light rays Ray$_{LL3}$ emitted from the third laser light source 74$_{LL3}$ can be directed to the condenser lenses 78$_{Wide}$, 78$_{Mid}$, and 78$_{Hot}$ at a ratio of 1/3:1/3:1/3 due to diffraction at the diffraction optical element 80$_{DO3-1}$ and condensed by the condenser lenses 78$_{Wide}$, 78$_{Mid}$, and 78$_{Hot}$ to be incident on the input end faces of the optical fibers 36$_{Wide}$, 36$_{Mid}$, and 36$_{Hot}$.

The laser light rays having been incident on the respective input end faces of the optical fibers 36$_{Wide}$, 36$_{Mid}$, and 36$_{Hot}$ can be propagated and output through the output end faces of the optical fibers 36$_{Wide}$, 36$_{Mid}$, and 36$_{Hot}$ to enter the lighting unit 40, to thereby form a high-beam light distribution pattern P$_{Hi}$ as illustrated in FIG. 3A.

In the present exemplary embodiment, the output ratios of the laser light rays output from the respective output end faces of the wide-zone, middle-zone, and hot-zone optical fibers 36$_{Wide}$, 36$_{Mid}$, and 36$_{Hot}$ can be the relationship of 7/6:11/12:11/12 as shown in the table of FIG. 33B. Specifically, the output of the laser light rays from the output end face of the wide-zone optical fiber 36$_{Wide}$ can become relatively high, for example, 7/6 of the maximum output. As a result, the light intensity of the wide-zone partial light distribution pattern P$_{Hi\_Wide}$ can be changed, so that the high-beam light distribution pattern P$_{Hi}$ can be formed as a wide-zone brighter light distribution pattern with the slightly brighter wide-zone partial light distribution pattern P$_{Hi\_Wide}$. In this manner, the high-beam light distribution pattern P$_{Hi}$ can be formed to be made appropriate for the conditions surrounding the vehicle body, or the running conditions.

Furthermore, for example, if a driver manually operates a light distribution selector switch installed in a vehicle interior to select "wide-zone important light distribution," the light distribution discrimination flag is set to include information showing the "wide-zone important light distribution" manually selected by a driver, for example, as "L5." In this case, it is determined that the manually selected light distribution is "wide-zone important light distribution" on the basis of the light distribution discrimination flag (step S16: L5), and the "wide-zone important light distribution process" can be performed (step S26).

The "wide-zone important light distribution process" (step S26) can control the respective actuators 92$_{DO1}$, 92$_{DO2}$, and 92$_{DO3}$ to switch over and move the diffraction optical elements to be disposed within the optical paths of laser light rays from the respective laser light sources 74$_{LL1}$, 74$_{LL2}$, and 74$_{LL3}$ (semiconductor lasers LD$_{LL1}$, LD$_{LL2}$, and LD$_{LL3}$) in such a manner that the outputs of laser light rays output from the wide-zone optical fiber 36$_{Wide}$ (output end face thereof) become relatively high.

Specifically, in accordance with the instruction from the CPU 88, the respective actuators 92$_{DO1}$, 92$_{DO2}$, and 92$_{DO3}$ can dispose the diffraction optical elements 80$_{DO1-2}$, 80$_{DO2-2}$, and 80$_{DO3-2}$ in the optical path of the laser light rays Ray$_{LL1}$ emitted from the first laser light source 74$_{LL1}$, in the optical path of the laser light rays Ray$_{LL2}$ emitted from the second laser light source 74$_{LL2}$, and in the optical path of the laser light rays Ray$_{LL3}$ emitted from the third laser light source 74$_{LL3}$, respectively (see the row of "L5: wide-zone important" in the table of FIG. 33A).

By doing so, the laser light rays Ray$_{LL1}$ to Ray$_{LL3}$ emitted from the respective laser light sources 74$_{LL1}$ to 74$_{LL3}$ can be dispersed at respective disperse ratios as shown in the row of "L5: wide-zone important" in the table of FIG. 33B.

For example, the laser light rays Ray$_{LL1}$ emitted from the first laser light source 74$_{LL1}$ can be directed to the condenser lenses 78$_{Wide}$, 78$_{Mid}$, and 78$_{Hot}$ at a ratio of 1/2:1/4:1/4 due to diffraction at the diffraction optical element 80$_{DO1-2}$ and condensed by the condenser lenses 78$_{Wide}$, 78$_{Mid}$, and 78$_{Hot}$ to be incident on the input end faces of the optical fibers 36$_{Wide}$, 36$_{Mid}$, and 36$_{Hot}$.

Similarly, the laser light rays Ray$_{LL2}$ emitted from the second laser light source 74$_{LL2}$ can be directed to the condenser lenses 78$_{Wide}$, 78$_{Mid}$, and 78$_{Hot}$ at a ratio of 1/2:1/4:1/4 due to diffraction at the diffraction optical element 80$_{DO2-2}$ and condensed by the condenser lenses 78$_{Wide}$, 78$_{Mid}$, and 78$_{Hot}$ to be incident on the input end faces of the optical fibers 36$_{Wide}$, 36$_{Mid}$, and 36$_{Hot}$.

Similarly, the laser light rays Ray$_{LL3}$ emitted from the third laser light source 74$_{LL3}$ can be directed to the condenser lenses 78$_{Wide}$, 78$_{Mid}$, and 78$_{Hot}$ at a ratio of 1/2:1/4:1/4 due to diffraction at the diffraction optical element 80$_{DO3-2}$ and condensed by the condenser lenses 78$_{Wide}$, and 78$_{Hot}$ to be incident on the input end faces of the optical fibers 36$_{Wide}$, 36$_{Mid}$, and 36$_{Hot}$.

The laser light rays having been incident on the respective input end faces of the optical fibers 36$_{Wide}$, 36$_{Mid}$, and 36$_{Hot}$ can be propagated and output through the output end faces of the optical fibers 36$_{Wide}$, 36$_{Mid}$, and 36$_{Hot}$ to enter the lighting unit 40, to thereby form a high-beam light distribution pattern P$_{Hi}$ as illustrated in FIG. 3A.

In the present exemplary embodiment, the output ratios of the laser light rays output from the respective output end faces of the wide-zone, middle-zone, and hot-zone optical fibers 36$_{Wide}$, 36$_{Mid}$, and 36$_{Hot}$ can be the relationship of 3/2:3/4:3/4 as shown in the table of FIG. 33B. Specifically, the output of the laser light rays from the output end face of the wide-zone optical fiber 36$_{Wide}$ can become relatively high, for example, 3/2 of the maximum output. As a result, the light intensity of the wide-zone partial light distribution pattern P$_{Hi\_Wide}$ can be changed, so that the high-beam light distribution pattern P$_{Hi}$ can be formed as a wide-zone important light distribution pattern with the brighter wide-zone partial light distribution pattern P$_{Hi\_Wide}$. In this manner, the high-beam light distribution pattern P$_{Hi}$ can be formed to be made appropriate for the conditions surrounding the vehicle body, or the running conditions.

On the other hand, if the light distribution setting information is determined to show the automatic operation (step S16, AUTO), the AUTO control light distribution process can be executed (step S28).

In the AUTO control light distribution process (step S28), navigation information, vehicle speed information, windshield wiper information, ambient luminance information, etc. can be read out from the navigation system 96, the vehicle speed sensor 98a, the windshield wiper sensor 98b, the ambient luminance sensor 98c, etc., respectively.

The light distribution can be automatically selected on the basis of these pieces of information, and in accordance with the automatically selected light distribution, the following processes can be executed. The processes may include the "hot-zone important light distribution process" (step S18), "hot-zone brighter light distribution process" (step S20), "standard light distribution process" (step S22), "wide-zone brighter light distribution process" (step S24), and "wide-zone important light distribution process" (step S26).

For example, if it is determined on the basis of the navigation information from the navigation system 96 that one's automobile on which the vehicle lighting fixture 100 is installed is running at high speed (highway driving), the "hot-zone important light distribution" can be automatically selected and the "hot-zone important light distribution process" can be performed (step S18).

In another case, if it is determined on the basis of the navigation information from the navigation system 96 that one's automobile on which the vehicle lighting fixture 100 is installed is running at moderate speed (city driving), the "standard light distribution" can be automatically selected and the "standard light distribution process" can be performed (step S22).

Furthermore, for example, if it is determined on the basis of the navigation information from the navigation system 96 that one's automobile on which the vehicle lighting fixture 100 is installed is running along a rough road, the "wide-zone important light distribution" can be automatically selected and the "wide-zone important light distribution process" can be performed (step S26).

Other than the above determination based on the navigation information, vehicle speed information from the vehicle speed sensor 98a, windshield wiper information from the windshield wiper sensor 98b, ambient luminance information from the ambient luminance sensor 98c, etc. can be used to determine the conditions surrounding one's automobile on which the vehicle lighting fixture 100 is installed. According to the determined conditions, the "hot-zone important light distribution process" (step S18), "hot-zone brighter light distribution process" (step S20), "standard light distribution process" (step S22), "wide-zone brighter light distribution process" (step S24), and "wide-zone important light distribution process" (step S26) may be automatically executed.

The processes in steps S12 to S28 can be repeatedly performed until the headlamp switch 90 is tuned off (step S30, SW=OFF). Then, when the headlamp switch 90 is turned off, the oscillation of the respective laser light sources 74$_{LL1}$, 74$_{LL2}$, and 74$_{LL3}$ (semiconductor lasers LD$_{LL1}$, LD$_{LL2}$, and LD$_{LL3}$) is stopped (step S32) to complete each of the processes.

Next, the first to third condenser lenses 78$_{Wide}$, 78$_{Mid}$, and 78$_{Hot}$ will be described with reference to a specific example.

Figure 34A:
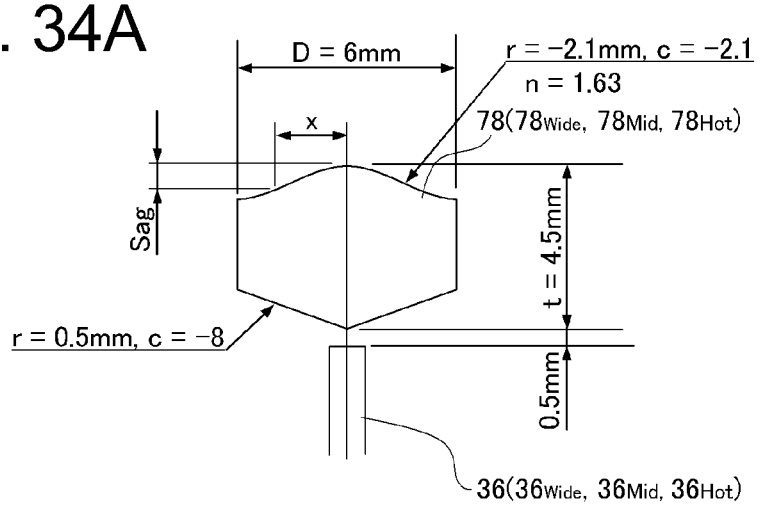
FIG. 34A is a schematic diagram illustrating a specific example of condenser lens 78 ($78_{Wide}$, $78_{Mid}$, and $78_{Hot}$)

FIG. 34A illustrates a specific example (aspheric lens) of the first to third condenser lenses 78$_{Wide}$, 78$_{Mid}$, and 78$_{Hot}$ that can converge the laser light rays dispersed by the respective diffraction optical elements 80$_{DO1-1}$ to 80$_{DO1-3}$, 80$_{DO2-1}$ to 80$_{DO2-3}$, and 80$_{DO3-1}$ to 80$_{DO3-3}$ and cause the same to be incident on the respective optical fibers 36$_{Wide}$, 36$_{Mid}$, and 36$_{Hot}$ without loss. The incident surface and output surface of each of the first to third condenser lenses 78$_{Wide}$, 78$_{Mid}$, and 78$_{Hot}$ as illustrated in FIG. 34A can be an aspheric surface represented by the following formula.

$$Sag(x) = \frac{\frac{x^2}{r}}{1 + \sqrt{1 - (1+c)(xr)^2}}$$

Specifically, the first to third condenser lenses $78_{Wide}$, $78_{Mid}$, and $78_{Hot}$ can have a curved cross section of an aspheric lens defined by a sagging value at a position which is separated away from the lens center line by a distance x to the outer periphery of the lens.

The sagging value Sag(x) represents a distance from the lens top at a position which is separated away from the center line of the optical axis of the lens by a distance x as illustrated in FIG. 34A. Furthermore, r is a radius of curvature when c=0, and c is an aspheric surface coefficient.

Figure 34B:
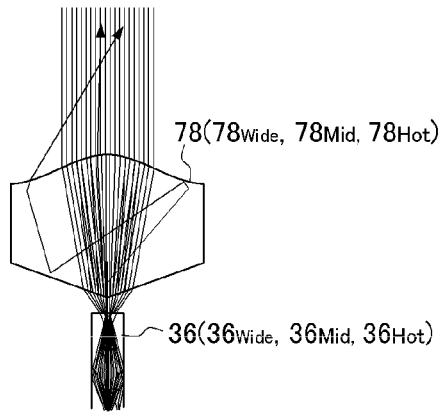
FIG. 34B is a schematic diagram illustrating the state in which, when parallel light rays to the optical axis of the condenser lens 78 ($78_{Wide}$, $78_{Mid}$, and $78_{Hot}$) are incident on the first to third condenser lenses $78_{Wide}$, $78_{Mid}$, and $78_{Hot}$, the light rays are condensed and incident on the light incident surface of an optical fiber.
Figure 34C:
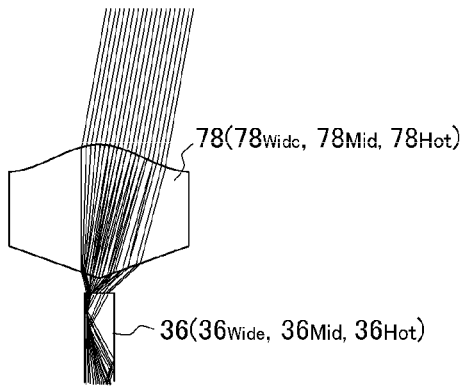
FIG. 34C is a schematic diagram illustrating the state in which, when light rays tilted by 10 degrees with respect to the optical axis are incident on the first to third condenser lenses $78_{Wide}$, $78_{Mid}$, and $78_{Hot}$, the light rays are condensed and incident on the light incident surface of the optical fiber.

FIG. 34B is a schematic diagram illustrating the state in which, when parallel light rays to the optical axis of the first to third condenser lenses $78_{Wide}$, $78_{Mid}$, and $78_{Hot}$ are incident on the first to third condenser lenses $78_{Wide}$, $78_{Mid}$, and $78_{Hot}$, the light rays are condensed and incident on the light incident surface of an optical fiber. FIG. 34C is a schematic diagram illustrating the state in which, when light rays tilted by 10 degrees with respect to the optical axis are incident on the first to third condenser lenses $78_{Wide}$, $78_{Mid}$, and $78_{Hot}$, the light rays are condensed and incident on the light incident surface of the optical fiber.

Note that each of the optical fibers $36_{Wide}$, $36_{Mid}$, and $36_{Hot}$ in FIGS. 34A to 34C have a diameter of 1 mm and Na>0.82.

As described above, according to the present exemplary embodiment, the vehicle lighting fixture can be configured to form predetermined light distribution patterns (for example, a high-beam (driving) light distribution pattern $P_{Hi}$ or a low-beam (passing) light distribution pattern $P_{Lo}$) formed by superimposing a plurality of partial light distribution patterns $P_{Hi\_Wide}$, $P_{Hi\_Mid}$, and $P_{Hi\_Hot}$ (or partial light distribution patterns $P_{Lo\_Wide}$, $P_{Lo\_Mid}$, and $P_{Lo\_Hot}$), and in particular, can change a light intensity of at least one partial light distribution pattern (for example, hot-zone partial light distribution pattern $P_{Hi\_Hot}$) out of the plurality of partial light distribution patterns. As a result, the high-beam light distribution pattern $P_{Hi}$ (or the low-beam light distribution pattern $P_{Lo}$) can be made appropriate for the conditions surrounding the vehicle body, or the running conditions.

This can be achieved by the light intensity changing unit 40 (see FIG. 32) configured to change a light intensity of at least one partial light distribution pattern (for example, hot-zone partial light distribution patterns $P_{Hi\_Hot}$) out of the partial light distribution patterns $P_{Hi\_Wide}$, $P_{Hi\_Mid}$, and $P_{Hi\_Hot}$ (or partial light distribution patterns $P_{Lo\_Wide}$, $P_{Lo\_Mid}$, and $P_{Lo\_Hot}$).

Specifically, this can be achieved by switching over the diffractive optical element to be disposed in the optical path of laser light from each of the laser light source $74_{LL1}$, $74_{LL2}$, and $74_{LL3}$ for each laser light source so that an output of laser light exiting through the output end face of at least one optical fiber (for example, the hot-zone optical fibers $36_{Hot}$) out of the optical fibers $36_{Wide}$, $36_{Mid}$, and $36_{Hot}$ increases, whereby the laser light with the relatively increased output can form a particular partial light distribution pattern (for example, hot-zone partial light distribution pattern $P_{Hi\_Hot}$).

Furthermore, with the above-described vehicle lighting fixture 100, without changing the outputs of laser light from the respective laser light sources $74_{LL1}$, $74_{LL2}$, and $74_{LL3}$ (semiconductor lasers $LD_{LL1}$, $LD_{LL2}$, and $LD_{LL3}$), i.e., with the outputs of laser light from the respective laser light sources $74_{LL1}$, $74_{LL2}$, and $74_{LL3}$ (semiconductor lasers $LD_{LL1}$, $LD_{LL2}$, and $LD_{LL3}$) being maintained, at least one partial light distribution pattern (for example, hot-zone partial light distribution pattern $P_{Hi\_Hot}$) can be changed.

This is because the diffractive optical element to be disposed in the optical path of laser light of each of the laser light sources $74_{LL1}$, $74_{LL2}$, and $74_{LL3}$ is switched over to another for each laser light source, thereby changing the light intensity of the particular partial light distribution pattern (for example, hot-zone partial light distribution pattern $P_{Hi\_Hot}$).

Furthermore, the above-described vehicle lighting fixture 100 can be configured to manually or automatically form the high-beam light distribution pattern $P_{Hi}$ (or a low-beam light distribution pattern $P_{Lo}$) that can be made appropriate for the conditions surrounding the vehicle body, or the running conditions.

A description will now be given of a modified example of the vehicle lighting fixture 100 according to the presently disclosed subject matter as a vehicle lighting fixture 100A.

Figure 35:
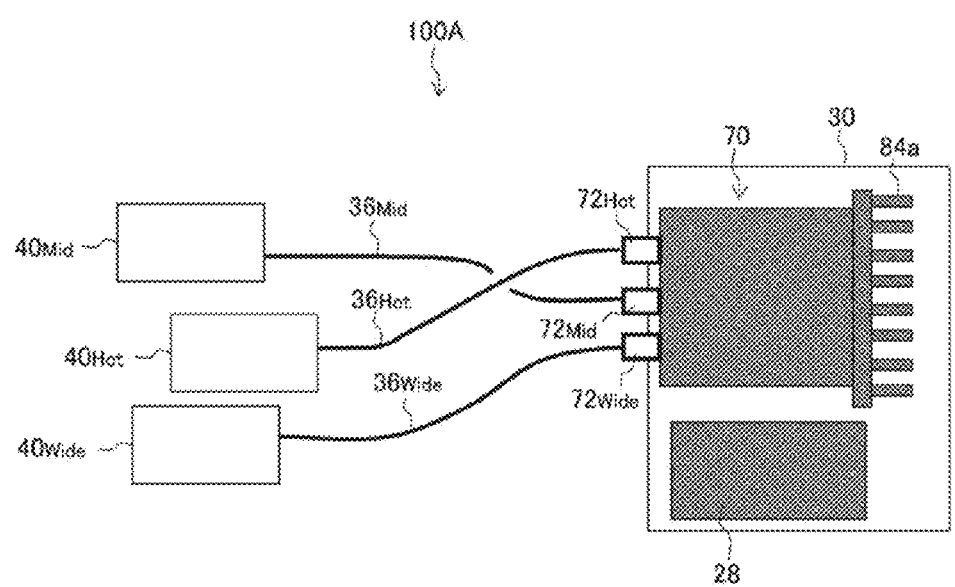
FIG. 35 is a schematic diagram illustrating the configuration of a vehicle lighting fixture 100A as a modified example.

FIG. 35 is a schematic diagram illustrating the configuration of the vehicle lighting fixture 100A as a modified example.

The vehicle lighting fixture 100A of this modified example can be configured in the same manner as in the vehicle lighting fixture 100, except that the lighting unit 40 constituting the vehicle lighting fixture 100 of the above-described exemplary embodiment is replaced by lighting units $40_{Wide}$, $40_{Mid}$, and $40_{Hot}$.

Examples of the lighting units $40_{Wide}$, $40_{Mid}$, and $40_{Hot}$ in this modified example may include a projector-type lighting unit, a reflector-type lighting unit, a direct projection-type lighting unit, and other types of lighting units.

The output ends of the respective optical fibers $36_{Wide}$, $36_{Mid}$, and $36_{Hot}$ can be attached to the lighting units $40_{Wide}$, $40_{Mid}$, and $40_{Hot}$, respectively.

In this configuration, the wide-zone lighting unit $40_{Wide}$ can form the wide-zone partial light distribution pattern $P_{Hi\_Wide}$ as illustrated in FIG. 3A using laser light rays propagating through the wide-zone optical fibers $36_{Wide}$. Specifically, the wide-zone lighting unit $40_{Wide}$ can include a phosphor configured to be excited by the laser light rays propagating through the wide-zone optical fibers $36_{Wide}$, and an optical system (lens and/or reflecting mirror) configured to project light from the phosphor forward to form the wide-zone partial light distribution pattern $P_{Hi\_Wide}$ as illustrated in FIG. 3A.

Similarly, the middle-zone lighting unit $40_{Mid}$ can form the middle-zone partial light distribution pattern $P_{Hi\_Wide}$ as illustrated in FIG. 3A using laser light rays propagating through the middle-zone optical fibers $36_{Mid}$. Specifically, the middle-zone lighting unit $40_{Mid}$ can include a phosphor configured to be excited by the laser light rays propagating through the middle-zone optical fibers $36_{Mid}$, and an optical system (lens and/or reflecting mirror) configured to project light from the phosphor forward to form the middle-zone partial light distribution pattern $P_{Hi\_Mid}$ as illustrated in FIG. 3A.

Similarly, the hot-zone lighting unit $40_{Hot}$ can form the hot-zone partial light distribution pattern $P_{Hi\_Hot}$ as illustrated in FIG. 3A using laser light rays propagating through the hot-zone optical fibers $36_{Hot}$. Specifically, the hot-zone lighting unit $40_{Hot}$ can include a phosphor configured to be excited by the laser light rays propagating through the hot-zone optical fibers $36_{Hot}$, and an optical system (lens and/or reflecting mirror) configured to project light from the phosphor forward to form the hot-zone partial light distribution pattern $P_{Hi\_Hot}$ as illustrated in FIG. 3A.

Also this modified example can execute the same processes as illustrated in FIG. 32 to exert the same advantageous effects as those exerted by the above-described exemplary embodiment.

The respective numerical values used in the above-described exemplary embodiments and the modified example are illustrative and explanatory, and can appropriately take other numerical values so long as the above-described exemplary embodiments and the modified example can be configured as described in the claims.

Further, it will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. A vehicle lighting fixture configured to form a predetermined light distribution pattern by superimposing N partial light distribution patterns wherein N is a natural number of 2 or more, the vehicle lighting fixture comprising:
   N optical fibers provided corresponding to the respective N partial light distribution patterns;
   N laser light sources provided corresponding to the respective N optical fibers;
   N sets of at least one diffractive optical element provided corresponding to the respective N laser light sources;
   N actuators provided corresponding to the respective N laser light sources and each configured to dispose any one diffractive optical element of a corresponding one set of the N sets of the at least one diffractive optical element corresponding to one of the N laser light sources in an optical path of laser light from a corresponding one of the N laser light sources; and
   a lighting unit configured to form the predetermined light distribution pattern with the laser light propagating through the N optical fibers, wherein
   when each diffractive optical element of any one set of the N sets of at least one diffractive optical element is disposed in the optical path of laser light from the corresponding one of the N laser light sources, the one of the plurality of diffractive optical elements is configured to deflect the laser light from the corresponding one of the N laser light sources toward respective incident end faces of the N optical fibers at respective disperse ratios by diffracting the laser light from the corresponding one of the N laser light sources, and
   each of the N actuators is configured to switch over each diffractive optical element of a corresponding one set of the N sets of the at least one diffractive optical element to be disposed in the optical path of laser light of the corresponding one of the N laser light sources for each laser light source so that an output of laser light exiting through an output end face of each optical fiber out of the N optical fibers becomes a predetermined output ratio, to thereby change the light intensity of at least one partial light distribution pattern out of the N partial light distribution patterns.

2. The vehicle lighting fixture according to claim 1, wherein the vehicle lighting fixture is configured to form a plurality of predestined light distribution patterns and comprises a sensor installed in a vehicle body, and
   when one light distribution pattern among the plurality of predetermined light distribution patterns is selected on the basis of a manual operation or an automatic operation based on information from the sensor installed in the vehicle body, the actuator switches over the diffractive optical element to be disposed in the optical path of the laser light of the laser light source for each laser light source so as to form the one light distribution pattern selected manually or automatically.

3. The vehicle lighting fixture according to claim 2, wherein the diffractive optical elements are each any one of a holographic optical element and a blazed diffractive optical element.

4. The vehicle lighting fixture according to claim 1, wherein the diffractive optical elements are each any one of a holographic optical element and a blazed diffractive optical element.

5. The vehicle lighting fixture according to claim 1, wherein
   the vehicle lighting fixture has an optical axis extending in a front-to-rear direction of a vehicle to which the vehicle lighting fixture is to be mounted, and
   the lighting unit includes a projection lens, a member of which an image is to be projected, and an optical deflector that are disposed in the optical axis in this order.

6. The vehicle lighting fixture according to claim 5, wherein
   the optical deflector is provided to each of the N optical fibers at the output end face thereof, and
   the member of which an image is to be projected is a wavelength conversion member including a scanning region by the optical deflector.

7. The vehicle lighting fixture according to claim 6, wherein the projection lens is a projection lens assembly composed of a plurality of lenses.

8. The vehicle lighting fixture according to claim 6, wherein the optical deflector is operated by at least one of a piezoelectric system, an electrostatic system, and an electromagnetic system.

9. The vehicle lighting fixture according to claim 6, wherein
   the number of the N optical fibers is three,
   the optical deflector includes three optical deflectors, and
   the member of which an image is to be projected has a surface facing to the projection lens, the surface including a scanning region by the three optical deflectors.

10. The vehicle lighting fixture according to claim 5, wherein the projection lens is a projection lens assembly composed of a plurality of lenses.

11. The vehicle lighting fixture according to claim 5, wherein
    the number of the N optical fibers is three,
    the optical deflector includes three optical deflectors, and
    the member of which an image is to be projected has a surface facing to the projection lens, the surface including a scanning region by the three optical deflectors.

12. A vehicle lighting fixture configured to form a predetermined light distribution pattern by superimposing N partial light distribution patterns wherein N is a natural number of 2 or more, the vehicle lighting fixture having an optical axis extending in a front-to-rear direction of a vehicle to which the vehicle lighting fixture is to be mounted, the vehicle lighting fixture comprising:
    a light intensity changing unit configured to change a light intensity of at least one partial light distribution pattern out of the N partial light distribution patterns,
    a lighting unit including a projection lens, a member of which an image is to be projected, and an optical deflector that are disposed in the optical axis in this order, the optical deflector is provided corresponding to the light intensity changing unit, the member of which an image is to be projected is a wavelength conversion member including a scanning region by the optical deflector with the light from the light intensity changing unit, and the projection lens is a projection lens assembly composed of a plurality of lenses.

13. The vehicle lighting fixture according to claim 12, further comprising three optical fibers each having an output end face, the optical fiber receiving the light from the light intensity changing unit, the optical deflector includes three optical deflectors corresponding to the three output end faces of the optical fibers, and the wavelength conversion member has a surface facing to the projection lens, the surface including a scanning region by the three optical deflectors.

14. The vehicle lighting fixture according to claim 13, wherein the optical deflector is operated by at least one of a piezoelectric system, an electrostatic system, and an electromagnetic system.

\* \* \* \* \*